US009419241B2

(12) United States Patent
Furukawa et al.

(10) Patent No.: US 9,419,241 B2
(45) Date of Patent: Aug. 16, 2016

(54) ORGANIC ELECTROLUMINESCENT ELEMENT

(71) Applicant: Konica Minolta, Inc., Chiyoda-ku, Tokyo (JP)

(72) Inventors: Shun Furukawa, Machida (JP); Tomoyuki Nakayama, Hino (JP); Takeshi Ono, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/439,880

(22) PCT Filed: Oct. 18, 2013

(86) PCT No.: PCT/JP2013/078322
§ 371 (c)(1),
(2) Date: Apr. 30, 2015

(87) PCT Pub. No.: WO2014/069256
PCT Pub. Date: May 8, 2014

(65) Prior Publication Data
US 2015/0295200 A1    Oct. 15, 2015

(30) Foreign Application Priority Data

Oct. 31, 2012    (JP) .................................. 2012-239790

(51) Int. Cl.
*H01L 51/52*    (2006.01)
*H05B 33/26*    (2006.01)
(Continued)

(52) U.S. Cl.
CPC .......... *H01L 51/524* (2013.01); *H01L 27/3209* (2013.01); *H01L 51/504* (2013.01);
(Continued)

(58) Field of Classification Search
CPC ...................................................... H01L 51/524
See application file for complete search history.

(56) References Cited

U.S. PATENT DOCUMENTS 5,530,581 A *  6/1996  Cogan ................... G02F 1/1533
                                                       359/245
5,559,400 A *  9/1996  Nakayama .......... H01L 51/5265
                                                       313/506

(Continued)

FOREIGN PATENT DOCUMENTS

JP      H10503878 A     4/1998
JP      P3496681 A     11/2003

(Continued)

OTHER PUBLICATIONS

Machine Translation (Part 1) of JP 2012084308 A (Apr. 2012).*
(Continued)

*Primary Examiner* — Lex Malsawma
(74) *Attorney, Agent, or Firm* — Cantor Colburn LLP

(57) ABSTRACT

An organic electroluminescent element includes: first and second electrodes; and luminous units between the electrodes on a substrate, adjacent luminous units each being separated by an intermediate electrode layer, wherein at least one of the electrodes is a transparent electrode; the luminous units are each an organic functional layer including an organic luminous layer; the intermediate electrode layer includes an independent connecting terminal for electrical connection; a thin-film layer is disposed on a surface of the transparent electrode being at least one of the electrodes; and the thin-film layer has a variable refractive index across a thickness of the thin-film layer, the variable refractive index having an extreme value at which the refractive index changes from an increase to a decrease or an extreme value at which the refractive index changes from a decrease to an increase.

12 Claims, 8 Drawing Sheets

(51) Int. Cl.
  *H01L 51/50* (2006.01)
  *H05B 33/10* (2006.01)
  *H05B 33/22* (2006.01)
  *H01L 27/32* (2006.01)

(52) U.S. Cl.
  CPC ........ *H01L51/5044* (2013.01); *H01L 51/5206* (2013.01); *H01L 51/5234* (2013.01); *H01L 51/5275* (2013.01); *H05B 33/10* (2013.01); *H05B 33/22* (2013.01); *H05B 33/26* (2013.01); *H01L 2251/5323* (2013.01)

(56) References Cited

U.S. PATENT DOCUMENTS

| | | | | |
|---|---|---|---|---|
| 5,932,895 | A | * | 8/1999 | Shen .................. H01L 27/3209 257/103 |
| 6,337,492 | B1 | | 1/2002 | Jones et al. |
| 8,324,803 | B2 | * | 12/2012 | Forrest .................. C09K 11/06 313/504 |
| 2014/0167019 | A1 | * | 6/2014 | Heuser ................ H01L 51/5268 257/40 |

FOREIGN PATENT DOCUMENTS

| | | | |
|---|---|---|---|
| JP | 2005340187 | A | 12/2005 |
| JP | 2009016184 | A | 1/2009 |
| JP | 2009146860 | A | 7/2009 |
| JP | 2010015786 | A | 1/2010 |
| JP | 2011028878 | A | 2/2011 |
| JP | 2011077028 | A | 4/2011 |
| JP | 2012079515 | A | 4/2012 |
| JP | 2012084308 | A * | 4/2012 |
| JP | 2013229218 | A | 11/2013 |
| WO | 9619792 | A | 6/1996 |
| WO | 2007083918 | A1 | 7/2007 |
| WO | 2011004682 | A1 | 1/2011 |
| WO | 2012046742 | A1 | 4/2012 |

OTHER PUBLICATIONS

Machine Translation (Part 2) of JP 2012084308 A (Apr. 2012).*
International Search Report corresponding to Application No. PCT/JP2013/078322; Date of Mailing: Jan. 21, 2014, with English translation.
Yuki EL Kento-Kai (Organic EL Symposium) (2012), The 14th Meeting Proceedings, pp. 11-12.

* cited by examiner

ORGANIC ELECTROLUMINESCENT ELEMENT

CROSS REFERENCE TO RELATED APPLICATIONS

This is the U.S. national stage of application No. PCT/JP2013/078322, filed on Oct. 18, 2013. Priority under 35 U.S.C. §119(a) and 35 U.S.C. §365(b) is claimed from Japanese Application No. 2012-239790 filed on Oct. 31, 2012, the disclosure of which is also incorporated herein by reference.

TECHNICAL FIELD

The present invention relates to an organic electroluminescent element including layered luminous units each including an organic functional layer.

BACKGROUND ART

Electroluminescent displays (hereinafter, abbreviated as "ELDs") are light-emitting electronic display devices, which include inorganic electroluminescent elements or organic electroluminescent elements (hereinafter, also referred to as "organic EL elements"). Although the inorganic electroluminescent elements have been used as flat light sources, alternating high voltages are necessary for driving the light-emitting elements.

The organic electroluminescent elements each include a cathode, an anode, and a luminous layer containing a luminous compound disposed between the cathode and the anode. The organic electroluminescent element generates excitons by recombination of electrons and holes injected into the luminous layer and emits light (e.g., fluorescent or phosphorescent light) through deactivation of the excitons. Since the organic electroluminescent element can emit light at a voltage of approximately several to several tens of volts, is of a self-luminescent type to provide a large viewing angle and high visibility, and is a thin-film completely solid element, it has attracted attention from the viewpoint of space saving and portability for example. In order to sufficiently utilize the characteristics of the completely solid element, it has been investigated to produce flexible elements with a flexible plastic sheet or metal foil instead of rigid substrates.

The organic electroluminescent elements are surface light sources, which is also a remarkable characteristic of the organic electroluminescent elements, unlike the major traditional light sources that have been practically used, such as light-emitting diodes and cold-cathode tubes. This characteristic can be effectively used in lighting sources and back lights of a variety of displays. In particular, it can be suitably used in backlights of full-color liquid crystal displays, which have been significantly demanded recently.

In contrast to traditional organic EL elements used in lighting merely emitting light of a single color, organic EL elements that can control color tones and color temperatures of white light can create additional values, and investigation has been being continued (see, for example, PTLs 1 and 2). Unfortunately, the control of color tones by these disclosed methods causes a problem in viewing angle dependence because of an increase in the thickness of the organic layer and the presence of an intermediate electrode having a refractive index different from those of layers on both sides of the electrode. As a technology for dealing with this problem in viewing angle dependence, disclosed is a method for effectively extracting light, emerging from an organic EL element with a smooth particle layer disposed between the substrate and the electrode (e.g., see PTL 3). A method for reducing the viewing angle dependence by adjusting the thickness of each sublayer of a barrier layer composed of $SiO_2/SiN_x/SiO_2$ on a plastic substrate is disclosed (see, for example, NPL 1). Unfortunately, even these methods cannot provide a sufficiently uniform light distribution, and the problem of viewing angle dependence still remains.

There is a tradeoff between the emission efficiency and the drive life. A proposed countermeasure to solve such a relation is a toning-type organic electroluminescent element including a laminate of a plurality of luminous units separated by intermediate layers, each unit being a light emission functional layer including a luminous layer made of an organic material. This element has a long lifetime while securing an emission efficiency. For example, PTL 4 discloses a structure including an electrically conductive layer, in a floating state, mainly composed of magnesium (Mg) and containing silver (Ag). PTL 5 discloses a structure including a laminate intermediate electrode composed of a metal layer having a low work function, such as Mg, Mg/Ag, or arsenic (As), and an indium tin oxide ($SnO_2$—$In_2O_3$, hereinafter abbreviated as "ITO") layer. PTL 6 discloses a structure including a transparent conductive layer of, for example, ITO as an intermediate electrode and an electroluminescent layer including a sublayer made of a material resistive to etching, such as a benzoxazole derivative or a pyridine derivative, where the sublayer is closest to the intermediate electrode.

These methods, however, cannot provide an emission efficiency and a service life that are sufficient for practical use.

CITATION LIST

Patent Literature

PTL 1: Japanese Patent Laid-Open Publication No. 2009-146860
PTL 2: International Publication No. WO2007/083918
PTL 3: Japanese Patent Laid-Open Publication No. 2012-079515
PTL 4: U.S. Pat. No. 6,337,492
PTL 5: Japanese Patent No. 3496681
PTL 6: Japanese Patent Laid-Open Publication No. 2005-340187

Non-Patent Literature

NPL 1: Yuki EL Kento-kai (Organic EL Symposium) (2012), The 14th Meeting Proceedings, pp. 11-12

SUMMARY OF INVENTION

An object of the present invention, which has been made in view of the above circumstances, is to provide an organic electroluminescent element having a high power efficiency, a long emission lifetime, toning aptitude, an improved light distribution (reduced viewing angle dependence), and improved durability (high temperature and high humidity resistance).

Means for Solving Problems

The present inventors have found, in the process of investigating the causes of the above-mentioned problems for achieving the above-mentioned object, that an organic electroluminescent element having a high power efficiency, a long emission lifetime, toning aptitude, an improved light distribution (reduced viewing angle dependence), and improved durability (high temperature and high humidity resistance) can be obtained when the organic electroluminescent element has a first electrode and a second electrode on a substrate, at least one of the first electrode and the second electrode being a transparent electrode; a structure including two or more luminous units layered between the first electrode and the second electrode, the luminous units each being an organic functional layer including an organic luminous layer, adjacent luminous units each being separated by an intermediate electrode layer, the intermediate electrode layer including an independent connecting terminal for electrical connection; and a thin-film layer disposed on the outer side of the transparent electrode being at least one of the first electrode and the second electrode, and having at least one extreme value in the refractive index distribution across the thickness.

That is, the object of the present invention can be achieved by the following aspects:

1. An organic electroluminescent element including:
   a pair of a first electrode and a second electrode; and
   two or more luminous units disposed between the first electrode and second electrode on a substrate, adjacent luminous units each being separated by an intermediate electrode layer, wherein
   (1) at least one of the first electrode and the second electrode is a transparent electrode;
   (2) the luminous units are each an organic functional layer including an organic luminous layer;
   (3) the intermediate electrode layer includes an independent connecting terminal for electrical connection;
   (4) a thin-film layer is disposed on a surface of the transparent electrode being at least one of the first electrode and the second electrode; and
   (5) the thin-film layer has a variable refractive index across a thickness of the thin-film layer, the variable refractive index having an extreme value (maximum value) at which the refractive index changes from an increase to a decrease or an extreme value (minimum value) at which the refractive index changes from a decrease to an increase.

2. The organic electroluminescent element according to item 1., wherein the variable refractive index of the thin-film layer has extreme values being a maximum value and a minimum value.

3. The organic electroluminescent element according to item 1. or 2., wherein the thin-film layer comprises a material containing at least silicon, oxygen, and carbon.

4. The organic electroluminescent element according to item 3., wherein the thin-film layer has a distribution curve of a constituent element based on element distribution measurement in a depth direction of the thin-film layer by X-ray photoelectron spectroscopy such that a difference between a largest maximum value and a smallest maximum value of a carbon atomic percent (at %) is 5 at % or more in a carbon distribution curve showing a relationship between a distance from a surface of the thin-film layer across the thickness and an atomic percent of the number of carbon atoms (carbon atomic percent (at %)) to a total number (100 at %) of silicon atoms, oxygen atoms, and carbon atoms.

5. The organic electroluminescent element according to item 3. or 4., wherein the thin-film layer has an average atomic percent of silicon, an average atomic percent of oxygen, and an average atomic percent of carbon to a total number (100 at %) of silicon, oxygen and carbon atoms at a 90% to 95% depth from a surface of the thin-film layer across the thickness satisfying a magnitude relation represented by Expression (1) or (2):

(average atomic percent of carbon)<(average atomic percent of silicon)<(average atomic percent of oxygen),  Expression (1)

(average atomic percent of oxygen)<(average atomic percent of silicon)<(average atomic percent of carbon).  Expression (2)

6. The organic electroluminescent element according to item 5., wherein the thin-film layer has the average atomic percent of silicon within a range of 25 to 45 at % to the total number of silicon, oxygen, and carbon atoms at a 90% to 95% depth from the surface of the thin-film layer across the thickness.

7. The organic electroluminescent element according to any one of items 3 to 6, wherein the thin-film layer further contains a nitrogen atom.

8. The organic electroluminescent element according to any one of items 1. to 7., wherein the intermediate electrode layer is a metal thin film.

9. The organic electroluminescent element according to item 8, wherein the metal thin film is mainly composed of silver.

10. The organic electroluminescent element according to any one of items 1. to 9., wherein the substrate is a resin film.

11. The organic electroluminescent element according to any one of items 1. to 10., further comprising a nitrogen-containing layer on at least one surface of the intermediate electrode layer.

12. The organic electroluminescent element according to any one of items 1. to 11., further comprising a gas barrier layer on the thin-film layer.

Effects of Invention

These aspects of the present invention can provide an organic electroluminescent element having a high power efficiency, a long emission lifetime, toning aptitude, an improved light distribution (reduced viewing angle dependence), and improved durability (high temperature and high humidity resistance).

Although the technical details on the mechanism to achieve the intended advantageous effect in the above-described configuration of the present invention have not completely been revealed, the inventors infer the reasons as follows.

Metal oxides, such as ITO, are used as materials for intermediate electrodes. Sputtering is essential for formation of a film from ITO having excellent conductivity and high optical transparency. Sputtering has a risk of damaging the organic layer if an underlying layer, such as a sputter buffer layer, is not provided. The formation of the sputter buffer layer inevitably increases the total thickness of the luminous unit and thus increases the viewing angle dependence. In addition, an increase in the layers due to addition of the underlying layer would lead to unsatisfactory electrical characteristics. In the transparent electrode of the present invention, however, a conductive layer mainly composed of silver is disposed on an underlying layer, and the underlying layer contains a compound including atoms having affinity to silver atoms (hereinafter, also refers to as "silver affinity compound"). The silver affinity compounds are primarily composed of nitrogen-containing aromatic compounds which have high electron transporting ability and can therefore be suitable for electron-transporting materials. Accordingly, production of an intermediate electrode does not require an increase in the number of layers due to formation of an additional layer, such as the sputter buffer layer.

As a result, during formation of a conductive layer on the underlying layer, the silver atoms in the conductive layer interact with the silver affinity compound contained in the underlying layer to reduce the diffusion distance of the silver atoms on the surface of the underlying layer and to prevent precipitation of silver at a certain position.

That is, silver atoms form a two-dimensional nucleus on the surface of the underlying layer containing a compound including atoms having affinity to silver atoms and then form a two-dimensional single-crystal layer around the nucleus. Thus, a conductive layer is formed by film growth of a layering growth mode (Frank-van der Merwe: FM mode).

In general, silver atoms adhering to the surface of an underlying layer diffuse and bind to form a three-dimensional nucleus on the surface and grow into a three-dimensional island. Thus, an island-like film seems to be readily formed by film growth of an island growth mode (Volumer-Weber: VW mode). In the present invention, however, the silver affinity compound contained in the underlying layer seems to prevent such island growth and accelerate the layering growth.

As a result, a conductive layer having a small and uniform thickness can be prepared, leading to achievement of a transparent electrode having a smaller thickness while maintaining proper optical transparency and conductivity. In addition, the diffusion of silver occurs on the surface of the underlying layer as described above; hence, a thick layer is not necessary, and the influence on the viewing angle dependence can be minimized.

A conductive layer having a surface specific resistance adjusted to a certain level is formed on a resin substrate from a metal oxide and the resin, and a gas barrier layer is then formed on the other surface of the resin substrate by plasma discharge chemical vapor deposition through electric discharge between rollers to which a magnetic field is applied. As a result, a large number of carbon atom components are probably oriented near the resin substrate. Such orientation improves the adhesion between the resin substrate and the gas barrier layer, and thus, achieves very high gas barrier and flexibility required for electronic devices even in the use under more strict conditions, high temperature and high humidity.

Although the mechanism of improving the adhesion, flexibility, and gas barrier by the configuration defined by the present invention is unclear, the adhesion is probably improved as follows: The resin substrate has a conductivity in a specific range and affects the magnetic field of the plasma discharge occurring between rollers to cause the arrangement of a large number of the carbon atom components having a polarity relatively similar to that of the resin substrate. The flexibility and the gas barrier seem to be achieved by a continuous change, i.e., gradient in concentration of the carbon atom component in the gas barrier layer to be formed by the plasma discharge occurring between rollers, even under strict conditions due to the combined effect of the arrangement of the carbon atom component near the resin substrate.

Incidentally, continuous change, i.e., gradient in concentration of the carbon atom component near the resin substrate does not occur in plasma discharge CVD using a flat electrode (horizontal transport), and the adhesion, the flexibility, and the gas barrier are incompatible. Thus, this technique is not in the options. The present invention is characterized by compatibility among adhesion, flexibility, and gas barrier which can be achieved if the concentration gradient of a carbon atom component continuously changes in a gas barrier layer produced by plasma discharge chemical vapor deposition in a magnetic field applied between rollers.

A polysilazane-containing solution is applied onto the gas barrier layer to form a coating film and then modifying the coating film by irradiation with vacuum ultraviolet light (VUV) having a wavelength of 200 nm or less to form a second gas barrier layer on the gas barrier layer. In this process, fine defects remaining in the gas barrier layer formed during the CVD process are probably filled with the polysilazane gas barrier component, and very high gas barrier and flexibility required in electronic devices are achieved even in high temperature and high humidity.

As presumed above, since a configuration satisfying electrical characteristics can be achieved while minimizing the influence on viewing angle dependence, a device showing both a high power efficiency and a long emission lifetime can be produced.

MODES FOR CARRYING OUT THE INVENTION

Figure 1:
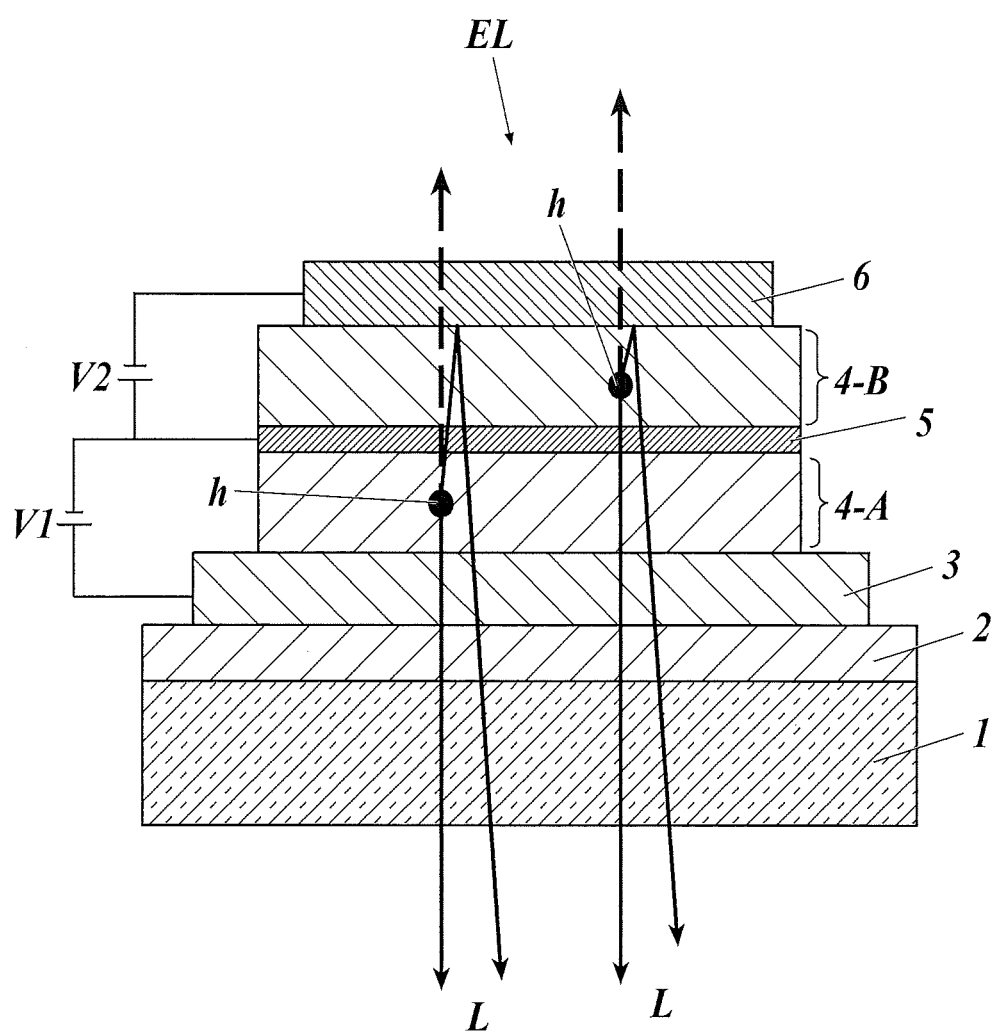
FIG. 1 is a schematic cross-sectional view illustrating an example configuration of an organic electroluminescent element including two luminous units.

The organic electroluminescent element of the present invention includes a first electrode and a second electrode on a substrate, at least one of the first electrode and the second electrode being a transparent electrode; a structure including two or more luminous units layered between the first electrode and the second electrode, the luminous units each being an organic functional layer including an organic luminous layer, adjacent luminous units each being separated by an intermediate electrode layer, the intermediate electrode layer including an independent connecting terminal for electrical connection; and a thin-film layer disposed on the outer side of the transparent electrode being at least one of the first electrode and the second electrode, the thin-film layer having at least one extreme value in the refractive index distribution across the thickness. Such an organic electroluminescent element can have a high power efficiency, a long emission lifetime, toning aptitude, an improved light distribution (reduced viewing angle dependence), and improved durability (high temperature and high humidity resistance). These are technical features common to the inventions according to claims 1 to 12.

In order to enhance the advantageous effects of the present invention, an embodiment of the present invention is characterized in that the thin-film layer of the organic electroluminescent element has a refractive index profile having at least one maximum value and at least one minimum value across the thickness; the thin-film layer includes a material containing silicon, oxygen, and carbon; the thin-film layer has a difference of 5 at % or more between the largest carbon atomic percent and the smallest carbon atomic percent in the distribution curves of constituent elements where the horizontal axis represents the distance from the surface across the thickness, and the vertical axis represents the atomic percent (at %) of carbon to the total number of silicon, oxygen, and carbon atoms; the average atomic percent of each atom to the total number of silicon, oxygen, and carbon atoms has a specific relationship at a 90% to 95% depth from the surface of the thin-film layer across the thickness; the average atomic percent of silicon is within a range of 25 to 45 at % to the total number of silicon, oxygen, and carbon atoms at a 90% to 95% depth from the surface of the thin-film layer across the thickness; and the thin-film layer contains nitrogen, in addition to silicon, oxygen, and carbon atoms. These features are preferred from the viewpoint of more effectively expressing excellent toning aptitude, an improved light distribution (reduced viewing angle dependence), and improved durability (high temperature and high humidity resistance).

From the viewpoint of achieving a higher power efficiency and a longer emission lifetime, the intermediate electrode layer preferably includes a thin film metal, more preferably silver, and a nitrogen-containing layer is preferably disposed on at least one surface of the intermediate electrode layer.

From the viewpoint of producing an organic electroluminescent element having excellent flexibility, the substrate is preferably a resin film.

From the viewpoint of producing an organic electroluminescent element having a higher gas barrier and excellent durability, a gas barrier layer is preferably disposed on the thin-film layer, for example, between the thin-film layer and the first electrode.

The present invention, its components, and embodiments of the present invention will now be described in detail. It should be noted that the term "to" indicating the numerical range is meant to be inclusive of boundary values throughout the specification.

<<Organic EL Element>>

[Configuration of Organic EL Element]

The basic configuration of the organic EL element of the present invention will now be described with reference to drawings. The configuration of the organic EL element having a toning structure of the present invention should not be limited to the configurations described by the examples below. The organic EL element having a toning structure in the present invention, as shown in FIGS. 1 to 6, includes a plurality of luminous units layered across the thickness, has a structure that can independently apply a driving voltage to each of the luminous units, and can emit white light, or light of a single color, such as blue light, green light, or red light, through independent emission of light from each luminous unit.

The organic EL element of the present invention includes a first electrode and a second electrode on a substrate, at least one of the first electrode and the second electrode being a transparent electrode; a structure including two or more luminous units layered between the first electrode and the second electrode, the luminous units each being an organic functional layer including an organic luminous layer, adjacent luminous units each being separated by an intermediate electrode layer, the intermediate electrode layer including an independent connecting terminal for electrical connection; and a thin-film layer disposed on the outer side of the transparent electrode being at least one of the first electrode and the second electrode, and having at least one extreme value in the refractive index distribution across the thickness.

FIG. 1 is a schematic cross-sectional view illustrating an example of the configuration of an organic electroluminescent element having a toning structure including two luminous units of the present invention.

The organic EL element (EL) shown in FIG. 1 includes a first electrode 3 and a second electrode 6 disposed at corresponding positions above a substrate 1. In the configuration shown in FIG. 1, the first electrode 3 is a transparent anode, and the second electrode 6 is a cathode.

A thin-film layer 2 having at least one extreme value in the refractive index distribution across the thickness according to the present invention is disposed on the outer side of the first electrode 3 that is the transparent electrode, i.e., between the first electrode 3 and the substrate 1. A first luminous unit A and a second luminous unit B, each being an organic functional layer including an organic luminous layer, are disposed between the first electrode 3 (anode) and the second electrode 6 (cathode). An intermediate electrode layer 5 having an independent connecting terminal (not shown) is disposed between the luminous units.

A lead line is connected to the first electrode 3 and the intermediate electrode layer 5 to apply a driving voltage V1 of 2 to 40 V to the respective connecting terminals for light emission from the luminous unit A. Similarly, a lead line is connected to the intermediate electrode layer 5 and the second electrode 6 to apply a driving voltage V2 of 2 to 40 V to the respective connecting terminals for light emission from the luminous unit B.

Specifically, in order to drive the organic EL element EL, a driving DC voltage V1 is applied between the first electrode 3 and the intermediate electrode layer 5 while a driving DC voltage V2 is applied between the intermediate electrode layer 5 and the second electrode 6, where a voltage of 2 to 40 V is applied across the first electrode (anode) 3 with positive polarity and the second electrode (cathode) 6 with negative polarity while an intermediate voltage between those at the anode and the cathode is applied to the intermediate electrode layer 5.

The light L emitted at a light emitting point h of each luminous unit is extracted to the outside through the transparent electrode, i.e., the first electrode 3. The light emitted toward the second electrode 6 is reflected by the second electrode surface and is similarly extracted through the first electrode.

The organic EL element (EL) shown in FIG. 1 is finally sealed with a sealing material (not shown) on the second electrode 6 to prevent the organic functional layers including luminous layers from being affected by the external environment.

Figure 2:
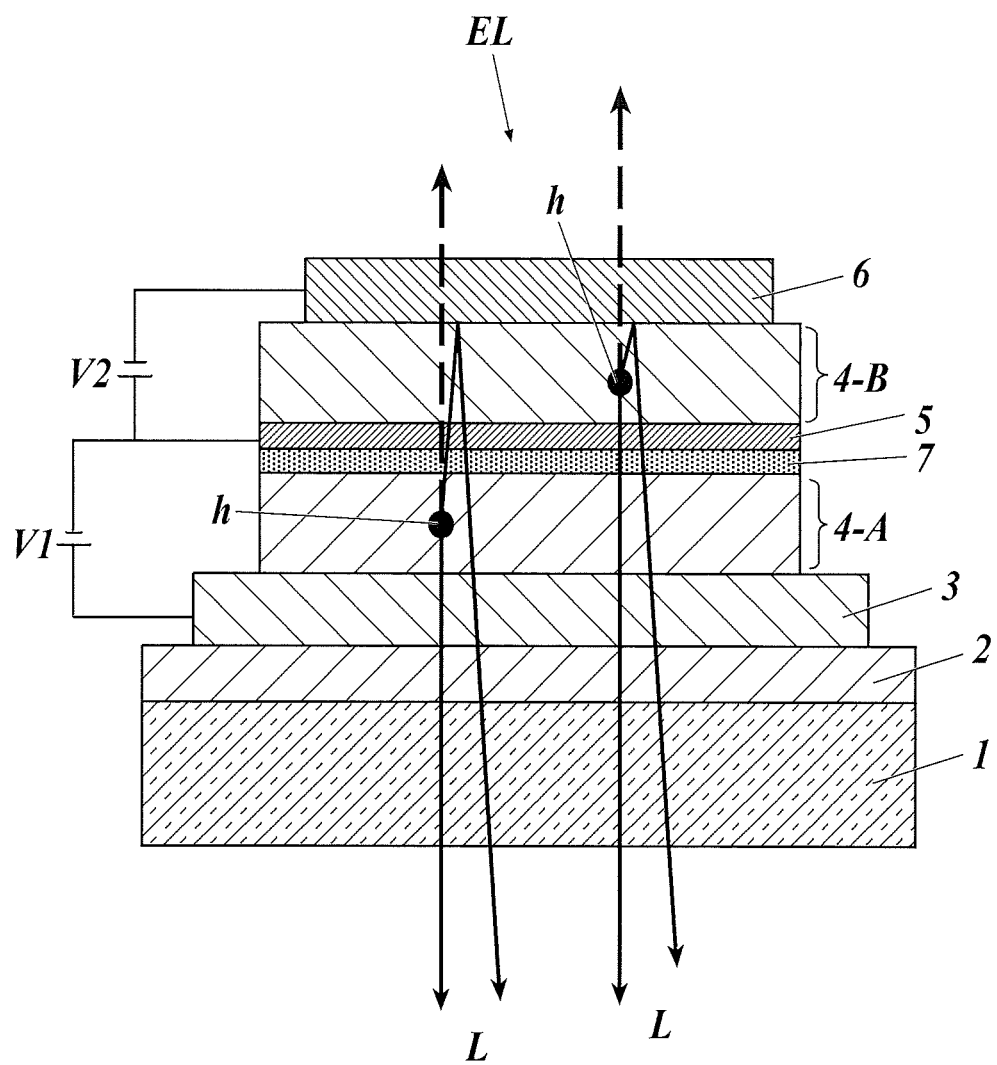
FIG. 2 is a schematic cross-sectional view illustrating another example configuration of an organic electroluminescent element including two luminous units.

FIG. 2 is a schematic cross-sectional view illustrating another example configuration of an organic electroluminescent element having a toning structure including two luminous units. FIG. 2 shows a configuration further including a nitrogen-containing layer 7 under the intermediate electrode layer 5, in addition to the components shown in FIG. 1. The configuration other than the nitrogen-containing layer 7 is the same as that shown in FIG. 1. The metal of the intermediate electrode layer 5 formed on the nitrogen-containing layer 7 interacts with the compound having affinity to metal atoms contained in the nitrogen-containing layer 7 to reduce the diffusion distance of the metal atoms on the surface of the nitrogen-containing layer and to prevent precipitation of the metal atoms at a certain position, resulting in formation of a highly uniform intermediate electrode layer.

That is, the metal atoms form a two-dimensional nucleus on the surface of the nitrogen-containing layer containing a nitrogen-containing compound having affinity to the metal atoms and then form a two-dimensional single-crystal layer around the nucleus. Thus, a highly uniform intermediate electrode layer is formed by film growth of a layering growth mode (Frank-van der Merwe: FM mode). As a result, a higher power efficiency and a longer emission lifetime can be achieved.

Figure 3:
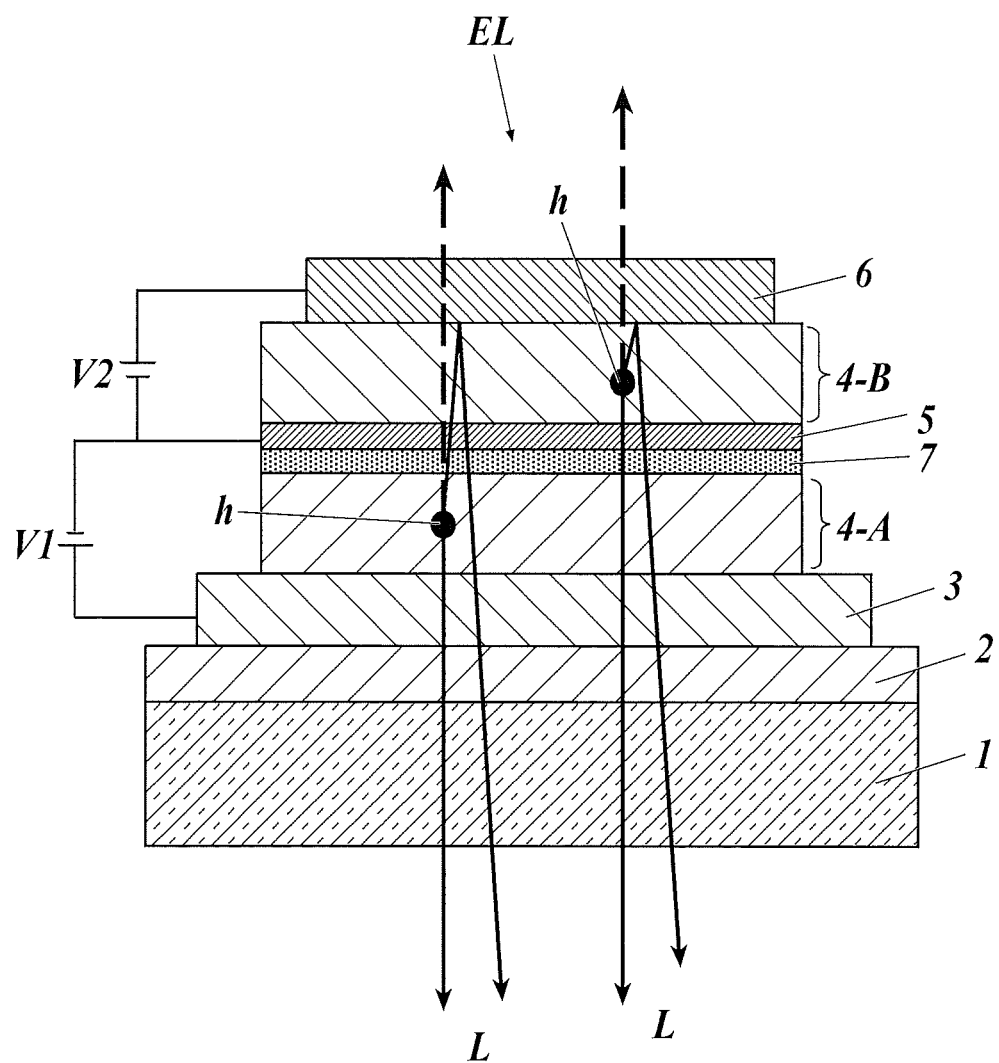
FIG. 3 is a schematic cross-sectional view illustrating another example configuration of an organic electroluminescent element including two luminous units.

FIG. 3 is a schematic cross-sectional view illustrating another example configuration of an organic electroluminescent element having a toning structure including two luminous units. FIG. 3 shows a modification example of the configuration shown in FIG. 2.

In the configuration example shown in FIG. 3, the first electrode 3 and the second electrode 6 serve as anodes, and the intermediate electrode layer 5 disposed between the two luminous units, i.e., a luminous unit A and a luminous unit B, serves as a cathode.

A driving voltage V1 of 2 to 40 V is applied across the first electrode 3 as a positive terminal and the intermediate electrode layer 5 as a negative terminal; a driving voltage V2 of 2 to 40 V is applied across the second electrode 6 as a positive terminal and the intermediate electrode layer 5 as a negative terminal. The luminous unit thereby emits light.

On this occasion, if the luminous unit A includes, for example, "a hole-injecting layer, a hole-transporting layer, a luminous layer, an electron-transporting layer, and an electron-injecting layer" in this order from the substrate 1, the luminous unit B has a reversely layered configuration including "an electron-injecting layer, an electron-transporting layer, a luminous layer, a hole-transporting layer, and a hole-injecting layer", from the substrate.

Figure 4:
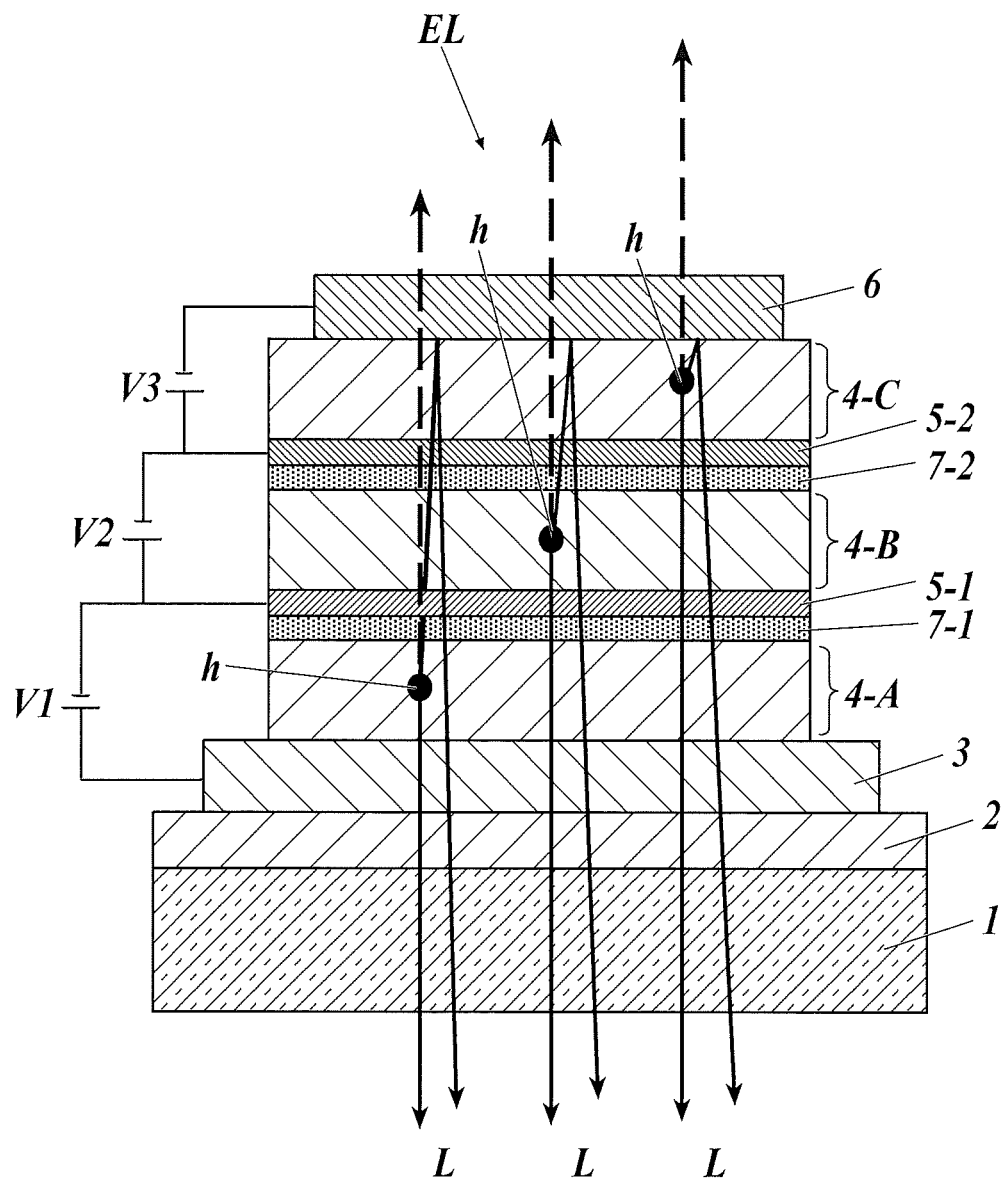
FIG. 4 is a schematic cross-sectional view illustrating an example configuration of an organic electroluminescent element including three luminous units.

FIG. 4 is a schematic cross-sectional view illustrating an example configuration of an organic electroluminescent element having a toning structure including three luminous units.

The organic EL element (EL) shown in FIG. 4 includes a first electrode 3 and a second electrode 6 disposed at corresponding positions above a substrate 1. In the configuration shown in FIG. 4, the first electrode 3 is a transparent anode, and the second electrode 6 is a cathode.

A thin-film layer 2 having at least one extreme value in the refractive index distribution across the thickness according to the present invention is disposed between the first transparent electrode 3 and the substrate 1. A first luminous unit A, a second luminous unit B, and a third luminous unit C, each being an organic functional layer including an organic luminous layer, are disposed between the first electrode 3 (anode) and the second electrode 6 (cathode). Intermediate electrode layers 5-1 and 5-2 and nitrogen-containing layers 7-1 and 7-2 are disposed between two luminous units, where each intermediate electrode layer has an independent connecting terminal (not shown).

A lead line is connected to the first electrode 3 and the intermediate electrode layer 5-1 to apply a driving voltage V1 of 2 to 40 V to the respective connecting terminals for light emission from the luminous unit A. Similarly, a lead line is connected to the intermediate electrode layer 5-1 and the intermediate electrode layer 5-2 to apply a driving voltage V2 of 2 to 40 V to the respective connecting terminals for light emission from the luminous unit B; and a lead line is connected to the intermediate electrode layer 5-2 and the second electrode 6 to apply a driving voltage V3 of 2 to 40 V to the respective connecting terminals for light emission from the luminous unit C.

If the driving voltages V1, V2, and V3 for driving the organic EL element EL are DC voltages, a voltage of 2 to 40 V is applied across the first electrode (anode) 3 with positive polarity and the second electrode (cathode) 6 with negative polarity while an intermediate voltage between those at the anode and the cathode is applied to the intermediate electrode layers 5-1 to 5-3.

The light L emitted at the light emitting point h of each luminous unit by the application of each driving voltage is extracted to the outside through the first electrode 3 as the transparent electrode. The light emitted toward the second electrode 6 is reflected by the second electrode surface and is similarly extracted through the first electrode.

As shown in FIG. 4, the organic electroluminescent element having a toning structure including three luminous units can emit white light or light having a desired color tone (color temperature), for example, by the following configuration: the luminous layer of the luminous unit A contains a blue light-emitting compound to give a luminous unit Blue; the luminous layer of the luminous unit B contains a green light-emitting compound to give a luminous unit Green; the luminous layer of the luminous unit C contains a red light-emitting compound to give a luminous unit Red; and the driving voltages V1 to V3 are appropriately controlled.

The present invention is characterized in that a thin-film layer 2 having at least one extreme value in the refractive index distribution across the thickness is disposed between the substrate 1 and the first electrode 3 and the resulting organic electroluminescent element has considerably improved light distribution (reduced viewing angle dependence) and durability (high temperature and high humidity resistance).

Figure 5:
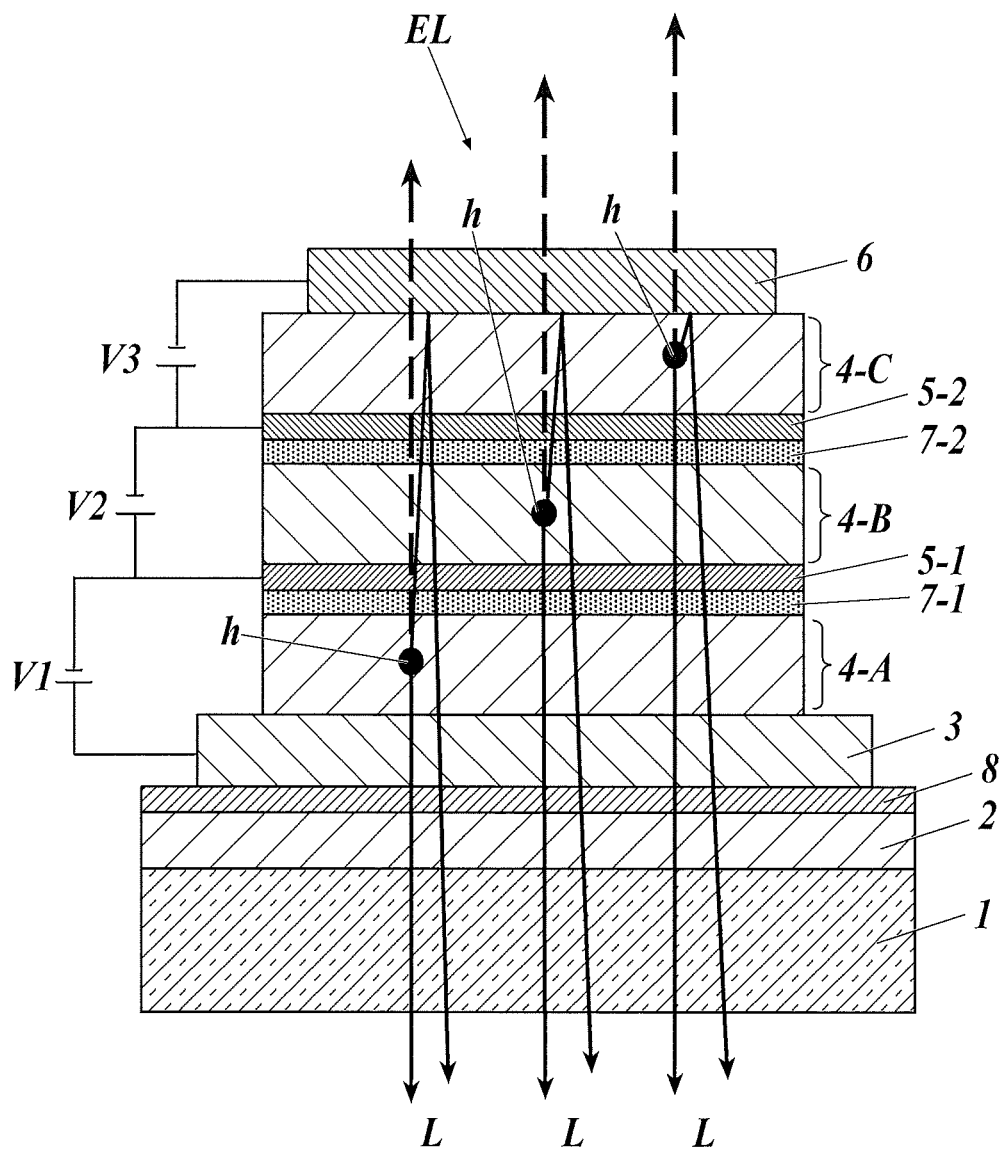
FIG. 5 is a schematic cross-sectional view illustrating another example configuration of an organic electroluminescent element including three luminous units.

FIG. 5 is a schematic cross-sectional view illustrating another example configuration of an organic electroluminescent element having a toning structure including three luminous units. FIG. 5 shows a configuration further including a gas barrier layer 8 between the thin-film layer 2 and the first electrode 3, in addition to the components shown in FIG. 4.

Such a gas barrier layer 8 showing gas barrier can block the effect of moisture and oxygen through the substrate on the organic functional layer including a luminous layer, and such a configuration is preferred from the viewpoint of improved durability.

Figure 6:
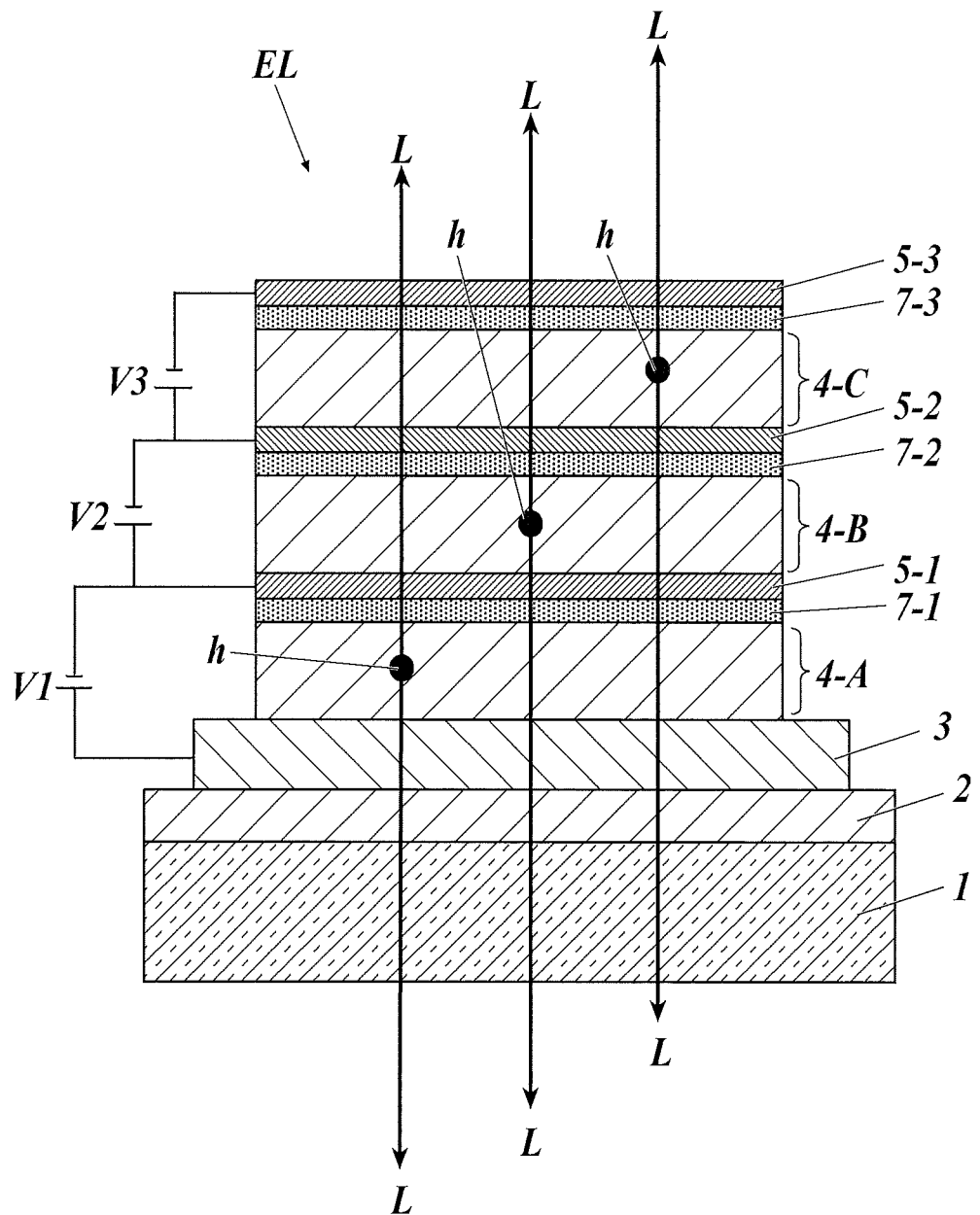
FIG. 6 is a schematic cross-sectional view illustrating another example configuration of an organic electroluminescent element including three luminous units.

FIG. 6 is a schematic cross-sectional view illustrating another example configuration of an organic electroluminescent element having a toning structure including three luminous units. FIG. 6 shows a configuration including an intermediate electrode layer 5-3 and a nitrogen-containing layer 7-3 as a cathode instead of the second electrode 6 in the configuration shown in FIG. 4. The other configuration is the same as that shown in FIG. 4.

Each component of the organic EL element of the present invention will now be described in detail.

[Substrate]

The substrate 1 of the organic EL element (EL) may be composed of any material, for example, a glass or plastic substrate.

In a configuration for extracting light from the substrate 1 as shown in FIGS. 1 to 6, the substrate 1 is preferably composed of a transparent material. Preferred examples of the transparent substrate 1 include glass or quartz substrates and resin films. In particular, resin films are preferred, which can impart flexibility to the organic EL element.

Examples of the glass material include silica glass, soda-lime silica glass, lead glass, borosilicate glass, and non-alkali glass. The substrate surfaces of these glass materials can be optionally subjected to physical treatment such as polishing or provided with a coating film of inorganic or organic material or a hybrid coating film of a combination of these coating films, in order to enhance adhesion to the adjoining layer, durability, and smoothness.

Examples of the constituent material of the resin film include polyesters, such as poly(ethylene terephthalate) (PET) and poly(ethylene naphthalate) (PEN); polyethylene; polypropylene; cellophane; cellulose esters and derivatives thereof, such as cellulose diacetate, cellulose triacetate (TAC), cellulose acetate butylate, cellulose acetate propionate (CAP), cellulose acetate phthalate, and cellulose nitrate; poly(vinylidene chloride); poly(vinyl alcohol); poly-ethylene-poly(vinyl alcohol); syndiotactic polystyrene; polycarbonates; norbornene resins; polymethylpentene; polyether ketones; polyimides; polyether sulfones (PESs); polyphenylene sulfide; polysulfones; polyether imides; polyether ketone imides; polyamides; fluorine resins; nylon; poly(methyl methacrylate); acrylics and polyacrylates; and cycloolefin resins, such as ARTON (trade name, manufactured by JSR Corp.) and APEL (trade name, manufactured by Mitsui Chemicals Inc.).

The thickness of the substrate 1 can be appropriately determined in consideration of the stability in the production of the thin-film layer 2 and is preferably within a range of 5 to 500 µm, for example, from the viewpoint of ease of conveying a film even in vacuum. In the case of forming a thin-film layer 2 by plasma enhanced CVD, since the thin-film layer 2 is formed by plasma discharge through the substrate 1, the thickness of the substrate 1 is preferably 50 to 200 µm, more preferably 50 to 100 µm.

The surface of the substrate 1 is preferably hydrophilized by surface activation treatment. Examples of the surface activation treatment include corona treatment, plasma treatment, and flame treatment.

[Thin-Film Layer]

In the organic EL element of the present invention, a thin-film layer having at least one extreme value in the refractive index distribution across the thickness is disposed on the outer side of the transparent electrode, which at least one of the first electrode and the second electrode.

In the configuration examples shown in FIGS. 1 to 6, the thin-film layer 2 according to the present invention is disposed between the substrate 1 and the first electrode 3, which is the transparent electrode.

The thin-film layer 2 according to the present invention is preferably an inorganic film having at least one extreme value in the refractive index distribution across the thickness. More specifically, the thin-film layer 2 is preferably made of a material containing silicon, oxygen, and carbon.

The thin-film layer 2 according to the present invention shows characteristic element distribution curves that demonstrate the relationship between the distance from the surface of the thin-film layer 2 (the interface on the first electrode 3) across the thickness and the percentage (also referred to as at %, atomic ratio, or atomic percent) of the number of atoms of each element (silicon, oxygen, or carbon).

The atomic percent (at %) of silicon, oxygen, or carbon is represented by the percentage of the number of silicon, oxygen, or carbon atoms to the total number of the silicon, oxygen, and carbon atoms: [{(the number of atoms of an element)/(Si+O+C)}×100(%)].

The silicon distribution curve, the oxygen distribution curve, and the carbon distribution curve show the silicon atomic percent (at %), oxygen atomic percent (at %), and carbon atomic percent (at %), respectively, versus the distance from the surface of the thin-film layer 2. A distribution curve showing a relationship between the distance from the surface of the thin-film layer 2 (the interface on the first electrode 3 side) across the thickness and the percentage (atomic percent) of the total number of oxygen and carbon atoms is referred to as an oxygen and carbon distribution curve.

The thin-film layer 2 may contain nitrogen, in addition to silicon, oxygen, and carbon. A thin-film layer 2 containing nitrogen can have an effectively controlled refractive index. For example, SiN has a refractive index of approximately 1.8 to 2.0, whereas $SiO_2$ has a refractive index of 1.5. The refractive index can therefore be controlled within a preferred range of 1.6 to 1.8 by adding nitrogen to the thin-film layer 2 and forming SiON in the thin-film layer 2.

In a thin-film layer 2 containing nitrogen, the distribution curves of the elements (silicon, oxygen, carbon, and nitrogen) in the thin-film layer 2 are as follows.

In a case of the thin-film layer 2 containing nitrogen, in addition to silicon, oxygen, and carbon, the atomic percent (at %) of silicon, oxygen, carbon, or nitrogen is represented by the percentage of the number of silicon, oxygen, carbon, or nitrogen atoms to the total number of the silicon, oxygen, carbon, and nitrogen atoms: [{(the number of atoms of an element)/(Si+O+C+N)}×100(%)].

The silicon distribution curve, the oxygen distribution curve, the carbon distribution curve, and the nitrogen distribution curve show the silicon atomic percent, oxygen atomic percent, carbon atomic percent, and nitrogen atomic percent, respectively, versus the distance from the surface of the thin-film layer 2.

(Relationship Between Element Distribution Curve and Refractive Index Distribution)

The refractive index distribution of the thin-film layer 2 can be controlled by adjusting the amounts of carbon and oxygen across the thickness of thin-film layer 2.

Figure 7:
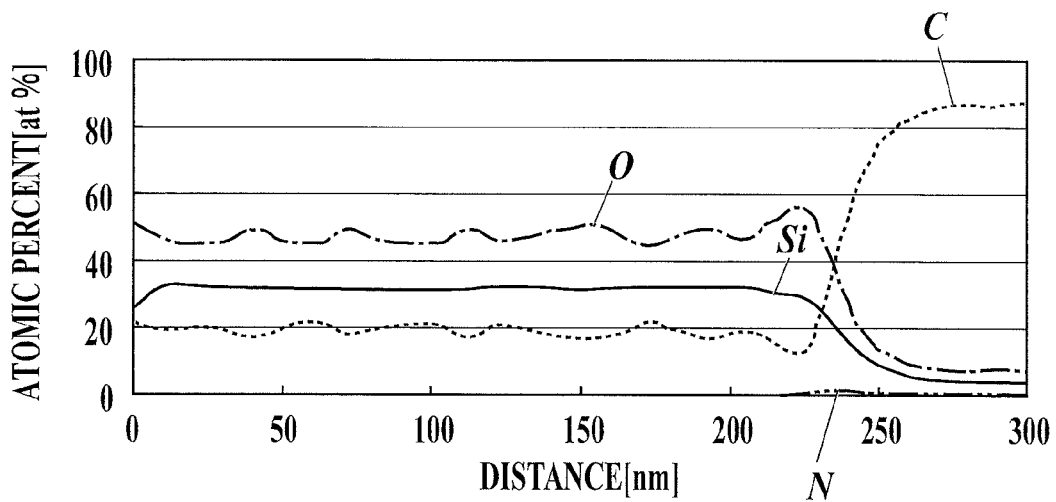
FIG. 7 is a graph showing a silicon distribution curve, an oxygen distribution curve, and a carbon distribution curve.
Figure 8:
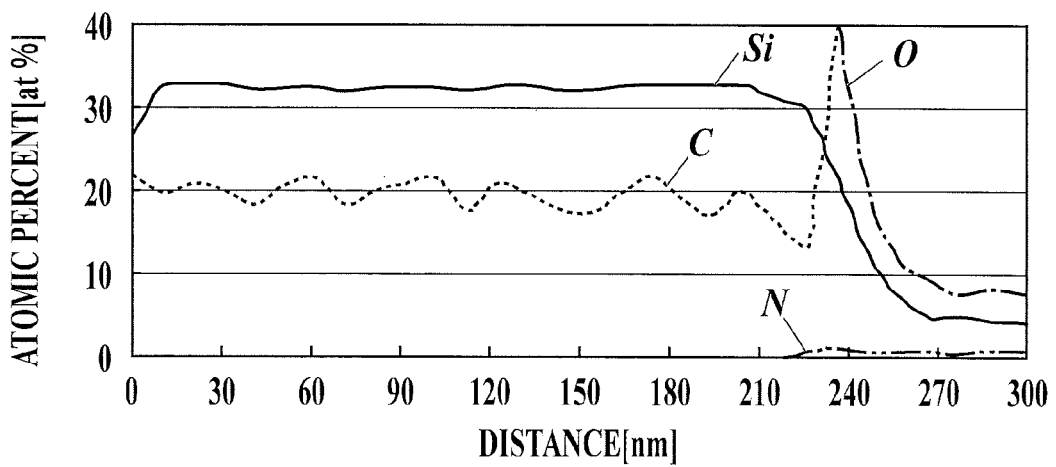
FIG. 8 is an enlarged graph showing the carbon distribution curve shown in FIG. 7.

FIG. 7 shows an example of distribution curves of silicon, oxygen, carbon, and nitrogen of the thin-film layer 2. FIG. 8 shows the carbon distribution curve enlarged from the distribution curves of silicon, oxygen, carbon, and nitrogen shown in FIG. 7. In FIGS. 7 and 8, the horizontal axis represents the distance (nm) from the surface of the thin-film layer 2 across the thickness, and the vertical axis represents the atomic percent (at %) of silicon, oxygen, carbon, or nitrogen to the total number of each element: silicon, oxygen, carbon, and nitrogen.

The details of the method for measuring the distributions of silicon, oxygen, carbon, and nitrogen are described below.

As shown in FIG. 7, each atomic percent of silicon, oxygen, carbon, and nitrogen varies with the distance from the surface of the thin-film layer 2 across the thickness. In particular, the atomic percent of oxygen and carbon largely varies with the distance from the surface of the thin-film layer 2, and each distribution curve has a plurality of extreme values. A correlation is found between the oxygen distribution curve and the carbon distribution curve: the atomic percent of oxygen is small at a distance at which the atomic percent of carbon is large, and the atomic percent of oxygen is large at a distance at which the atomic percent of carbon is small.

In a preferred embodiment of the thin-film layer 2 according to the present invention, in a distribution curve of a constituent element, where the horizontal axis represents the distance from the surface across the thickness, and the vertical axis represents the atomic percent (at %) of carbon to the total number of silicon, oxygen, and carbon atoms, the difference between the largest value and the smallest value of the atomic percent of carbon is preferably 5 at % or more.

As shown in FIG. 7 or 8, in the thin-film layer having a profile showing a change in each atomic percent (at %) of silicon, oxygen, carbon, and nitrogen atoms across the thickness, the refractive index varies depending on the proportion of each element.

Figure 9:
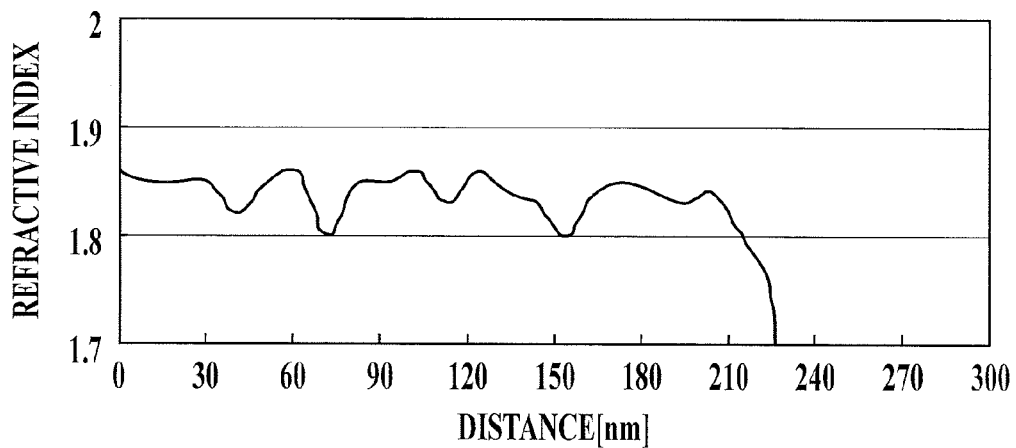
FIG. 9 is a graph showing a refractive index distribution of a thin-film layer.

FIG. 9 shows an example of the refractive index distribution curve of a thin-film layer 2.

In FIG. 9, the horizontal axis represents the distance (nm) from the surface of the thin-film layer 2 across the thickness, and the vertical axis represents the refractive index of the thin-film layer 2. The refractive index of the thin-film layer 2 shown in FIG. 9 is the measured refractive index value of the thin film 2 for visible light versus the distance from the surface of the thin-film layer 2 across the thickness. The refractive index distribution of the thin-film layer 2 can be measured by a known method, for example, with a spectroscopic ellipsometer (ELC-300, manufactured by JASCO Corp.).

As shown in FIGS. 8 and 9, a correlation is observed between the atomic percent of carbon and the refractive index of the thin-film layer 2. Specifically, the refractive index of the thin-film layer 2 is high at the positions at which the atomic percent of carbon is large. Thus, the refractive index of the thin-film layer 2 varies with the atomic percent of carbon. That is, the refractive index distribution curve of the thin-film layer 2 can be controlled by adjusting the distribution of the carbon atomic percent of the thin-film layer 2 across the thickness.

As described above, since a correlation is also found between the atomic ratios of carbon and oxygen, the refractive index distribution curve of the thin-film layer 2 can be controlled by adjusting the atomic percent and distribution curve of oxygen.

The thin-film layer 2 having an extreme value in its refractive index distribution can prevent reflection or interference occurring between the substrate 1 and the luminous units. As a result, the light emitted from a plurality of luminous units 4 passes through the layered structure and exits without total reflection or interference by the thin-film layer 2. The light quantity does not therefore decrease, and the light extraction efficiency of the organic EL element (EL) is improved.

If the intermediate electrode layer 5 is a transparent conductive metal layer including, for example, a thin film metal, reflection or interference of the light generated in the luminous units 4 would occur at the first electrode 3 to readily cause a problem of large viewing angle dependence. This problem is probably caused by fluctuation in emission spectrum due to interference by precipitation of the metal in the intermediate electrode layer 5 or reflection of light in a specific wavelength region by the intermediate electrode layer 5 or at its interface.

The viewing angle dependence can be reduced by adjusting the refractive index distribution of the thin-film layer 2 not to cause interference of the emitted light with the specific wavelength. The refractive index distribution of the thin-film layer 2 can be controlled by adjusting the carbon atomic percent. The thin-film layer 2 can be therefore equipped with desired optical characteristics by controlling the carbon distribution curve.

In the present invention, the thin-film layer 2 having a refractive index distribution curve showing one or more extreme values can adjust the color gamut through control of the optical spectrum. The thin-film layer 2 can therefore disperse the interference conditions of the resulting organic EL element (EL) and can give a configuration not causing interference at a specific wavelength.

The thin-film layer 2 therefore controls the light distribution of the light from a plurality of luminous units 4 to solve the problem of viewing angle dependence of the emission spectrum and provides a uniform light distribution to the organic EL element (EL).

(Condition of Distribution Curve of Each Element)

The thin-film layer 2 preferably has atomic percent or distribution curves of each of the elements: silicon, oxygen, and carbon, satisfying the following requirements (i) to (v):

(i) The average atomic percent of each of silicon, oxygen, and carbon to the total number of atoms of these elements at a 90% to 95% depth from the surface of the thin-film layer 2 across the thickness satisfies the relationship represented by Expression (1) or (2):

$$(\text{average atomic percent of oxygen}) > (\text{average atomic percent of silicon}) > (\text{average atomic percent of carbon}), \quad \text{Expression (1)}$$

$$(\text{average atomic percent of carbon}) > (\text{average atomic percent of silicon}) > (\text{average atomic percent of oxygen}); \quad \text{Expression (2)}$$

(ii) The refractive index distribution of the thin-film layer across the thickness has at least one maximum value and at least one minimum value;

(iii) The difference between the largest value and the smallest value of the carbon atomic percent in the thin-film layer is 5 at % or more;

(iv) At a 90% to 95% depth from the surface of the thin-film layer across the thickness, the average atomic percent of silicon to the total number of silicon, oxygen, and carbon atoms is within a range of 25 to 45 at %; and (v) The thin-film layer further contains nitrogen, in addition to silicon, oxygen, and carbon.

The organic EL element (EL) preferably includes a thin-film layer 2 satisfying at least one of the requirements (i) to (v), in particular, all of the requirements (i) to (v). The organic EL element (EL) may include two or more thin-film layers 2 each satisfying all of the requirements (i) to (v). If two or more thin-film layers 2 are provided, these thin-film layers 2 may include the same or different materials and may be disposed on the same or different faces of the substrate 1.

The refractive index of the thin-film layer 2 can be adjusted by controlling the atomic percent of carbon or oxygen, as described above for the correlation shown in FIGS. 8 and 9. The requirements (i) to (v) can therefore adjust the refractive index of the thin-film layer 2 within a preferred range.

Carbon Distribution Curve)

In a preferred embodiment, a thin-film layer 2 has a carbon distribution curve having at least one extreme value for satisfying the requirement (ii). The carbon distribution curve of the thin-film layer 2 preferably has at least two extreme values, more preferably at least three extreme values, in particular, at least one maximum value and at least one minimum value.

If the carbon distribution curve has no extreme value, the resulting thin-film layer 2 has an insufficiently uniform light distribution, and thus cannot solve the problem of viewing angle dependence of the light from the organic EL element (EL) extracted through the first electrode 3.

If the thin-film layer 2 shows three or more extreme values, one extreme value of the carbon distribution curve and another extreme value adjacent to this extreme value preferably have a difference of 200 nm or less, more preferably 100 nm or less in the distance from the surface of the thin-film layer 2 across the thickness.

(Extreme Value)

In the thin-film layer 2, the extreme value of a distribution curve is the maximum value or minimum value of the atomic ratio of an element versus the distance from the surface of the thin-film layer 2 across the thickness, or the measured value of the refractive index distribution curve corresponding to the extreme value.

In the thin-film layer 2, the maximum value of a distribution curve of each element resides at the point at which the atomic percent of the element changes from an increase to a decrease with an increase in the distance from the surface of the thin-film layer 2. In addition, the atomic percent of the element decreases by 3 at % or more at the position of which the distance from the surface of the thin-film layer 2 is longer than that of the point by 20 nm.

In the thin-film layer 2, the minimum value of a distribution curve of each element resides at the point at which the atomic percent of the element changes from a decrease to an increase with an increase in the distance from the surface of the thin-film layer 2. In addition, the atomic percent of the element increases by 3 at % or more at the position of which the distance from the surface of the thin-film layer 2 is longer than that of the point by 20 nm.

In the carbon distribution curve of the thin-film layer 2, the difference between the largest value and the smallest value of the carbon atomic percent is preferably 5 at % or more. In such a thin-film layer 2, the absolute value of the difference between the largest value and the smallest value of the carbon atomic percent is preferably 6 at % or more, more preferably 7 at % or more. If the difference between the largest value and the smallest value of the carbon atomic percent is 5 at % or more, the resulting thin-film layer 2 can have a refractive index distribution curve including a desired difference in the refractive index and thereby can provide an organic EL element having a sufficiently uniform light distribution.

A correlation is observed between the carbon distribution quantity and the refractive index. If the absolute value of the difference between the largest value and the smallest value of carbon atoms is 7 at % or more as described in the above as a preferred example, the absolute value of the difference between the largest value and the smallest value of the resulting refractive index is 0.2 or more.

(Oxygen Distribution Curve)

The oxygen distribution curve of the thin-film layer 2 preferably has at least one extreme value, more preferably at least two extreme values, most preferably at least three extreme values. In addition, the oxygen distribution curve preferably has at least one maximum value and at least one minimum value.

If the oxygen distribution curve has no extreme value, the resulting thin-film layer 2 has an insufficiently uniform light distribution, and thus cannot solve the problem of viewing angle dependence of the light from the organic EL element (EL) extracted through the first electrode 3.

When the thin-film layer 2 has three or more extreme values, one extreme value of the oxygen distribution curve and another extreme value adjacent to this extreme value preferably have a difference of 200 nm or less, more preferably 100 nm or less in the distance from the surface of the thin-film layer 2 across the thickness.

In the oxygen distribution curve of the thin-film layer 2, the absolute value of the difference between the largest value and the smallest value of the oxygen atomic percent is preferably 5 at % or more, more preferably 6 at % or more, most preferably 7 at % or more. If the difference between the largest value and the smallest value of the oxygen atomic percent is 5 at % or more, a sufficiently uniform light distribution can be obtained from the refractive index distribution curve of the resulting thin-film layer 2.

(Silicon Distribution Curve)

In the silicon distribution curve of the thin-film layer 2, the absolute value of the difference between the largest value and the smallest value of the silicon atomic percent is preferably less than 5 at %, more preferably less than 4 at %, most preferably less than 3 at %. If the difference between the largest value and the smallest value of the silicon atomic percent is less than 5 at %, a sufficiently uniform light distribution can be obtained from the refractive index distribution curve of the resulting thin-film layer 2.

(Total Number of Oxygen and Carbon: Oxygen and Carbon Distribution Curve)

In the thin-film layer 2, the percentage of the total number of oxygen atoms and carbon atoms to the total number of silicon atoms, oxygen atoms, and carbon atoms is referred to as an oxygen and carbon distribution curve.

In the oxygen and carbon distribution curve of the thin-film layer 2, the absolute value of the difference between the largest value and the smallest value of the total atomic percent of oxygen and carbon is preferably less than 5 at %, more preferably less than 4 at %, most preferably less than 3 at %.

If the difference between the largest value and the smallest value of the total atomic percent of oxygen and carbon is within the above-mentioned range, a sufficiently uniform light distribution can be obtained from the refractive index distribution curve of the resulting thin-film layer 2.

(XPS Depth Profile)

The silicon distribution, oxygen distribution, carbon distribution, oxygen and carbon distribution, and nitrogen distribution curves according to the present invention can be obtained through serial analysis of surface composition while exposing the inside of a sample by simultaneously performing X-ray photoelectron spectroscopy (XPS) measurement and rare gas (such as argon) ion sputtering, i.e., XPS depth profiling.

The distribution curve by XPS depth profiling can be prepared, for example, with the vertical axis representing the atomic percent (unit: at %) of each element and the horizontal axis representing etching time (sputtering time).

In the distribution curve of an element versus the horizontal axis representing etching time, the etching time substantially correlates to the distance from the surface of the thin-film layer 2 across the thickness. Accordingly, the distance from the surface of the thin-film layer 2 calculated from the relationship between the etching rate and the etching time in the XPS depth profiling can be used as "distance from the surface of the thin-film layer 2 across the thickness".

The XPS depth profile is preferably measured by rare gas ion sputtering using argon ($Ar^+$) as an etching ion species at an etching rate of 0.05 nm/sec ($SiO_2$ thermal oxide film equivalent value).

From the viewpoint of forming a layer having a uniform and excellent light distribution over the entire surface of the thin-film layer 2, the thin-film layer 2 is preferably substantially homogenous in the film surface direction (the direction parallel to the surface of the thin-film layer 2). The term "the thin-film layer 2 is substantially homogeneous in the film surface direction" indicates that, at two random measurement positions on a film surface of the thin-film layer 2, the numbers of extreme values of the distribution curve of an element at both positions are the same and the absolute values of the differences between the largest value and the smallest value of the carbon atomic percent of the distribution curve at both positions are the same or the differences between the largest value and the smallest value at both positions are each 5 at % or less.

(Substantial Continuity)

The thin-film layer 2 preferably has a substantially continuous carbon distribution curve. The term "the carbon distribution curve is substantially continuous" indicates that the carbon distribution curve has no descrete portion on the carbon atomic percent. Specifically, the distance (x, unit: nm) from the surface of the thin-film layer 2 calculated from the etching rate and the etching time and the carbon atomic percent (C, unit: at %) satisfy the requirement represented by Expression (F1):

$$(dC/dx) \leq 0.5. \qquad \text{Expression (F1)}$$

(Silicon Atomic Percent and Oxygen Atomic Percent)

In the silicon atomic percent, oxygen atomic percent, and carbon atomic percent of the respective distribution curves, each average atomic percent of silicon, oxygen, and carbon to the total number of atoms of these elements at a 90% to 95% depth from the surface of the thin-film layer 2 across the thickness satisfies the relationship of Expression (1) or (2) mentioned above.

In such a case, the atomic percent of the number of silicon atoms to the total number of the silicon atoms, oxygen atoms, and carbon atoms in the thin-film layer 2 is preferably within a range of 25 to 45 at %, more preferably 30 to 40 at %.

The atomic percent of the number of oxygen atoms to the total number of the silicon atoms, oxygen atoms, and carbon atoms in the thin-film layer 2 is preferably within a range of 33 to 67 at %, more preferably 45 to 67 at %.

The atomic percent of the number of carbon atoms to the total number of the silicon atoms, oxygen atoms, and carbon atoms in the thin-film layer 2 is preferably within a range of 3 to 33 at %, more preferably 3 to 25 at %.

(Thickness of Thin-Film Layer)

The thin-film layer 2 preferably has a thickness within a range of 5 to 3000 nm, more preferably 10 to 2000 nm, most preferably 100 to 1000 nm. The thin-film layer 2 having a thickness within such a range has a sufficiently uniform light distribution.

When the thin-film layer 2 is composed of multiple layers, the total thickness of the thin-film layer 2 is preferably within a range of 10 to 10000 nm, more preferably 10 to 5000 nm, more preferably 100 to 3000 nm, most preferably 200 to 2000 nm.

(Method of Forming Thin-Film Layer)

The thin-film layer 2 of the organic EL element (EL) may be formed by any process. Preferred is plasma discharge chemical vapor deposition in a magnetic field applied between rollers which can form a thin-film layer having accurately controlled desired silicon distribution, oxygen distribution, carbon distribution, oxygen and carbon distribution, and nitrogen distribution curves on a substrate.

The thin-film layer according to the present invention is formed through plasma discharge chemical vapor deposition involving winding a substrate around a pair of film-forming rollers and supplying a film-forming gas between the pair of film-forming rollers, with a plasma discharge processing system including the rollers to which a magnetic field is applied. In such discharge in a magnetic field between a pair of film-forming rollers, the polarity between the film-forming rollers is preferably alternately reversed. The film forming gas used in the plasma enhanced chemical vapor deposition is preferably a source gas containing an organic silicon compound and an oxygen gas, and the content of the oxygen gas in the film forming gas is preferably not higher than the theoretical amount of oxygen necessary for completely oxidizing the entire organic silicon compound in the film forming gas. The thin-film layer according to the present invention is preferably formed by a continuous film forming process.

The method of forming a thin-film layer according to the present invention will now be described.

The thin-film layer according to the present invention is preferably formed on a surface of a resin substrate (or on an intermediate layer optionally disposed on the substrate) with a plasma discharge processing system including rollers to which a magnetic field is applied.

In plasma discharge chemical vapor deposition in a magnetic field applied between rollers (hereinafter also referred to as "plasma enhanced CVD") which is applicable to formation of the thin-film layer according to the present invention, plasma discharge is preferably generated in a discharge space formed by applying a magnetic field between a plurality of film-forming rollers. In the present invention, a pair of film-forming rollers is used. A resin substrate is wound around the pair of film-forming rollers, and plasma is preferably generated by electric discharge between the film-forming rollers being applied with a magnetic field. Thus, a pair of film-forming rollers is used; a resin substrate is wound around the pair of film-forming rollers; plasma is discharged between the pair of film-forming rollers; and the distance between the resin substrate and the film-forming rollers can be varied, which, for example, allows the formation of a thin-film layer in such a manner that carbon atomic percent has a concentration gradient and continuously changes in the layer.

In such formation of a film, a surface portion of the resin substrate lying on one of the film-forming rollers and another surface portion of the resin substrate lying on the other film-forming rollers can be simultaneously subjected to film formation. The thin film therefore can be efficiently produced. In addition, since the film forming rate can be doubled and the resulting film can have the same structure, the number of extreme values of the carbon distribution curve can be at least doubled. This process can efficiently form a layer satisfying all of the requirements (i) to (v).

The thin-film layer according to the present invention can be preferably formed on a surface of the substrate by a roll-to-roll system, from the viewpoint of productivity.

The production of a gas barrier film by such plasma enhanced chemical vapor deposition may be performed with any apparatus. The apparatus preferably at least includes a pair of film-forming rollers including a device for applying a magnetic field, a plasma power supply, and a structure that can perform electric discharge between the pair of film-forming rollers. For example, a thin-film layer can be formed on a substrate with the apparatus shown in FIG. 10 by a roll-to-roll system through plasma enhanced chemical vapor deposition.

The method of forming the thin-film layer according to the present invention will now be described in detail with reference to FIG. 10.

Figure 10:
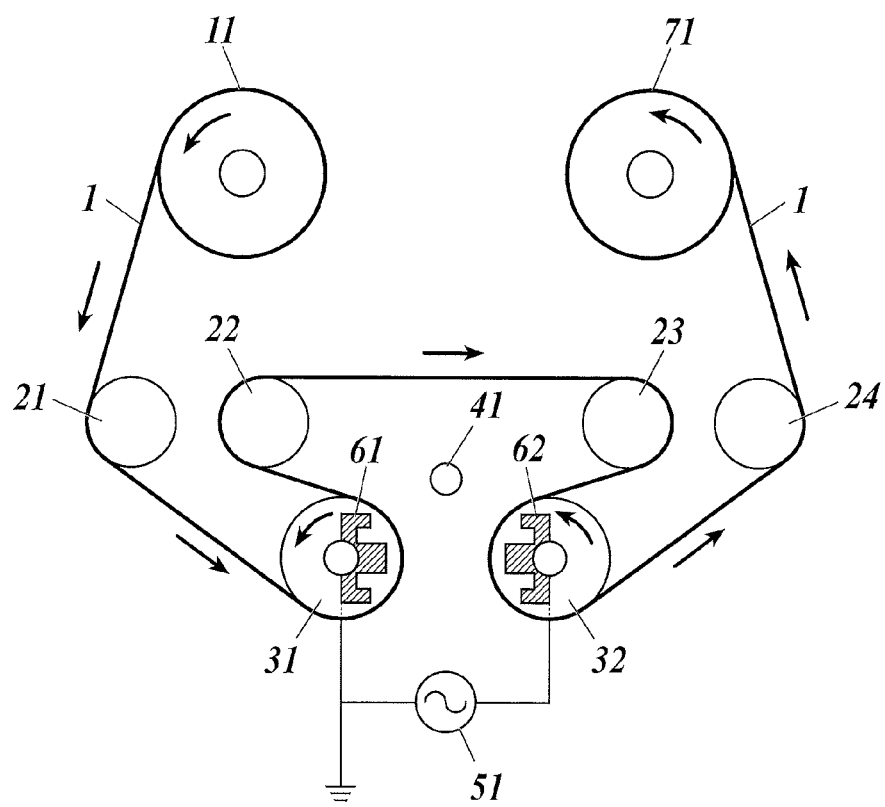
FIG. 10 is a schematic view illustrating an example configuration of a plasma discharge CVD system including rollers to which a magnetic field is applied, which system is applicable to formation of a thin-film layer according to the present invention.

FIG. 10 is a schematic view illustrating an example of a plasma discharge CVD system including rollers to which a magnetic field is applied, which can be suitably used in formation of a thin-film layer according to the present invention. The substrate 1 described below has a conductive layer according to the present invention on the back surface.

The plasma discharge CVD system including rollers to which a magnetic field is applied (hereinafter, also referred to as "plasma enhanced CVD system") shown in FIG. 10 is mainly composed a feed-out roller 11, conveying rollers 21, 22, 23, and 24, film-forming rollers 31 and 32, a film-forming gas supply pipe 41, a power supply 51 for plasma generation, magnetic field generators 61 and 62 disposed inside the film-forming rollers 31 and 32, respectively, and a take-up roller 71. In such a plasma enhanced CVD system, at least the film-forming rollers 31 and 32, the film-forming gas supply pipe 41, the power supply 51 for plasma generation, and the magnetic field generators 61 and 62 are disposed in a vacuum chamber (not shown). The vacuum chamber (not shown) of such a plasma enhanced CVD system is connected to a vacuum pump (not shown). The vacuum pump can appropriately control the pressure in the vacuum chamber.

In such a plasma enhanced CVD system, the pair of film-forming rollers (film-forming roller 31 and film-forming roller 32) are connected to the power supply 51 for plasma generation and can function as a pair of counter electrodes. The power supply 51 for plasma generation supplies power to the pair of film-forming rollers (film-forming roller 31 and film-forming roller 32), and electricity is discharged to the space formed between the film-forming roller 31 and the film-forming roller 32 to generate plasma in the space (also referred to as "discharge space") between the film-forming roller 31 and the film-forming roller 32. Since the film-forming roller 31 and the film-forming roller 32 are used as electrodes, their material and design may be appropriately changed to those usable as electrode. In such a plasma enhanced CVD system, the pair of film-forming rollers (film-forming rollers 31 and 32) are preferably disposed such that the central axes are substantially parallel to each other on a plane. Since such a geometric disposition of the film-forming rollers (film-forming rollers 31 and 32) can double the film forming rate and can form films with the same structure, the number of extreme values of the carbon distribution curve can be at least doubled.

The magnetic field generators 61 are 62 fixed to the insides of the film-forming roller 31 and the film-forming roller 32, respectively, in such a manner that the devices do not rotate in operation with the rotation of the film-forming rollers.

The film-forming rollers 31 and 32 may be known appropriate rollers. The film-forming rollers 31 and 32 should have the same diameters from the viewpoint of more efficiently forming a thin film. The film-forming rollers 31 and 32 preferably have a diameter within a range of 300 to 1000 mm$\phi$, more preferably 300 to 700 mm$\phi$, from the viewpoint of discharging conditions, the space of the chamber, and other factors. A diameter exceeding 300 mm$\phi$ can maintain a proper space for the plasma discharge, resulting in high productivity. In addition, the total heat of plasma discharge is not applied to a film within a short period of time, resulting in low residual stress. In contrast, a diameter of 1000 mm$\phi$ or less enables a practical system including a uniform plasma discharge space to be designed.

The feed-out roller 11 and the conveying rollers 21, 22, 23, and 24 of the plasma enhanced CVD system can be appropriately selected from known rollers. The take-up roller 71 may be any one that can wind the resin substrate 1 equipped with the thin-film layer, and known rollers can be appropriately used.

The film-forming gas supply pipe 41 may be one that can supply or discharge a source gas and an oxygen gas at certain rates. The power supply 51 for plasma generation can be a power supply for known plasma generating systems. The power supply 51 for plasma generation supplies power to the film-forming roller 31 and the film-forming roller 32 connected to the power supply 51, and these rollers can be used as counter electrodes for electric discharge. Such a power supply 51 for plasma generation is preferably one (such as AC power supply) that can alternately change the polarity of the pair of film-forming rollers for more efficiently performing plasma enhanced CVD. Such a power supply 51 for plasma generation more preferably controls the applied power within a range of 100 W to 10 kW and the AC frequency within a range of 50 Hz to 500 kHz, for more efficiently performing plasma enhanced CVD. The magnetic field generators 61 and 62 may be known appropriate magnetic field generators.

The thin-film layer according to the present invention can be produced with a plasma enhanced CVD system, such as that shown in FIG. 10, by appropriately adjusting, for example, the type of the source gas, the power of the electrode drum of the plasma generating system, the intensity of the magnetic field generator, the pressure in the vacuum chamber, the diameters of the film-forming rollers, and the speed of conveying the resin substrate.

That is, a thin-film layer according to the present invention is formed through plasma enhanced CVD with the plasma enhanced CVD system shown in FIG. 10: Plasma discharge is generated by a magnetic field applied between the pair of film-forming rollers (film-forming rollers 31 and 32) while the vacuum chamber being supplied with a film forming gas (e.g., source gas); and the plasma decomposes the film forming gas (e.g., source gas) to form a film on the surface of the resin substrate 1 lying on the film-forming roller 31 and on the surface of the resin substrate 1 lying on the film-forming roller 32. During the process, the resin substrate 1 is conveyed by the feed-out roller 11 and the film-forming roller 31, and the thin-film layer is formed on the surface of the resin substrate 1 by a continuous film forming process of a roll-to-roll system.

<Source Gas>

The source gas of the film forming gas applied to the formation of the thin-film layer according to the present invention is preferably an organic silicon compound containing at least silicon.

Examples of the organic silicon compound applicable to the present invention include hexamethyldisiloxane, 1,1,3,3-tetramethyl disiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethyl cyclotetrasiloxane. Among these organic silicon compounds, preferred are hexamethyldisiloxane and 1,1,3,3-tetramethyl disiloxane, from the viewpoint of handling in film formation, gas barrier of the resulting thin-film layer, and other factors. These organic silicon compounds can be used alone or in combination of two or more thereof.

The film forming gas may include a reactive gas in addition to the source gas. The reactive gas can be an appropriately selected from gases reactive with the source gas to generate an inorganic compound such as an oxide or nitride. Examples of the reactive gas that forms oxide include oxygen and ozone. Examples of the reactive gas that forms nitride include nitrogen and ammonia. These reactive gases may be used alone or in combination of two or more thereof. For example, in order to generate oxynitride, a combination of a reactive gas forming oxide and a reactive gas forming nitride can be used.

The film forming gas can optionally include a carrier gas for supplying the source gas into the vacuum chamber. The film forming gas can optionally include a discharge gas for generating plasma discharge. The carrier gas and the discharge gas may be known gases, for example, rare gases, such as helium, argon, neon, and xenon, and hydrogen gas.

If the film forming gas includes a source gas including an organic silicon compound containing silicon and an oxygen gas, the ratio of the oxygen gas to the source gas is preferably not significantly higher than the theoretical amount of oxygen necessary for complete reaction of the source gas with the oxygen gas. If the ratio of the oxygen gas is significantly high, an objective thin-film layer of the present invention is rarely prepared. Accordingly, in order to obtain a thin-film layer having a desired element profile, the ratio of the oxygen gas is preferably not higher than the theoretical amount necessary for complete oxidation of the entire organic silicon compound in the film forming gas.

A reaction system of a source gas, hexamethyldisiloxane (HMDSO, organic silicon compound, chemical formula: $(CH_3)_6Si_2O$), and a reactive gas, oxygen ($O_2$), will be described as a typical example.

In formation of a thin film of a silicon-oxygen system through a reaction of a film forming gas containing a source gas, hexamethyldisiloxane (HMDSO, $(CH_3)_6Si_2O$), and a reactive gas, oxygen ($O_2$), by plasma enhanced CVD, the film forming gas forms a thin film of silicon dioxide $SiO_2$ through the reaction represented by reaction formula (1):

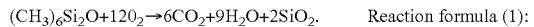

$(CH_3)_6Si_2O + 12O_2 \rightarrow 6CO_2 + 9H_2O + 2SiO_2$.  Reaction formula (1):

In this reaction, 12 mol of oxygen is necessary for complete oxidation of 1 mol of hexamethyldisiloxane. Since a complete reaction using a film forming gas containing 1 mol of hexamethyldisiloxane and 12 mol or more of oxygen forms a uniform silicon dioxide film, the flow ratio of the raw material gases is controlled such that the ratio of the raw materials is not higher than the theoretical ratio for the complete reaction and that an incomplete reaction proceeds. That is, the amount of oxygen should be lower than 12 mol, which is the stoichiometric ratio, for 1 mol of hexamethyldisiloxane.

In an actual reaction in the chamber of a plasma enhanced CVD system, the raw material, hexamethyldisiloxane, and the reactive gas, oxygen, are supplied from a gas inlet to a film forming region to form a film. Even if the molar quantity (flow rate) of oxygen as the reactive gas is 12 times the molar quantity (flow rate) of hexamethyldisiloxane as the raw material, a complete reaction does not really proceed, and the reaction would be probably completed if the quantity of oxygen were a large excess compared to the stoichiometric ratio. For example, in order to prepare silicon oxide through complete oxidation by CVD, the molar quantity (flow rate) of oxygen is 20 times the molar quantity (flow rate) of hexamethyldisiloxane as the raw material in some cases. The molar quantity (flow rate) of oxygen relative to the molar quantity (flow rate) of the raw material, hexamethyldisiloxane, is preferably not higher than 12 times (more preferably not higher than 10 times) the stoichiometric ratio. If hexamethyldisiloxane and oxygen are contained in such a ratio, carbon atoms and hydrogen atoms of hexamethyldisiloxane that has not been completely oxidized are incorporated into the thin-film layer, and thereby a desired thin-film layer is formed. The resulting thin-film layer can have an excellent barrier property and elasticity. If the molar quantity (flow rate) of oxygen relative to the molar quantity (flow rate) of hexamethyldisiloxane in the film forming gas is significantly small, excess amounts of carbon atoms and hydrogen atoms of hexamethyldisiloxane that has not been completely oxidized are incorporated into the thin-film layer. In this case, the transparency of the thin-film layer is low, and the barrier film cannot be applied to electronic devices, for example, a flexible substrate for a device that is required to be transparent, such as an organic EL device or an organic thin-film solar cell. From these viewpoints, the lower limit of the molar quantity (flow rate) of oxygen in the film forming gas is preferably larger than 0.1 times, more preferably larger than 0.5 times, the molar quantity (flow rate) of hexamethyldisiloxane.

<Degree of Vacuum>

The pressure (degree of vacuum) in the vacuum chamber can be appropriately adjusted depending on the type of the source gas and other factors and is preferably within a range of 0.5 to 100 Pa.

<Film Formation with Roller>

In plasma enhanced CVD using a plasma CVD system as shown in FIG. 10, a power is applied to electrode drums (disposed in the film-forming rollers 31 and 32 in FIG. 10) connected to the power supply 51 for plasma generation for performing electric discharge between the film-forming rollers 31 and 32. The power can be appropriately controlled depending on the type of the source gas, the pressure in the vacuum chamber, and other factors. Although the applied power therefore cannot be determined unconditionally, it is preferably within a range of 0.1 to 10 kW. If the applied power is within such a range, particles (irregular particles) do not occur, and the quantity of heat being generated during film formation can be within a control range. Since the temperature of the surface of the substrate does not significantly increase during film formation, the resin substrate is not thermally deformed, and thermal degradation and wrinkling of the film do not occur during the process. In addition, since the resin substrate is not melted by heat, a large current is not discharged between unloaded film-forming rollers, and the film-forming rollers are not damaged.

The transfer rate or line speed of the resin substrate 1 can be appropriately controlled depending on the type of the source gas, the pressure in the vacuum chamber, and other factors and is preferably within a range of 0.25 to 100 m/min, more preferably 0.5 to 20 m/min. A line speed within such a range can effectively prevent thermal wrinkling of the resin substrate and properly control the thickness of the resulting thin-film layer.

(Other Constituent Layers Disposable Adjacent to Thin-Film Layer)

Between the thin-film layer 2 according to the present invention and the substrate 1, another constituent layer can be optionally disposed.

[Gas Barrier Layer]

In the organic EL element of the present invention, a gas barrier layer 8 is preferably disposed on the thin-film layer 2 according to the present invention, for example, as shown in FIG. 5, between the thin-film layer 2 and the first electrode 3.

The gas barrier layer according to the present invention may be formed by any process, and is preferably formed by applying a polysilazane-containing solution through a wet coating process, drying the coating film, and modifying the coating film through irradiation with vacuum ultraviolet light (VUV light) having a wavelength of 200 nm or less.

In the present invention, fine defects occurring during the formation of the thin-film layer 2 according to the present invention can be filled with the component of the gas barrier layer including polysilazane applied from the upper side of the thin-film layer. The formation of the gas barrier layer can efficiently prevent, for example, gas purge and is preferred from the viewpoint of further improving the gas barrier and flexibility.

The gas barrier layer preferably has a thickness within a range of 1 to 500 nm, more preferably 10 to 300 nm. A gas barrier layer having a thickness of 1 nm or more can achieve desired gas barrier ability, and a thickness of 500 nm or less can prevent degradation in film quality, such as cracking of a dense silicon oxynitride film.

<Polysilazane>

The polysilazane according to the present invention is a polymer having silicon-nitrogen bonds in its molecular structure and being a precursor of silicon oxynitride. The present invention can use any polysilazane, and preferred are compounds having a structure represented by Formula (1):

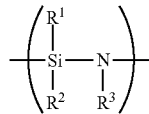

Formula (1)

In Formula (1), $R^1$, $R^2$, and $R^3$ each independently represent a hydrogen atom or an alkyl, alkenyl, cycloalkyl, aryl, alkylsilyl, alkylamino, or alkoxy group.

In the present invention, from the viewpoint of the density of the gas barrier layer, most preferred are all of $R^1$, $R^2$, and $R^3$ are hydrogen atoms. That is, the polysilazane is most preferably perhydropolysilazane.

The perhydropolysilazane is inferred to have a structure including a linear chain structure and a ring structure mainly composed of six-membered rings and eight-membered rings. The perhydropolysilazane has a number-average molecular weight (Mn) of approximately 600 to 2000 (in terms of polystyrene measured by gel permeation chromatography) and is a liquid or solid material.

The polysilazane is commercially available in the form of solution dissolved in an organic solvent, which can be directly used as a polysilazane coating solution. Examples of the commercially available polysilazane solution include NN120-20, NAX120-20, and NL120-20 manufactured by AZ Electronic Materials (Merck's Performance Materials division).

The gas barrier layer can be formed on the thin-film layer, which has been formed by plasma discharge CVD in a magnetic field provided between rollers, by applying a polysilazane coating solution, drying the resulting coating film, and then irradiating the coating film with vacuum ultraviolet light.

The organic solvent for preparing the polysilazane coating solution should not be ones that readily reactive with polysilazane, such as alcoholic solvents or solvents containing water. Usable examples of the organic solvent include hydrocarbon solvents, such as aliphatic hydrocarbons, alicyclic hydrocarbons, and aromatic hydrocarbons; halogenated hydrocarbon solvents; and ethers, such as aliphatic ethers and alicyclic ethers. Specific examples of the solvent include hydrocarbons, such as pentane, hexane, cyclohexane, toluene, xylene, Solvesso, and terpene; halogenated hydrocarbons, such as methylene chloride and trichloroethane; and ethers, such as dibutyl ether, dioxane, and tetrahydrofuran. The solvent is selected from these organic solvents depending on the purpose, such as the solubility of polysilazane and the evaporation rate of the solvent, and may be a mixture of organic solvents.

The concentration of the polysilazane contained in the coating solution for forming a gas barrier layer varies with the thickness of the gas barrier layer to be formed and the pot life of the coating solution, and is preferably within a range of 0.2 to 35% by mass.

In order to accelerate the conversion to silicon oxynitride, the coating solution for forming a gas barrier layer may contain an amine catalyst or a metal catalyst, i.e., a Pt compound such as Pt acetylacetonate, a Pd compound such as Pd propionate, or a Rh compound such as Rh acetylacetonate. In the present invention, the amine catalyst is most preferred. Examples of the amine catalyst include N,N-diethylethanolamine, N,N-dimethylethanolamine, triethanolamine, triethylamine, 3-morpholinopropylamine, N,N,N',N'-tetramethyl-1,3-diaminopropane, and N,N,N',N'-tetramethyl-1,6-diaminohexane.

The coating solution for forming a gas barrier layer containing polysilazane is applied through an appropriate wet coating process. Examples of the process include roller coating, flow coating, ink jetting, spray coating, printing, dip coating, flow casting film forming, bar coating, and gravure printing.

The thickness of the coating film can be appropriately determined depending on the purpose. The coating film preferably has a dried thickness within a range of 50 nm to 2 μm, more preferably 70 nm to 1.5 μm, and most preferably 100 nm to 1 μm.

<Excimer Treatment>

In the formation of the gas barrier layer according to the present invention, at least a part of polysilazane is modified into silicon oxynitride in the step of irradiating the layer containing polysilazane with vacuum ultraviolet (VUV) light.

In the vacuum ultraviolet light irradiation step in the present invention, the intensity of the vacuum ultraviolet light at the surface of the polysilazane coating film layer is preferably within a range of 30 to 200 mW/cm$^2$, more preferably 50 to 160 mW/cm$^2$. An intensity of 30 mW/cm$^2$ or more does not have a risk of decreasing the modification efficiency. An intensity of 200 mW/cm$^2$ or less does not cause ablation of the coating film and does not damage the substrate.

The irradiation energy of the vacuum ultraviolet light at the surface of the polysilazane coating film layer is preferably within a range of 200 to 10000 mJ/cm$^2$, more preferably 500 to 5000 mJ/cm$^2$. An energy of 200 mJ/cm$^2$ or more is sufficient for modification, and an energy of 10000 mJ/cm$^2$ or less does not cause excessive modification and does not cause cracking and thermal deformation of the resin substrate.

The vacuum ultraviolet light source is preferably a rare gas excimer lamp. The atoms of rare gas, such as Xe, Kr, Ar, or Ne, do not form molecules by chemical bonds, and the rare gas is therefore called inert gas.

An excited atom of a rare gas energized by, for example, electric discharge can bond with another atom to form a molecule. If the rare gas is xenon, the reaction is as follows:

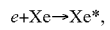

$$e + Xe \rightarrow Xe^*,$$

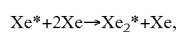

$$Xe^* + 2Xe \rightarrow Xe_2^* + Xe,$$

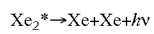

$$Xe_2^* \rightarrow Xe + Xe + h\nu \quad (172\ nm).$$

The excited excimer molecule, Xe$_2$*, emits excimer light of 172 nm when it is transited to the ground state.

The excimer lamp is characterized by a high efficiency due to concentrated radiation of one wavelength and substantially no radiation of light other than intended light. Since additional light is not radiated, the temperature of the object does not increase. In addition, since start and re-start can instantly occur, instantaneous lighting and flashing can be performed.

Excimer emission is usually achieved by dielectric barrier discharge. The dielectric barrier discharge is generated in a gas space formed between a pair of electrodes separated by a dielectric substance, such as transparent quartz, by applying a high voltage of a high frequency of several tens kilohertz to the electrodes. The dielectric barrier discharge is thunder-like very narrow discharge and is called micro discharge. When the streamer of the micro discharge reaches the wall of a tube (inductor), the charge accumulates on the surface of the dielectric, and the micro discharge disappears.

The micro discharge spreads to the entire wall of the tube. The dielectric barrier discharge is of repeating the generation and the disappearance and therefore causes flickering of light that can be observed with naked eyes. In addition, the streamer having a very high temperature comes into direct contact with a local portion of the tube wall and therefore has a risk of accelerating the deterioration of the tube wall.

Excimer emission can also be efficiently generated by electrodeless field discharge, as in dielectric barrier discharge. The electrodeless field discharge is based on capacitive coupling and is also called RF discharge. The same lamp and electrodes as those in dielectric barrier discharge can be basically used in the same arrangement, but the high frequency of the voltage applied between the electrodes is several megahertz. Since the electrodeless field discharge can generate spatially and temporally uniform discharge, the resulting lamp does not flicker over a prolonged service life.

The discharge may be either the dielectric barrier discharge or the electrodeless field discharge. Although the surface of the electrode at which a lamp is in contact with may be flat, an electrode having a shape along the curve of a lamp can be tightly fixed to the lamp and can perform stable electric discharge due to the firm adhesion to the lamp. A curved surface of aluminum serving as a mirror surface can also function as a reflector of light.

The Xe excimer lamp radiates ultraviolet light having a single short wavelength of 172 nm and has a high emission efficiency. Since this light has a large oxygen absorption coefficient, a high concentration of oxygen radical species or ozone can be generated from a slight amount of oxygen.

The energy of light having a short wavelength of 172 nm has high ability of dissociating the bonds of an organic substance. A combination of the active oxygen or ozone and the high energy by ultraviolet radiation can modify the polysilazane layer within a short period of time.

The excimer lamp has a high light-generating efficiency and can be lit by low-power input. In addition, since energy is radiated as light having a wavelength in the ultraviolet light region, i.e., short wavelength, without emitting light having a long wavelength causing an increase in temperature, the surface temperature of the object does not increase. The excimer lamp is therefore suitable for resin film materials having flexibility, such as poly(ethylene terephthalate) (PET), which is susceptible to heat.

The reaction under irradiation with ultraviolet light needs oxygen. Since vacuum ultraviolet light is absorbed by oxygen and readily reduces the efficiency of the ultraviolet light irradiation step, irradiation with vacuum ultraviolet light is preferably performed under conditions having an oxygen concentration as low as possible. That is, the oxygen concentration during the vacuum ultraviolet light irradiation is preferably within a range of 10 to 10000 ppm, more preferably 50 to 5000 ppm, most preferably 1000 to 4500 ppm.

The gas in the atmosphere during irradiation with the vacuum ultraviolet light is preferably a dried inert gas, in particular, dried nitrogen gas from the viewpoint of cost. The oxygen concentration can be adjusted by controlling the flow ratio of an oxygen gas to an inert gas while measuring the flow rates of the oxygen gas and the inert gas to be introduced into the irradiation chamber.

The thin-film of the present invention can be provided with optional layers, such as a smooth layer and a bleed-out protective layer, adjacent to the thin-film layer, in addition to the gas barrier layer.

[First Electrode]

The first electrode 3 is an ultrathin metal film that can have optical transparency and that does not cause light loss due to plasmon. The transparent conductive metal layer is also a continuous metal film having conductivity. Specifically, the optical transparency at a wavelength of 550 nm is 60% or more, the thickness is 1 to 30 nm, and the sheet resistance is 0.0001 to 50Ω/□, preferably 0.01 to 30 Ω/□.

If the first electrode 3 is used as the anode of an organic EL element, the electrode material is preferably a metal, alloy, electrically conductive compound, or a mixture thereof having a large work function (4 eV or more). Examples of the electrode material include metals, such as Au; CuI; complex oxides of indium-tin (hereinafter, abbreviated as "ITO"); and conductive transparent materials, such as $SnO_2$ and ZnO.

The electrode material may be an amorphous material, such as IDIXO ($In_2O_3$—ZnO), that can form a transparent conductive film. The anode may be formed by forming a thin film by, for example, vapor deposition or sputtering of an electrode material and patterning the thin film into a desired shape by photolithography. Alternatively, if the anode does not need a high pattern precision (approximately 100 μm or more), a pattern may be formed with a mask having a desired shape during the deposition or sputtering of the electrode material.

If an applicable material, such as an organic conductive compound, is used, a wet film-forming process, such as printing or coating, can be employed.

[Intermediate Electrode Layer]

The organic EL element of the present invention is characterized by a structure including two or more luminous units layered between a first electrode and a second electrode, adjacent luminous units each being separated by an intermediate electrode layer, the intermediate electrode layer including an independent connecting terminal for electrical connection.

The intermediate electrode layer according to the present invention includes a thin film metal, more preferably silver and is preferably a transparent intermediate electrode layer having an optical transparency at a wavelength of 550 nm of 60% or more.

The intermediate electrode layer is preferably, but not limited to, a thin film metal layer made of silver or an alloy composed mainly of silver, and preferably has a configuration including an underlying layer adjacent to the intermediate electrode layer, the underlying layer being an organic layer, more preferably a nitrogen-containing layer.

Examples of the method of forming such an intermediate electrode layer include wet processes, such as application, ink jetting, coating, and dipping; and dry processes, such as vapor deposition (e.g., resistance heating and an EB deposition), sputtering, and CVD. In particular, vapor deposition is preferred. The intermediate electrode layer is preferably formed on a nitrogen-containing layer. The intermediate electrode layer is characterized by its sufficient conductivity, even if post-treatment, such as high-temperature annealing, is not performed. High-temperature annealing may be performed after formation of the layer as necessary.

If the intermediate electrode layer is made of silver, the silver preferably has a purity of 99% or more. In order to keep the stability of silver, palladium (Pd), copper (Cu), gold (Au), or another element may be added to the silver.

When the intermediate electrode layer is made of an alloy composed mainly of silver, the content of silver is preferably 50% or more. Examples of the alloy include silver-magnesium (Ag.Mg), silver-copper (Ag.Cu), silver-palladium (Ag.Pd), silver-palladium-copper (Ag.Pd.Cu), silver-indium (Ag.In), silver-gold (Ag.Au), silver-aluminum (Ag.Al), silver-zinc (Ag.Zn), silver-tin (Ag.Sn), silver-platinum (Ag.Pt), silver-titanium (Ag.Ti), and silver-bismuth (Ag.Bi).

The intermediate electrode layer can be optionally a laminate of layers of silver or an alloy composed mainly of silver. That is, the intermediate electrode layer may have a structure composed of silver layers and alloy layers alternately laminated multiple times or a structure of a laminate composed of layers of different alloys. An intermediate electrode layer having a two-layer structure, for example, is composed of an aluminum (Al) layer on the nitrogen-containing layer and a silver layer disposed on the aluminum layer. In this case, the aluminum layer may be a continuous film or an island-like layer or a layer having holes. Alternatively, the silver layer is disposed such that a part of the layer adjoins the nitrogen-containing layer. Thus, the intermediate electrode layer may have a structure having another metal between the nitrogen-containing layer and the film composed mainly of silver.

The intermediate electrode layer preferably has a thickness within a range of 1 to 30 nm, more preferably 2 to 20 nm, and most preferably 4 to 12 nm. The intermediate electrode layer having a thickness within the above-mentioned range is preferred because that the amount of light absorption or reflection components is maintained to be low, which prevents a reduction in optical transparency and also keeps the conductivity.

[Nitrogen-Containing Layer]

In a preferred embodiment of the organic EL element of the present invention, a nitrogen-containing layer is disposed on at least one surface of the intermediate electrode layer.

The nitrogen atom-containing compound of the nitrogen-containing layer may be any compound containing a nitrogen atom in the molecule and is preferably a compound having a heterocycle containing a nitrogen atom as the hetero atom. Examples of the heterocycle containing a nitrogen atom as the hetero atom include aziridine, azirine, azetidine, azete, azolidine, azole, azinane, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-C-cinnoline, porphyrin, chlorin, and choline.

The nitrogen atom-containing compound of the nitrogen-containing layer is further preferably a heteroaromatic compound containing a nitrogen atom having an unshared electron pair that is not involved in aromaticity.

In the present invention, the term "nitrogen atom having an unshared electron pair that is not involved in aromaticity" indicates a nitrogen atom having an unshared electron pair (also referred to as "lone pair") that is not an essential element directly involved in the aromaticity of an unsaturated cyclic compound. That is, the nitrogen atom has an unshared electron pair that is not involved in the n electron system delocalized on a conjugated unsaturated ring structure (aromatic ring) and is not essential for expressing aromaticity on the chemical structural formula.

The term "aromaticity" throughout the specification refers to that in a conjugated (resonance) unsaturated ring structure including circularly arranged atoms having n electrons, the number of electrons contained in the n electron system delocalized on the ring satisfies 4n+2 (n=0 or a positive integer) (i.e., Huckel's rule). For example, the nitrogen atom of pyridine and the nitrogen atom of an amino group as a substituent fall under the "nitrogen atom having an unshared electron pair that is not involved in aromaticity" according to the present invention.

The heteroaromatic compound contained in the nitrogen-containing layer may be any compound containing a nitrogen atom having an unshared electron pair that is not involved in aromaticity in the molecule regardless of its structure. The heteroaromatic compound preferably has a pyridine ring in the molecule, more preferably an azacarbazole ring, an azadibenzofuran ring, or an azadibenzothiophene ring, most preferably a γ,γ'-diazacarbazole ring or a σ-carboline ring.

The heteroaromatic compound contained in the intermediate layer 1a is preferably a compound having a structure represented by Formula (1A). The compound represented by Formula (1A) preferably has a structure represented by Formula (1B), Formula (1C), or Formula (1D). A compound having a structure represented by Formula (1E) or Formula (1F) can also be preferably used as the heteroaromatic compound contained in the intermediate layer 1a.

[Chem. 2]

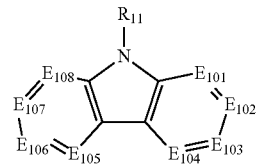

Formula(1A)

In Formula (1A), $E_{101}$ to $E_{108}$ each independently represent $C(R_{12})$ or a nitrogen atom (N), provided that at least one of $E_{101}$ to $E_{108}$ is a nitrogen atom, where $R_{12}$ represents a hydrogen atom or a substituent; and $R_{11}$ represents a hydrogen atom or a substituent.

Examples of the substituent include alkyl groups (e.g., methyl, ethyl, propyl, isopropyl, tert-butyl, pentyl, hexyl, octyl, dodecyl, tridecyl, tetradecyl, and pentadecyl groups), cycloalkyl groups (e.g., cyclopentyl and cyclohexyl groups), alkenyl groups (e.g., vinyl and aryl groups), alkynyl groups (e.g., ethynyl and propargyl groups), aromatic hydrocarbon ring groups (also referred to as aromatic carbocyclic or aryl groups, e.g., phenyl, p-chlorophenyl, mesityl, tolyl, xylyl, naphthyl, anthryl, azulenyl, acenaphthenyl, fluorenyl, phenanthryl, indenyl, pyrenyl, and biphenylyl groups), aromatic heterocyclic groups (e.g., furyl, thienyl, pyridyl, pyridazinyl, pyrimidinyl, pyrazinyl, triazinyl, imidazolyl, pyrazolyl, thiazolyl, quinazolinyl, carbazolyl, carbolinyl, diazacarbazolyl(carbolinyl the carboline ring of which has one carbon atom of the ring replaced with a nitrogen atom), and phthalazinyl groups), heterocyclic groups (e.g., pyrrolidyl, imidazolidyl, morpholyl, and oxazolidyl groups), alkoxy groups (e.g., methoxy, ethoxy, propyloxy, pentyloxy, hexyloxy, octyloxy, and dodecyloxy groups), cycloalkoxy groups (e.g., cyclopentyloxy and cyclohexyloxy groups), aryloxy groups (e.g., phenoxy and naphthyloxy groups), alkylthio groups (e.g., methylthio, ethylthio, propylthio, pentylthio, hexylthio, octylthio, and dodecylthio groups), cycloalkylthio groups (e.g., cyclopentylthio and cyclohexylthio groups), arylthio groups (e.g., phenylthio and naphthylthio groups), alkoxycarbonyl groups (e.g., methyloxycarbonyl, ethyloxycarbonyl, butyloxycarbonyl, octyloxycarbonyl, and dodecyloxycarbonyl groups), aryloxycarbonyl groups (e.g., phenyloxycarbonyl and naphthyloxycarbonyl groups), sulfamoyl groups (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups), acyl groups (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups), acyloxy groups (e.g., acetyloxy, ethylcarbonyloxy, butylcarbonyloxy, octylcarbonyloxy, dodecylcarbonyloxy, and phenylcarbonyloxy groups), amido groups (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups), carbamoyl groups (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups), ureido groups (e.g., methylureido, ethylureido, pentylureido, cyclohexylureido, octylureido, dodecylureido, phenylureido, naphthylureido, and 2-pyridylaminoureido groups), sulfinyl groups (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups), alkylsulfonyl groups (e.g., methylsulfonyl, ethylsulfonyl, butylsulfonyl, cyclohexylsulfonyl, 2-ethylhexylsulfonyl, and dodecylsulfonyl groups), arylsulfonyl or heteroarylsulfonyl groups (e.g., phenylsulfonyl, naphthylsulfonyl, and 2-pyridylsulfonyl groups), amino groups (e.g., amino, ethylamino, dimethylamino, butylamino, cyclopentylamino, 2-ethylhexylamino, dodecylamino, anilino, naphthylamino, 2-pyridylamino, piperidyl (also referred to as piperidinyl), and 2,2,6,6-tetramethylpiperidinyl groups), halogen atoms (e.g., fluorine, chlorine, and bromine atoms), fluorohydrocarbon groups (e.g., fluoromethyl, trifluoromethyl, pentafluoroethyl, and pentafluorophenyl groups), a cyano group, a nitro group, a hydroxy group, a mercapto group, silyl groups (e.g., trimethylsilyl, triisopropylsilyl, triphenylsilyl, and phenyldiethylsilyl groups), phosphate groups (e.g., a dihexylphosphoryl group), phosphite groups (e.g., a diphenylphosphinyl group), and a phosphono group.

A part of these substituents may be further substituted by the substituents. Alternatively, two or more of these substituents may bind to one another to form a ring.

$E_{221}$ to $E_{229}$ and at least one of $E_{230}$ to $E_{238}$ each represent a nitrogen atom; and k21 and k22 each independently represent an integer of 0 to 4, provided that the sum of k21 and k22 is an integer of 2 or more.

In Formula (1B), examples of the arylene group represented by $Y_{21}$ include o-phenylene, p-phenylene, naphthalenediyl, anthracenediyl, naphthacenediyl, pyrenediyl, naphthylnaphthalenediyl, biphenyldiyl (e.g., [1,1'-biphenyl]-4,4'-diyl, 3,3'-biphenyldiyl, and 3,6-biphenyldiyl), terphenyldiyl, quaterphenyldiyl, quinquephenyldiyl, sexiphenyldiyl, septiphenyldiyl, octiphenyldiyl, nobiphenyldiyl, and deciphenyldiyl groups.

In Formula (1B), examples of the heteroarylene group represented by $Y_{21}$ include divalent groups derived from a ring selected from the group consisting of carbazole, carboline, diazacarbazole (also referred to as monoazacarboline, which is a ring structure including a carboline ring having a nitrogen atom substituted for one of carbon atoms of the ring), triazole, pyrrole, pyridine, pyrazine, quinoxaline, thiophene, oxadiazole, dibenzofuran, dibenzothiophene, and indole rings.

In preferred embodiments, the arylene group, the heteroarylene group, or the divalent linker being a combination thereof represented by $Y_{21}$ preferably includes a group derived from a condensed aromatic heterocycle of three or more rings in the heteroarylene group. The group derived from a condensed aromatic heterocycle of three or more rings is preferably a group derived from a dibenzofuran ring or a group derived from a dibenzothiophene ring.

In Formula (1B), when $R_{21}$ of $C(R_{21})$ represented by each of $E_{201}$ to $E_{216}$ and $E_{221}$ to $E_{238}$ is a substituent, examples of the substituent are the same as those exemplified for $R_{11}$ or $R_{12}$ in Formula (1A).

In Formula (1B), at least six of $E_{201}$ to $E_{208}$ and at least six of $E_{209}$ to $E_{216}$ each preferably represent $C(R_{21})$.

In Formula (1B), at least one of $E_{225}$ to $E_{229}$ and at least one of $E_{234}$ to $E_{238}$ each preferably represent —N═.

In Formula (1B), any one of $E_{225}$ to $E_{229}$ and any one of $E_{234}$ to $E_{238}$ each preferably represent a nitrogen atom.

[Chem. 3]

Formula(1B)

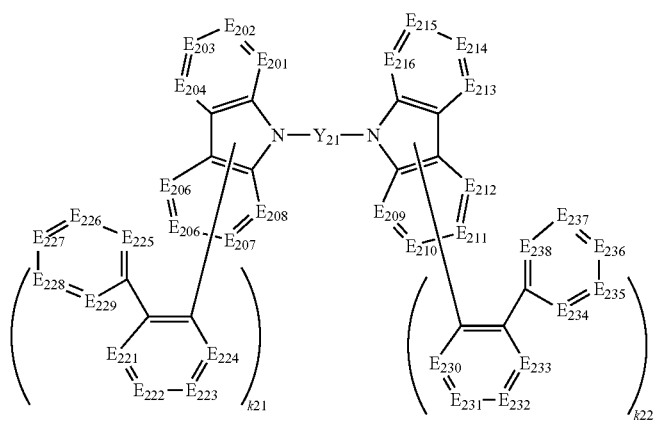

Formula (1B) can be regarded as one modification of Formula (1A). In Formula (1B), $Y_{21}$ represents an arylene group, a heteroarylene group, or a divalent linker being a combination thereof; $E_{201}$ to $E_{216}$ and $E_{221}$ to $E_{238}$ each independently represent $C(R_{21})$ or a nitrogen atom, where $R_{21}$ represents a hydrogen atom or a substituent, provided that at least one of In Formula (1B), $E_{221}$ to $E_{224}$ and $E_{230}$ to $E_{233}$ each preferably represent $C(R_{21})$.

In compounds represented by Formula (1B), $E_{203}$ preferably represents $C(R_{21})$, where $R_{21}$ represents a link site. More preferably, $E_{203}$ and $E_{211}$ each represent $C(R_{21})$, where $R_{21}$ represents a link site.

In addition, $E_{225}$ and $E_{234}$ each preferably represent a nitrogen atom, and $E_{221}$ to $E_{224}$ and $E_{230}$ to $E_{233}$ each preferably represent $C(R_{21})$.

[Chem. 4]

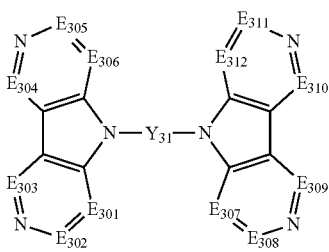

Formula(1C)

Formula (1C) can be regarded as one modification of Formula (1A). In Formula (1C), $E_{301}$ to $E_{312}$ each represent $C(R_K)$, where $R_{31}$ represents a hydrogen atom or a substituent; and $Y_{31}$ represents an arylene group, a heteroarylene group, or a divalent linker being a combination thereof.

In Formula (1C), when $R_{31}$ of $C(R_{31})$ represented by each of $E_{301}$ to $E_{312}$ is a substituent, examples of the substituent are the same as those exemplified for $R_{11}$ or $R_{12}$ in Formula (1A).

In preferred embodiments of Formula (1C), examples of the arylene group, the heteroarylene group, and the divalent linker being a combination thereof represented by $Y_{31}$ are the same as those exemplified for $Y_{21}$ in Formula (1B).

[Chem. 5]

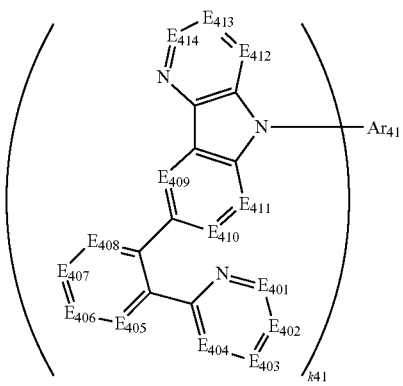

Formula(1D)

Formula (1D) can be regarded as one modification of Formula (1A). In Formula (1D), $E_{401}$ to $E_{414}$ each represent $C(R_{41})$, where $R_{41}$ represents a hydrogen atom or a substituent; $Ar_{41}$ represents a substituted or unsubstituted aromatic hydrocarbon ring or aromatic heterocycle; and k41 represents an integer of 3 or more.

In Formula (1D), when $R_{41}$ of $C(R_{41})$ represented by each of $E_{401}$ to $E_{414}$ is a substituent, examples of the substituent are the same as those exemplified for $R_{11}$ or $R_{12}$ in Formula (1A).

In Formula (1D), when $Ar_{41}$ represents an aromatic hydrocarbon ring, examples of the aromatic hydrocarbon ring include benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthranthrene rings. These rings may include substituents exemplified for $R_{11}$ or $R_{12}$ in Formula (1A).

In Formula (1D), when $Ar_{41}$ represents an aromatic heterocycle, examples of the aromatic heterocycle include furan, thiophene, oxazole, pyrrole, pyridine, pyridazine, pyrimidine, pyrazine, triazine, benzimidazole, oxadiazole, triazole, imidazole, pyrazole, thiazole, indole, benzimidazole, benzothiazole, benzoxazole, quinoxaline, quinazoline, phthalozine, carbazole, and azacarbazole rings. The azacarbazole ring refers to a carbazole ring the benzene ring of which has at least one carbon atom of the ring replaced with a nitrogen atom. These rings may include substituents exemplified for $R_{11}$ or $R_{12}$ in Formula (1A).

[Chem. 6]

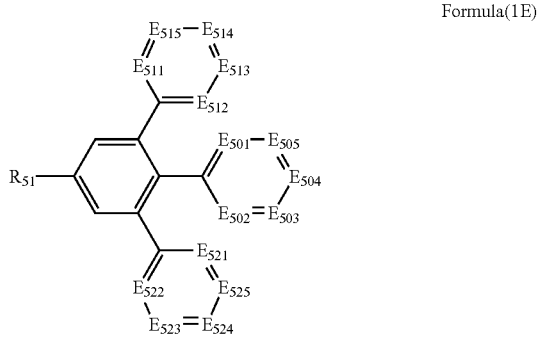

Formula(1E)

In Formula (1E), at least one of $E_{501}$ and $E_{502}$ represents a nitrogen atom; at least one of $E_{511}$ to $E_{515}$ represents a nitrogen atom; at least one of $E_{521}$ to $E_{525}$ represents a nitrogen atom; and $R_{51}$ represents a substituent.

In Formula (1E), when $R_{51}$ represents a substituent, examples of the substituent are the same as those exemplified for $R_{11}$ or $R_{12}$ in Formula (1A).

[Chem. 7]

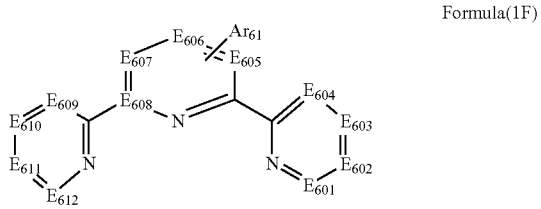

Formula(1F)

In Formula (1F), $E_{601}$ to $E_{612}$ each independently represent $C(R_{61})$ or a nitrogen atom, where $R_{61}$ represents a hydrogen atom or a substituent; and $Ar_{61}$ represents a substituted or unsubstituted aromatic hydrocarbon ring or aromatic heterocycle.

In Formula (1F), when $R_{61}$ of $C(R_{61})$ represented by each of $E_{601}$ to $E_{612}$ is a substituent, examples of the substituent are the same as those exemplified for $R_{11}$ or $R_{12}$ in Formula (1A).

In Formula (1F), examples of the substituted or unsubstituted aromatic hydrocarbon ring or aromatic heterocycle represented by $Ar_{61}$ are the same as those exemplified for $Ar_{41}$ in Formula (1D).

[Examples of Heteroaromatic Compound Contained in Intermediate Layer 1a]

Examples of the heteroaromatic compound, contained in the intermediate layer 1a according to the present invention, containing a nitrogen atom having an unshared electron pair that is not involved in aromaticity are shown below as compounds No. 1 to No. 37, which are examples of the compounds represented by Formulae (1A) to (1F).
[Chem. 8]
No. 1
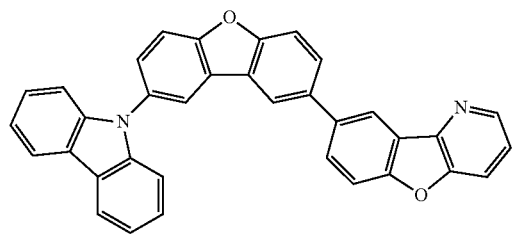
No. 2
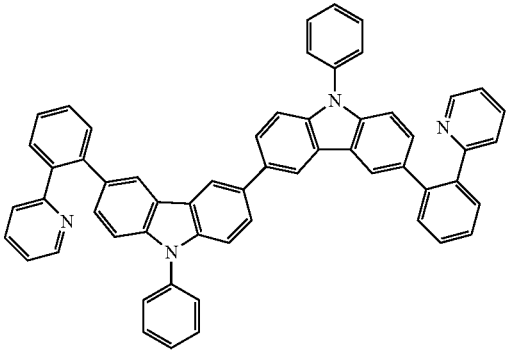
No. 3
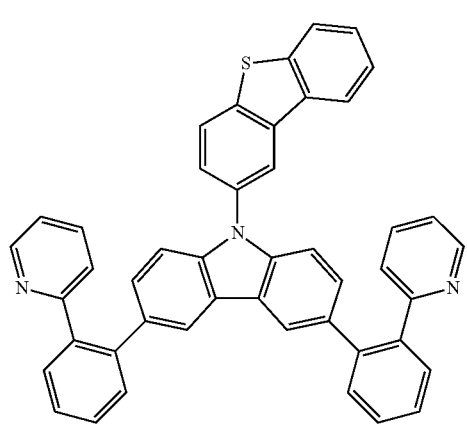
No. 4
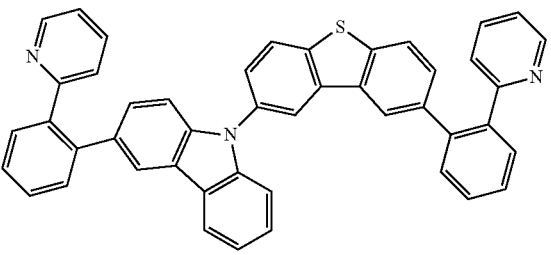
No. 5
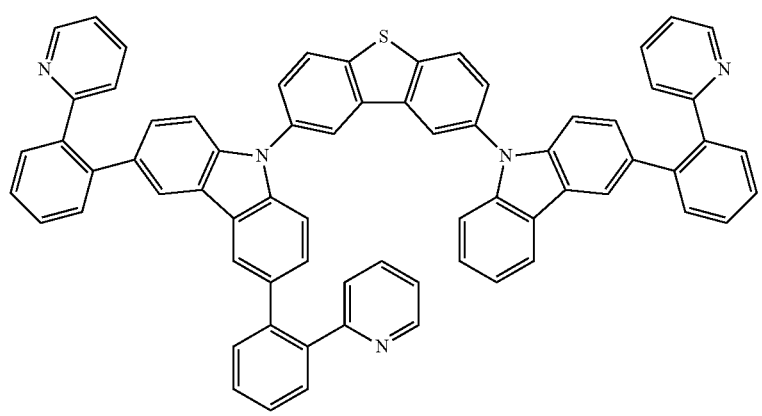

-continued
No. 6
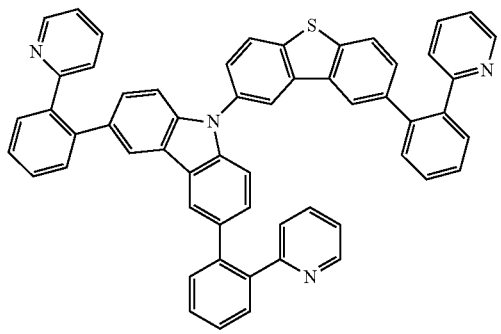
No. 7
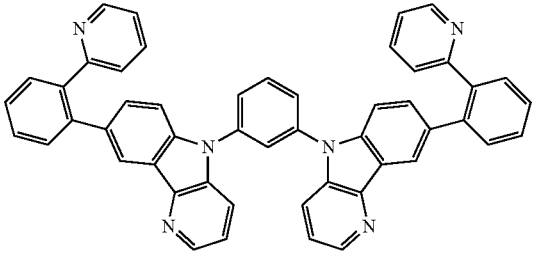
[Chem. 9]
No. 8
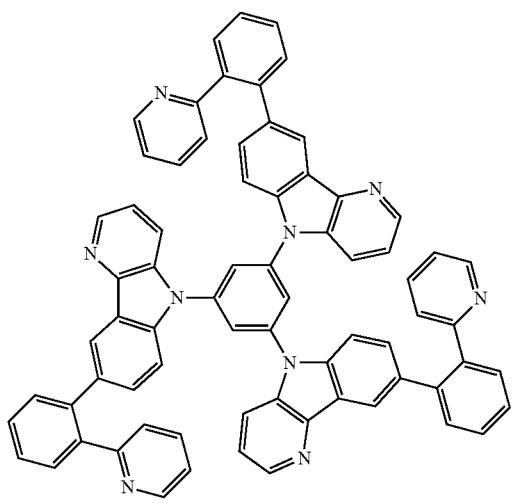
No. 9
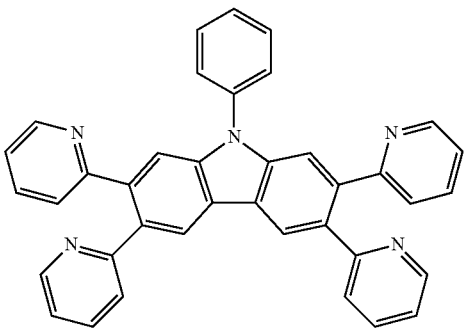
No. 10
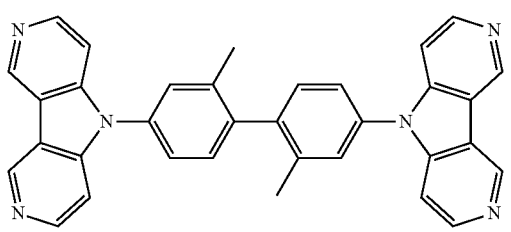
No. 11
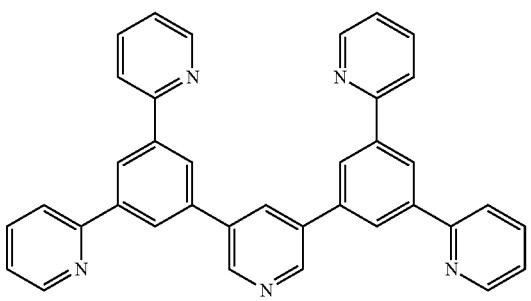
No. 12
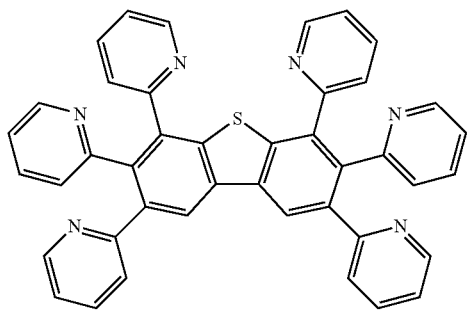
No. 13
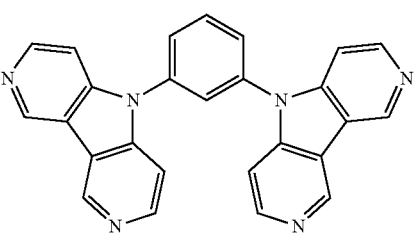

-continued
No. 14
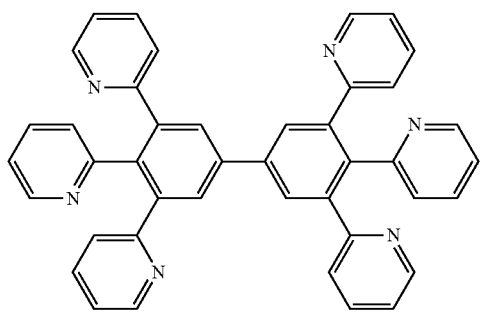
No. 15
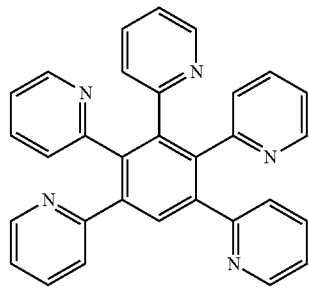
No. 16
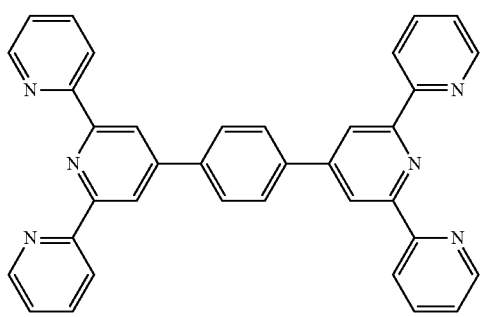
[Chem. 10]
No. 17
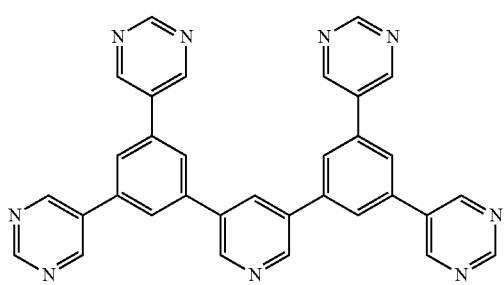
No. 18
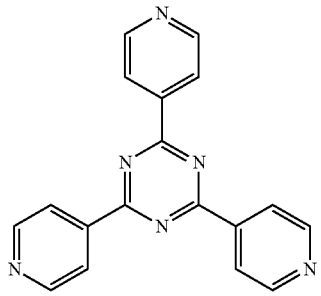
No. 19
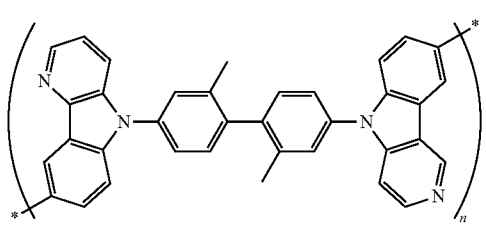
No. 20
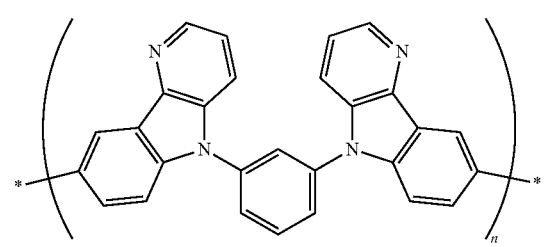
No. 21
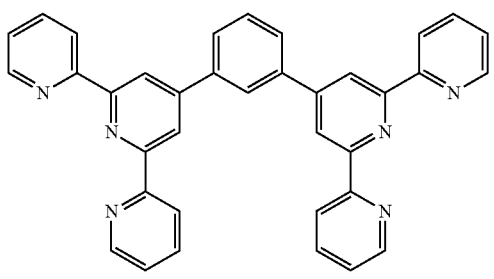
No. 22
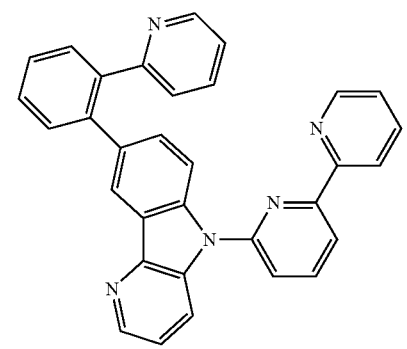

-continued
No. 23
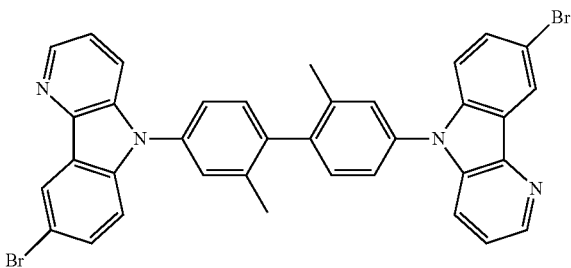
No. 24
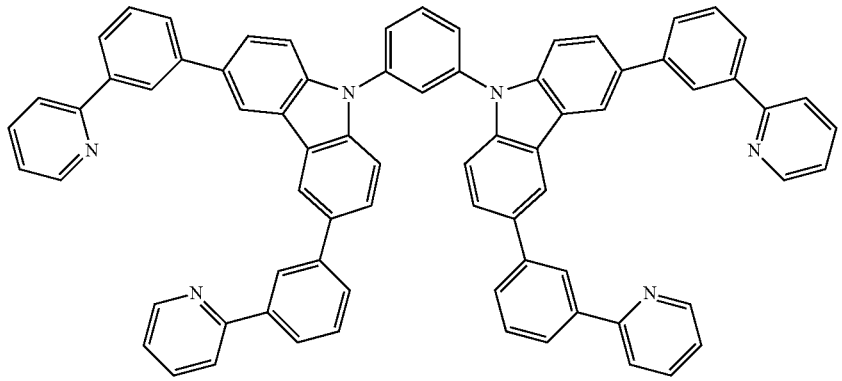
No. 25
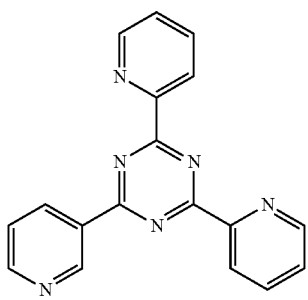
[Chem. 11]
No. 26
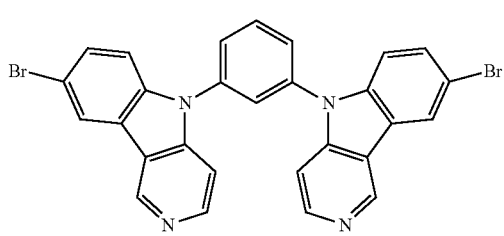
No. 27
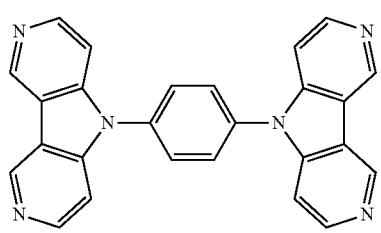
No. 28
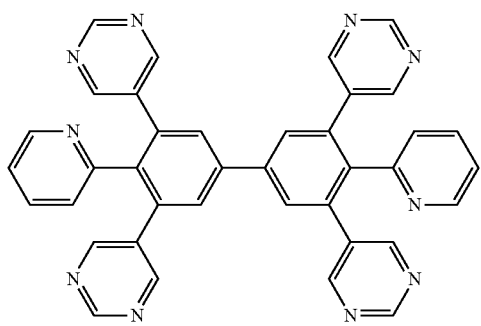
No. 29
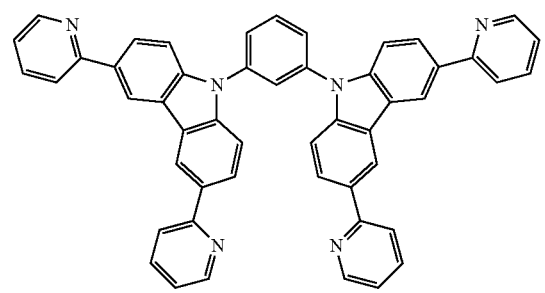

No. 30
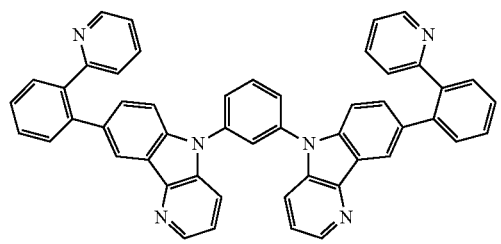
No. 31
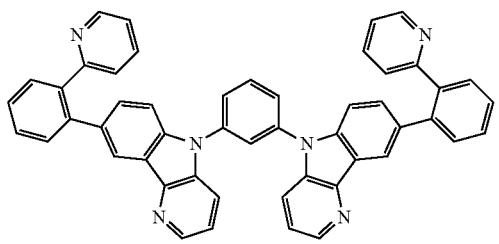
No. 32
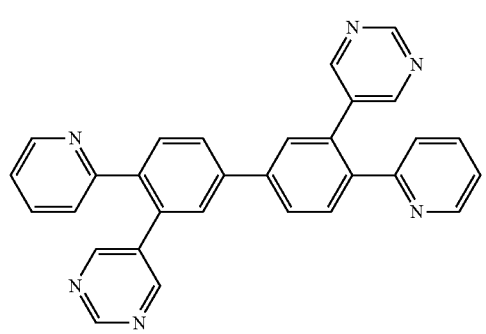
No. 33
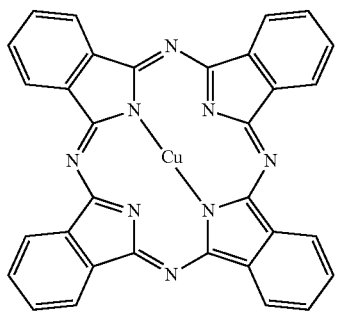
No. 34
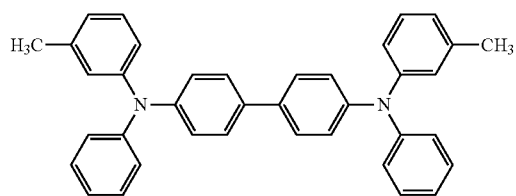
No. 35
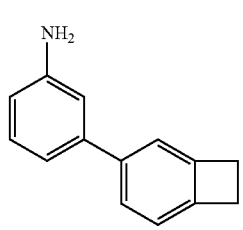
[Chem. 12]
No. 36
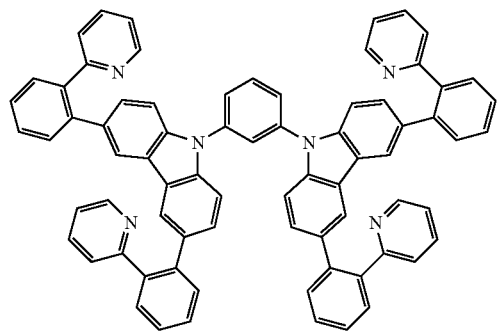
No. 37
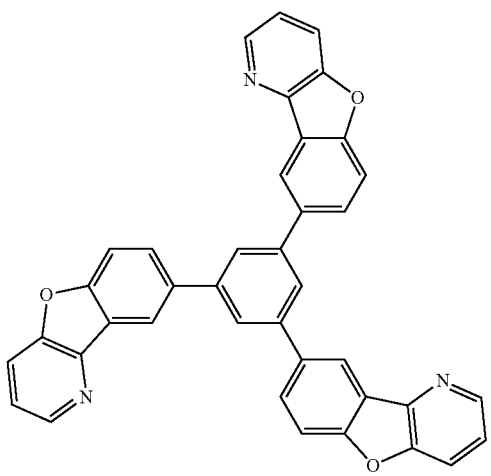
Nonlimiting examples of the heteroaromatic compound containing a nitrogen atom having an unshared electron pair that is not involved in aromaticity, contained in the intermediate layer 1a according to the present invention, other than the compounds represented by Formulae (1A) to (1F) are shown below:

[Chem. 13]
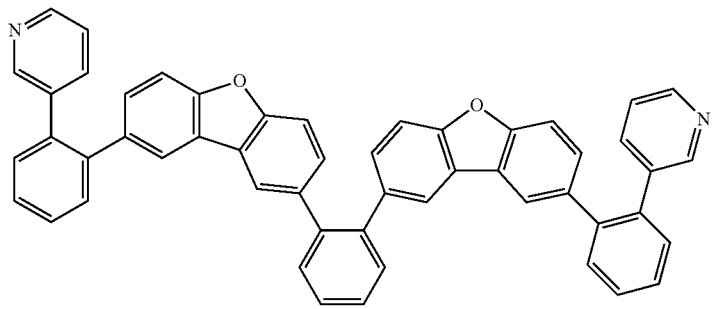
1
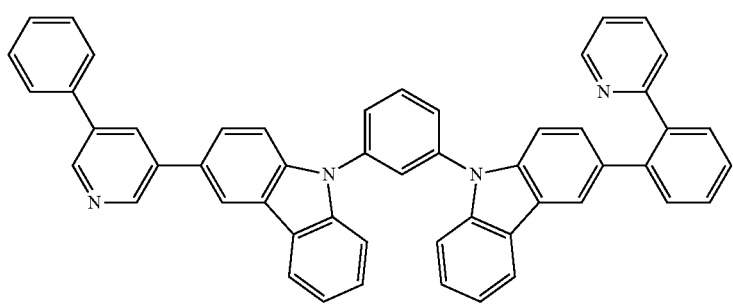
2
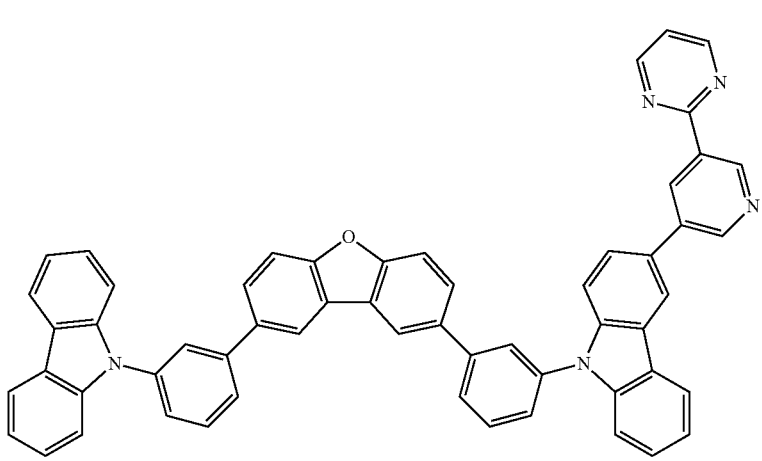
3
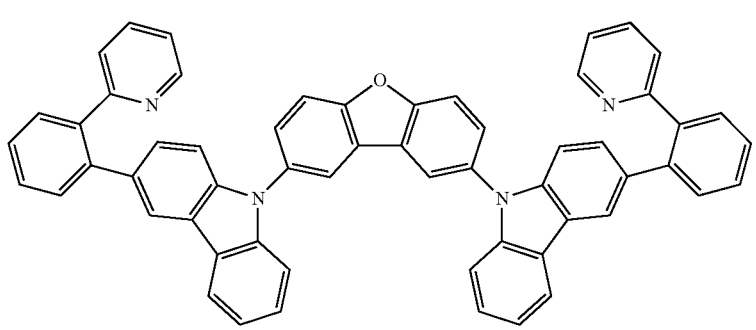
4

-continued
5
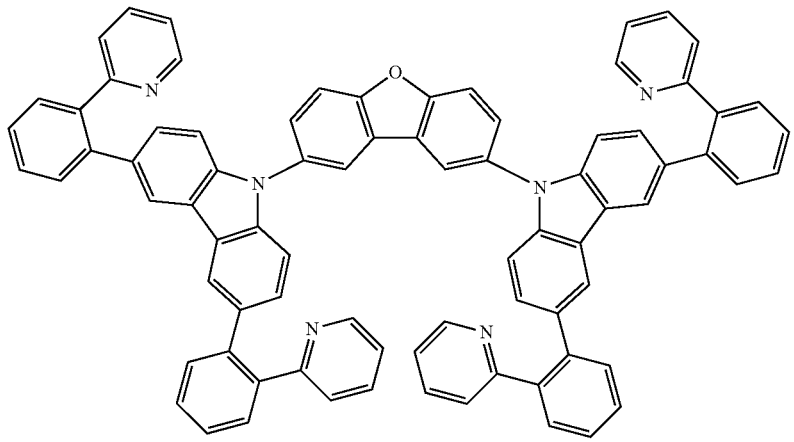
6
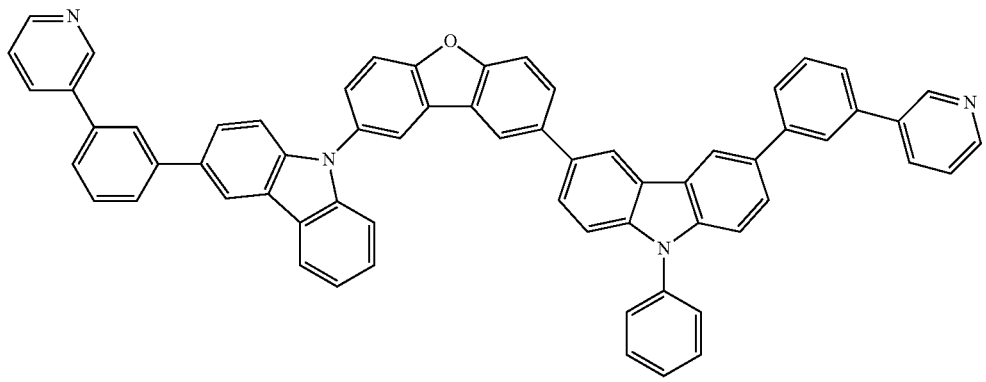
7
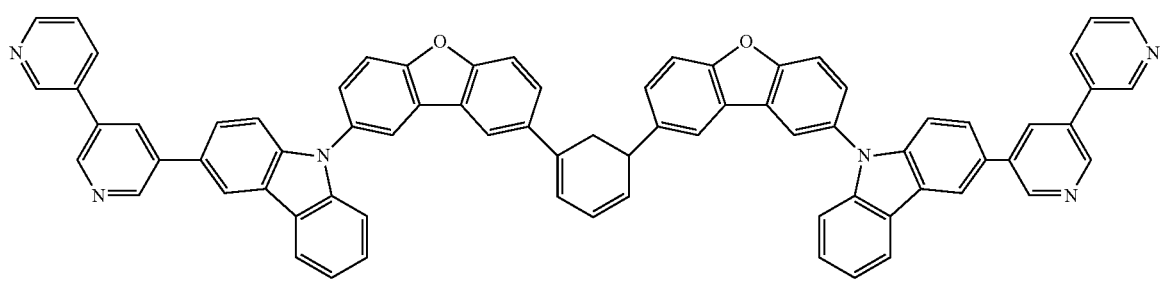
8
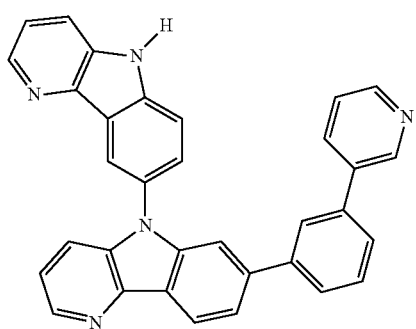
9
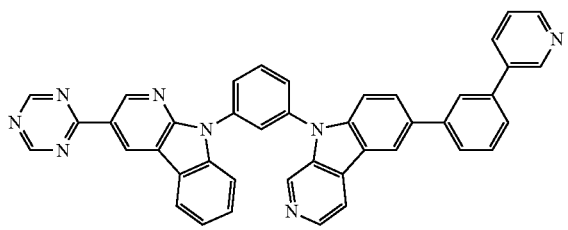

[Chem. 15]
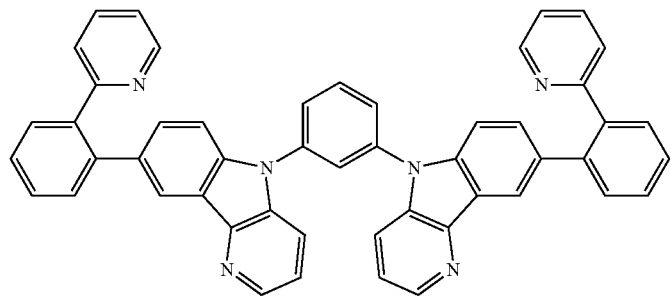
10
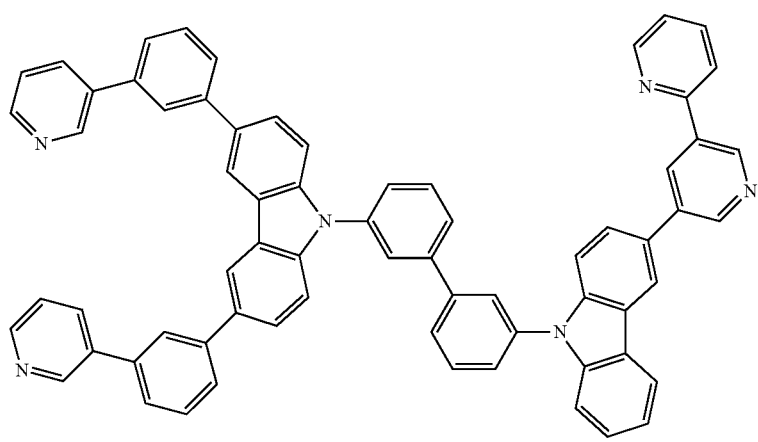
11
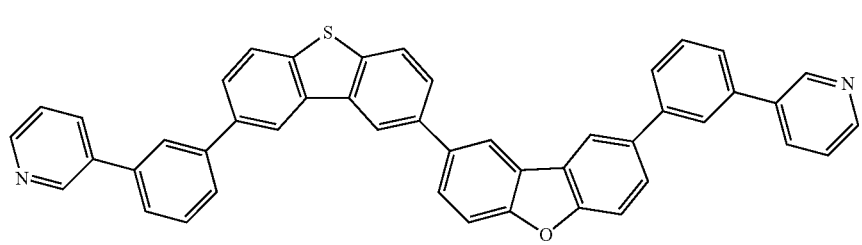
12
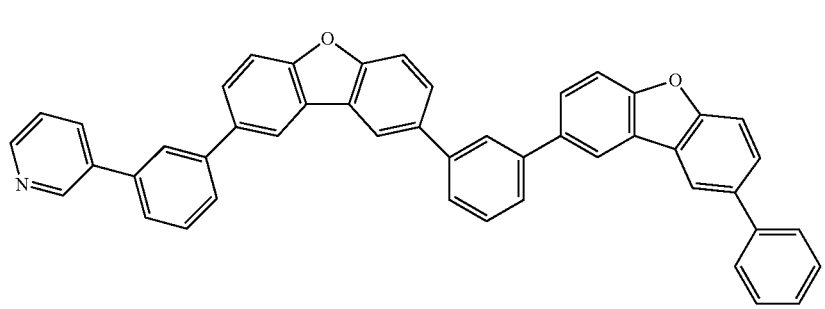
13

-continued
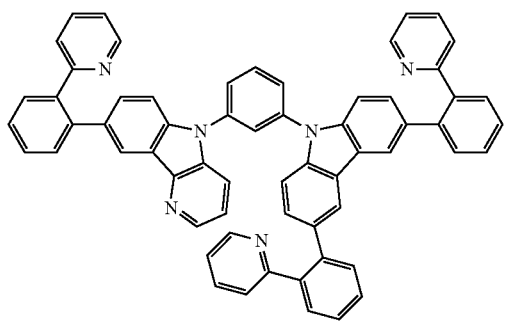
14
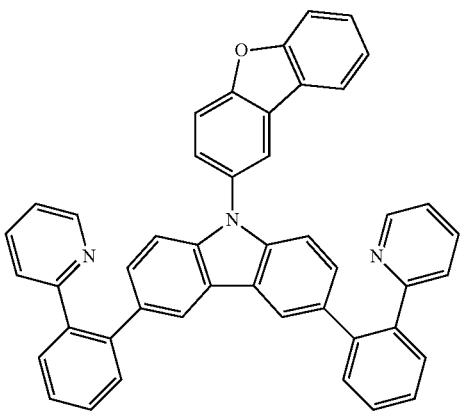
15
[Chem. 16]
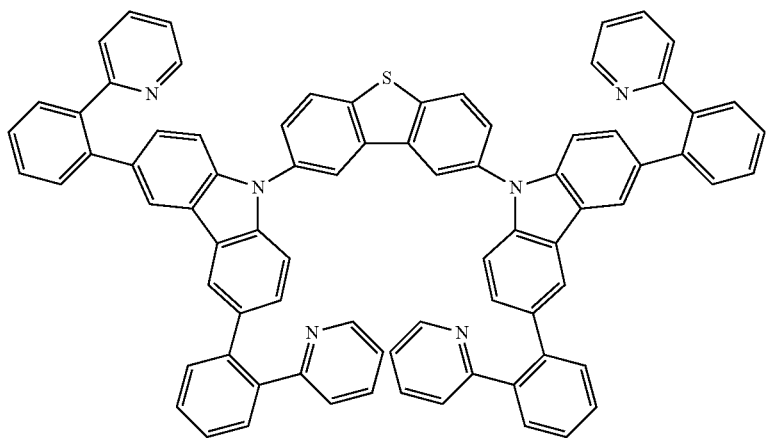
16
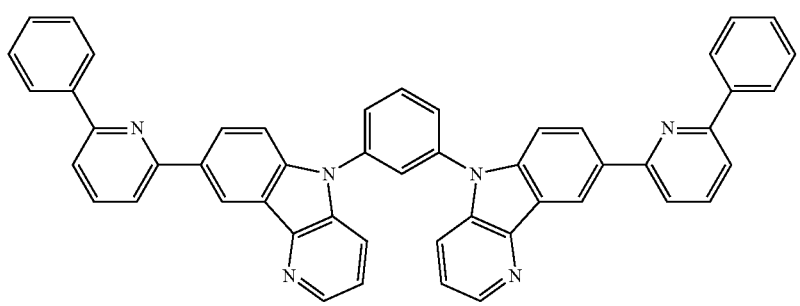
17

-continued
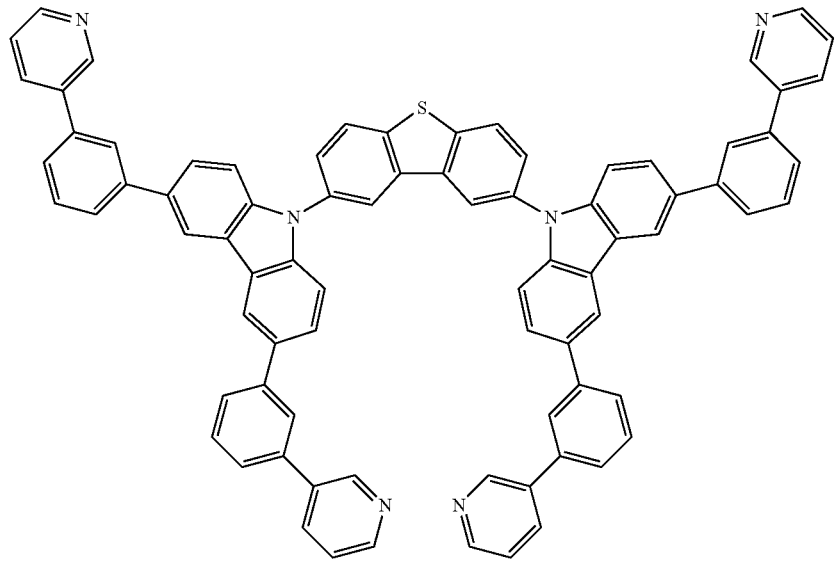
18
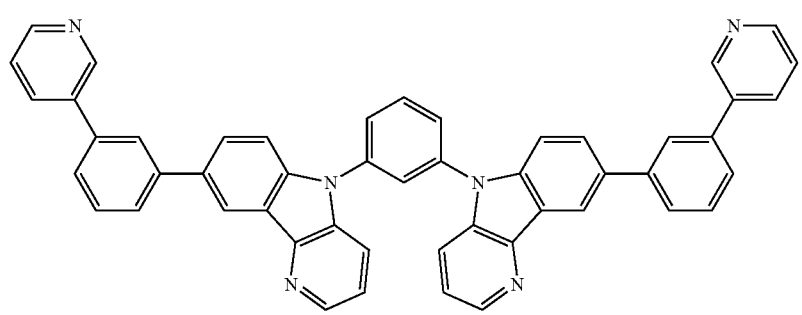
19
[Chem. 17]
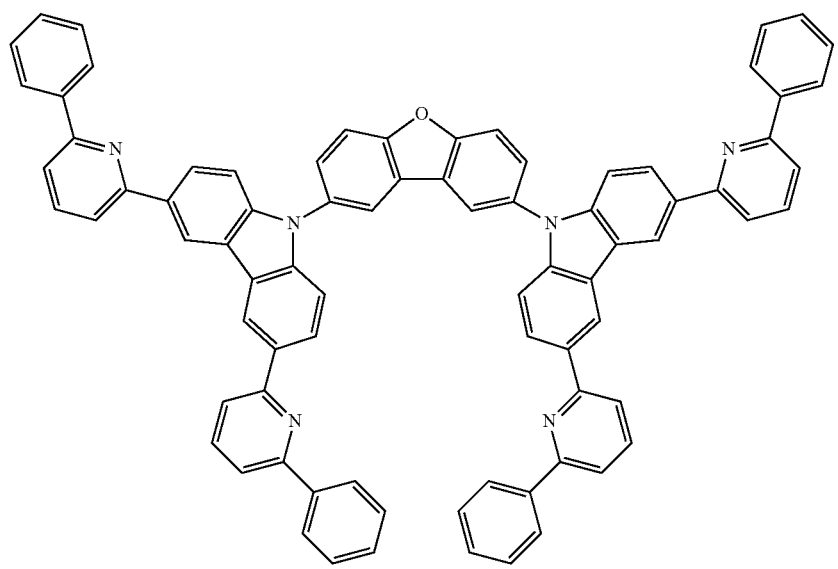
20

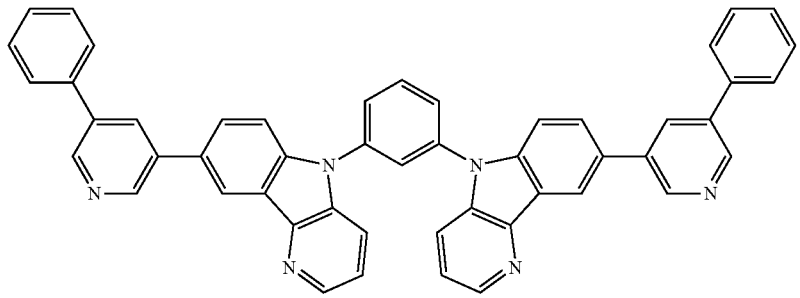
21
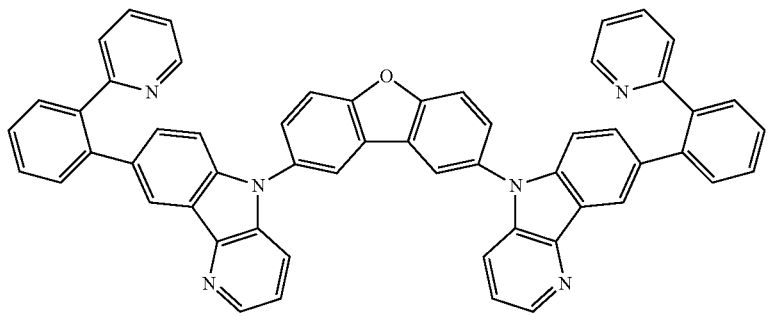
22
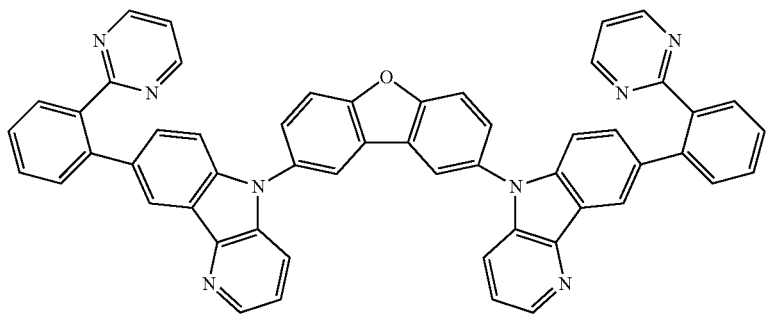
23
[Chem. 18]
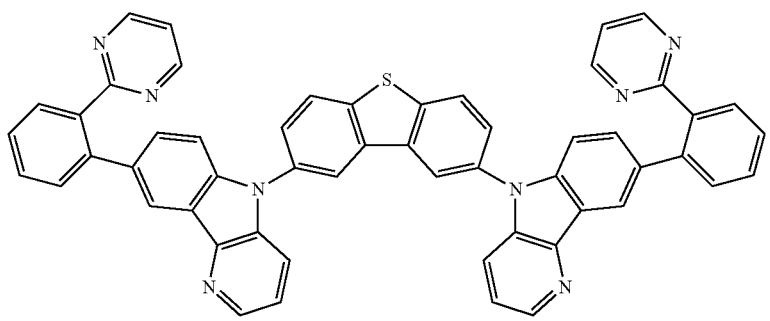
24
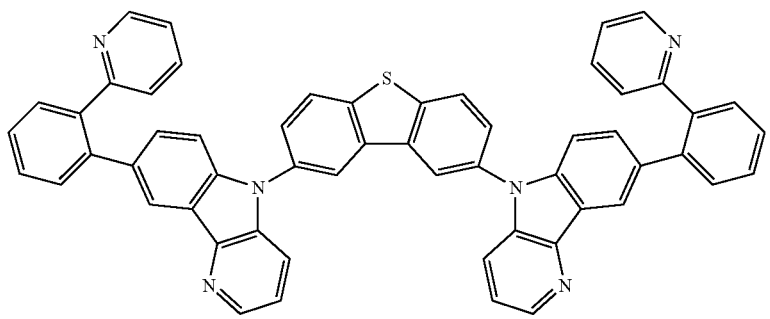
25

-continued
26
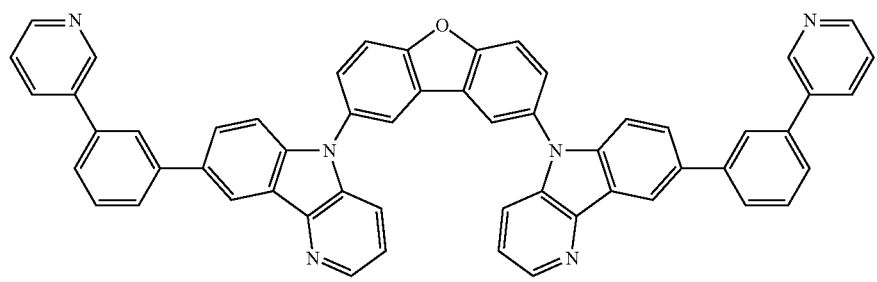
27
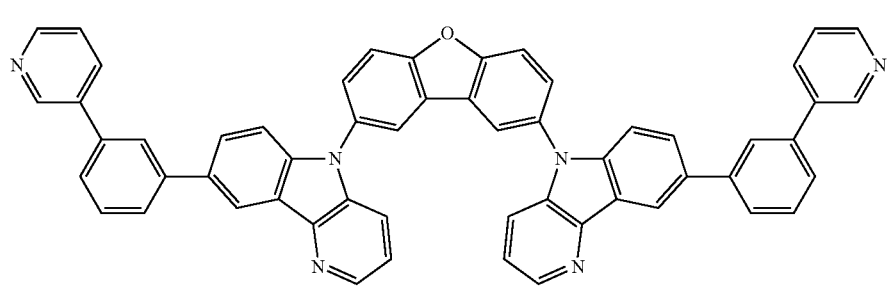
28
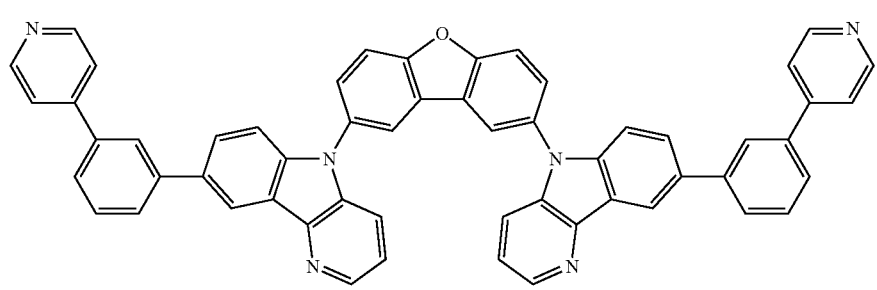
29
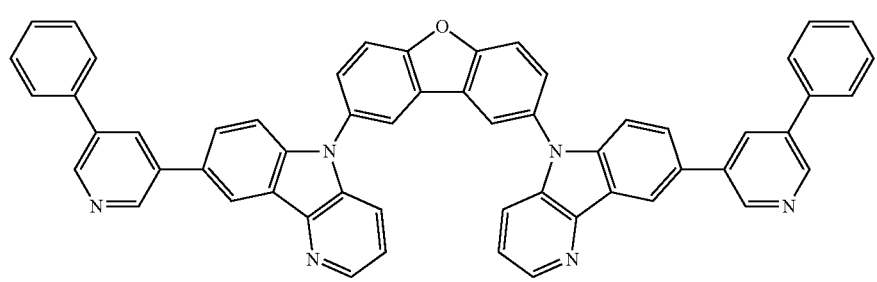
[Chem. 19]
30
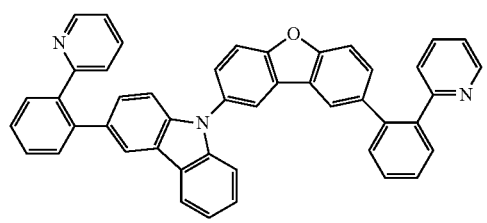
31
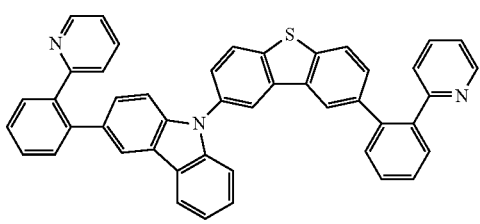

-continued
32
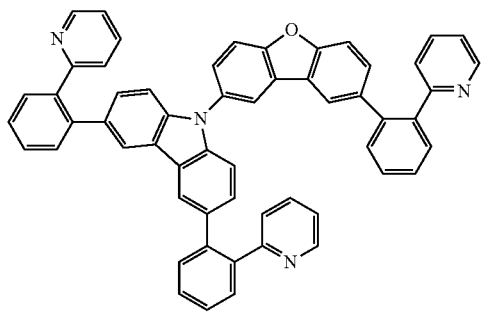
33
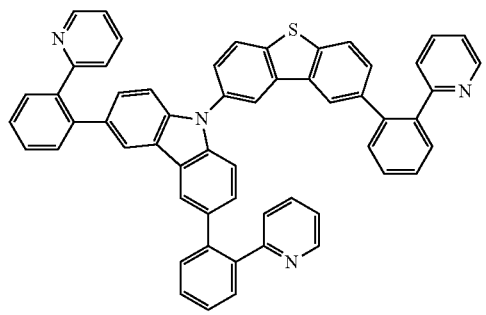
34
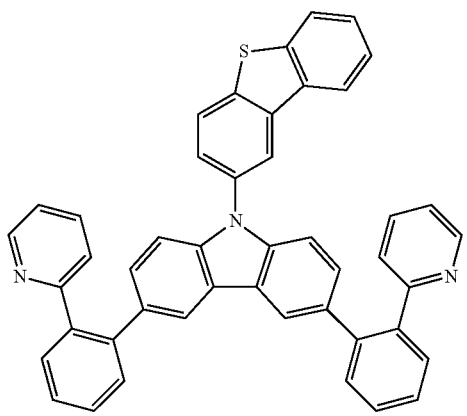
35
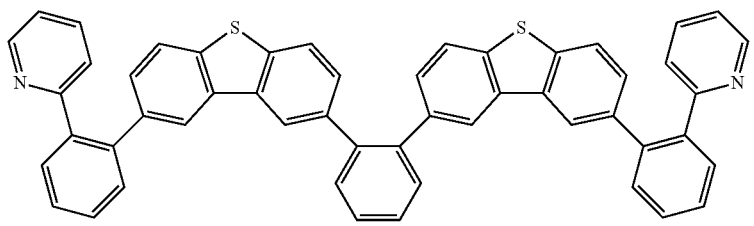
36
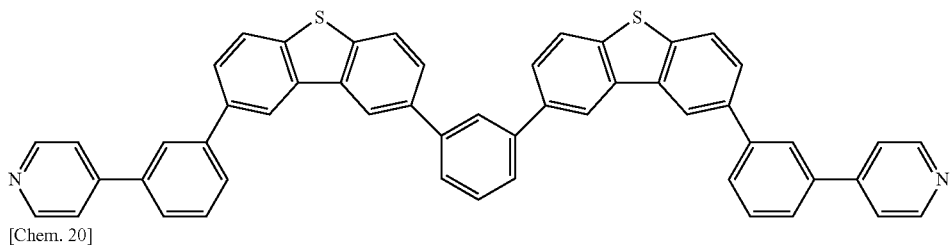
[Chem. 20]
37
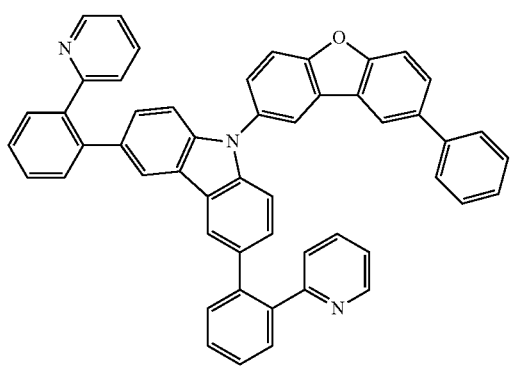
38
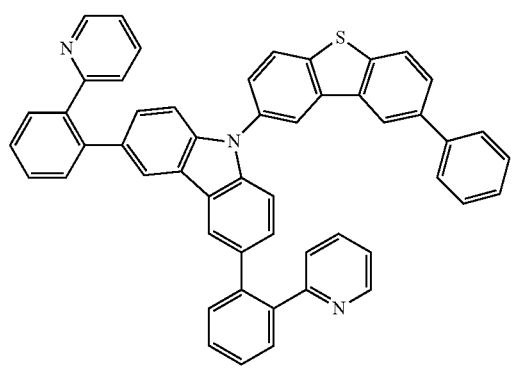

39
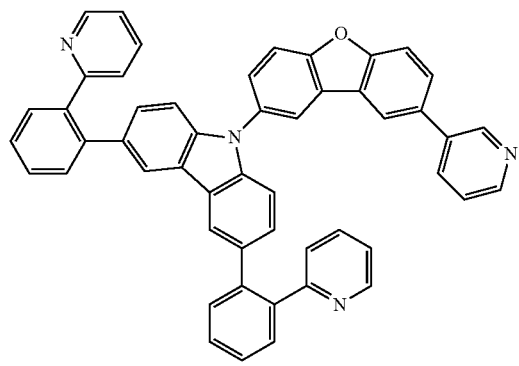
40
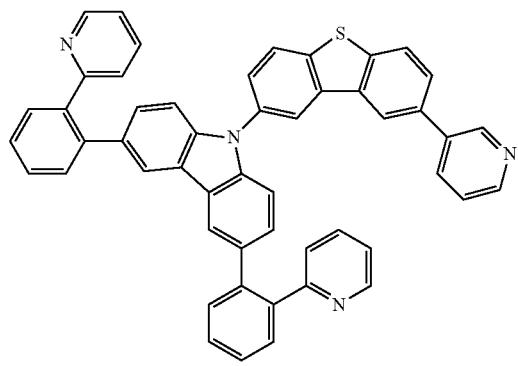
41
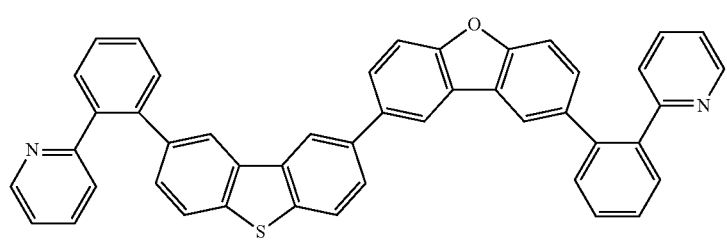
42
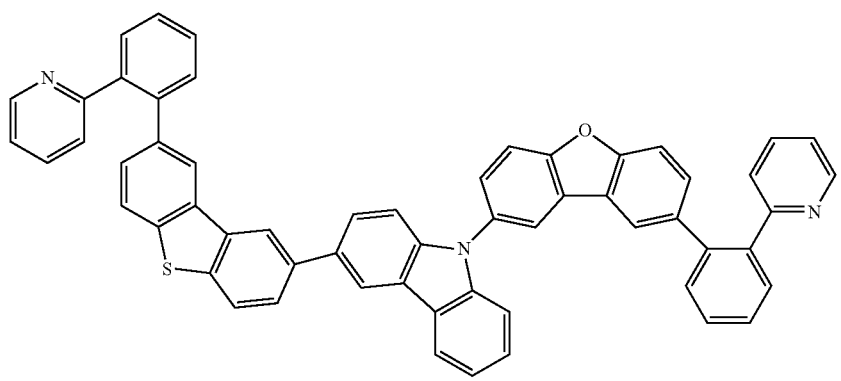
[Chem. 21]
43
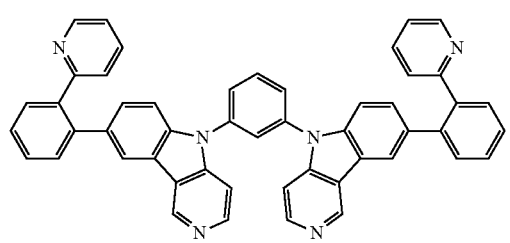
44
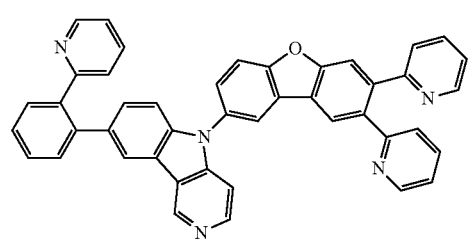

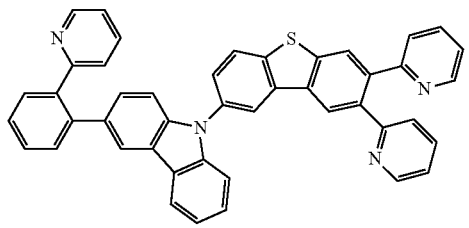
45
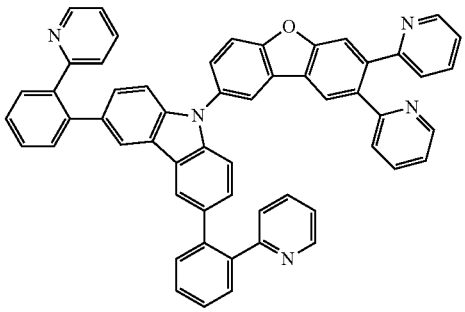
46
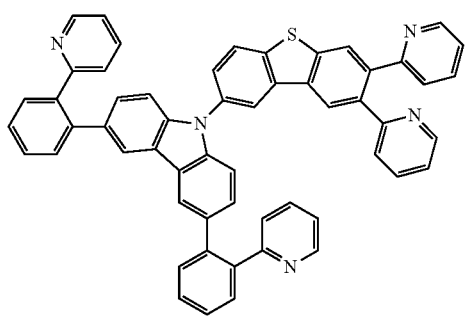
[Chem. 22]
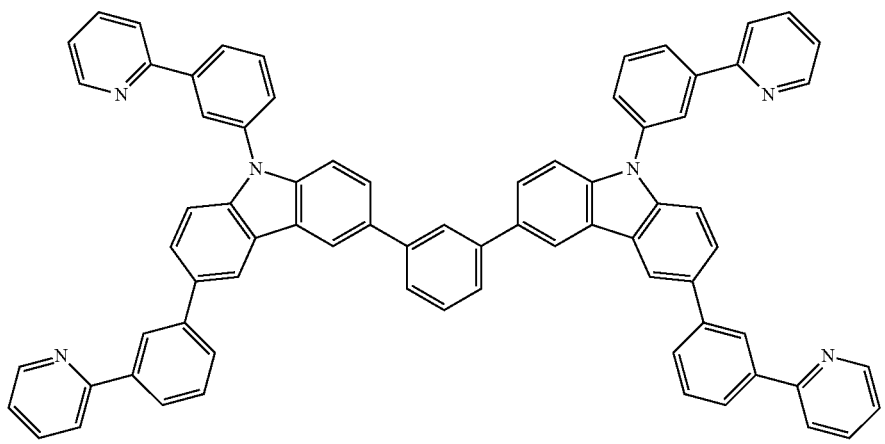
48
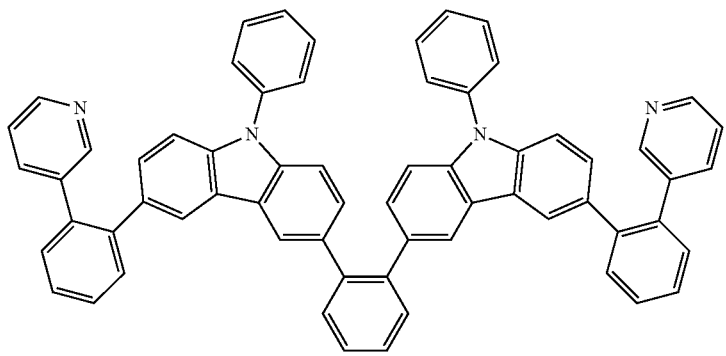
49

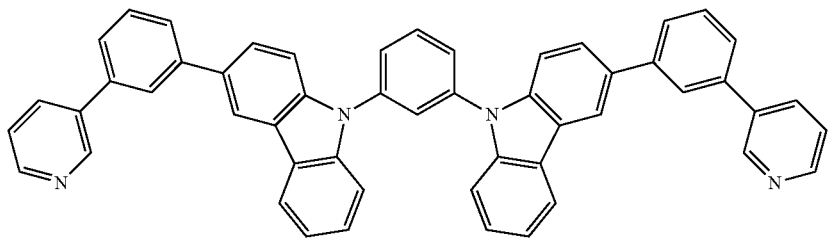
50
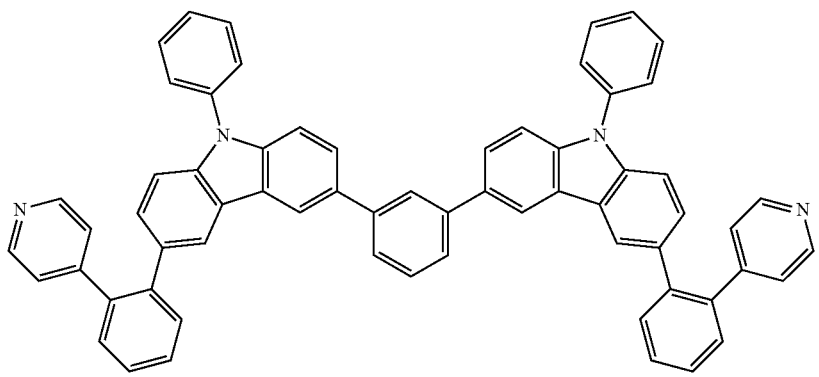
51
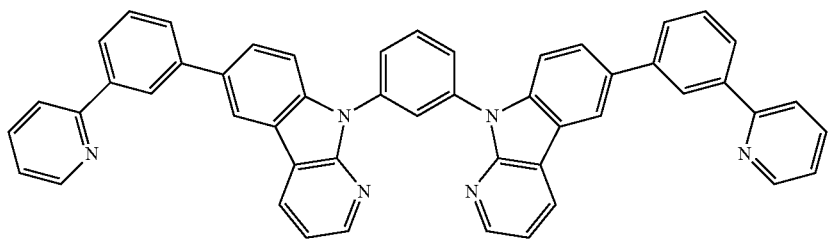
52
[Chem. 23]
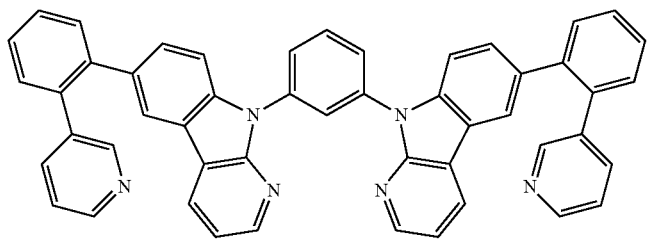
53
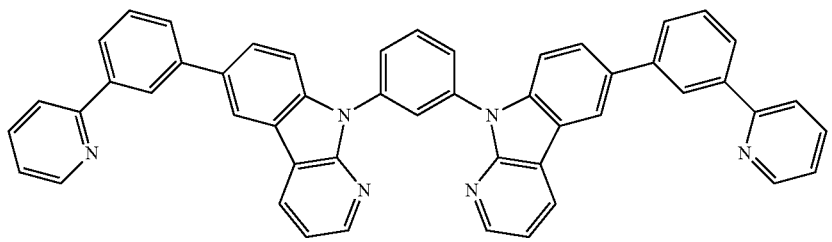
54
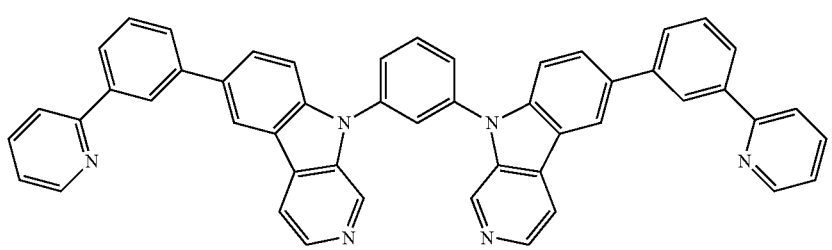
55

56
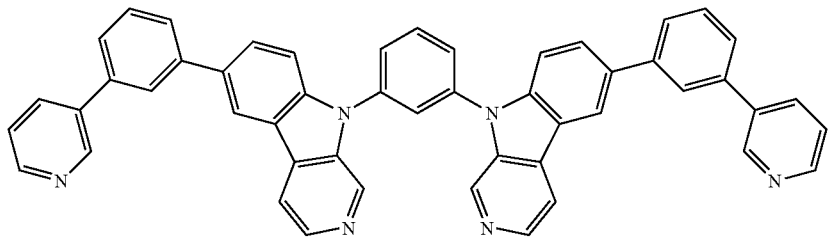
57
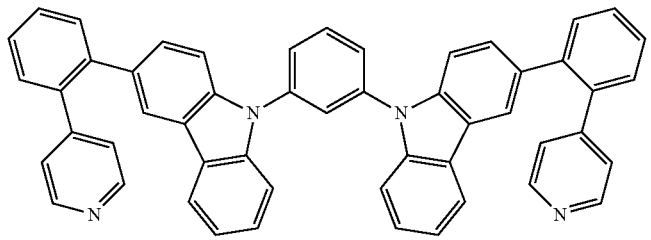
[Chem. 24]
59
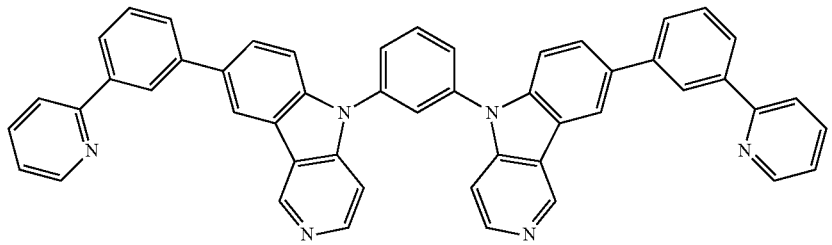
60
61
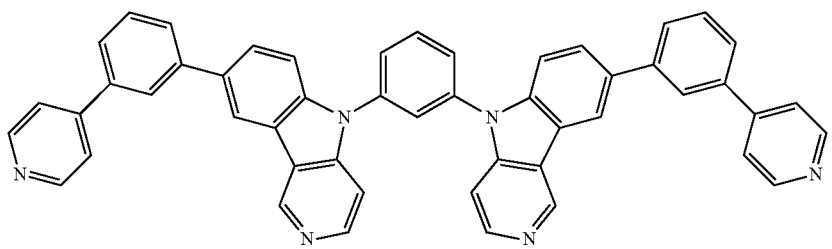
62
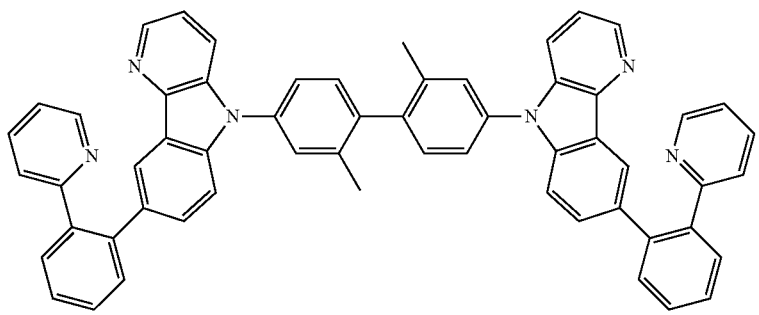
58
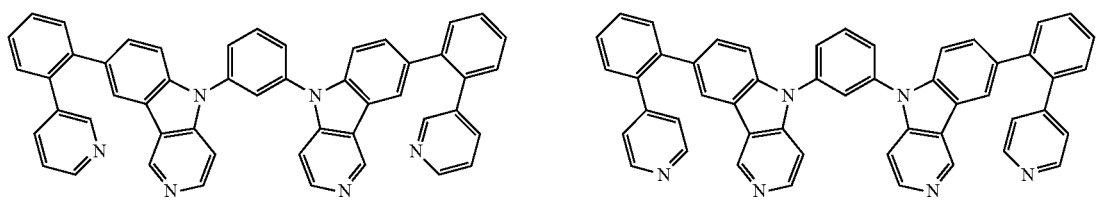

63
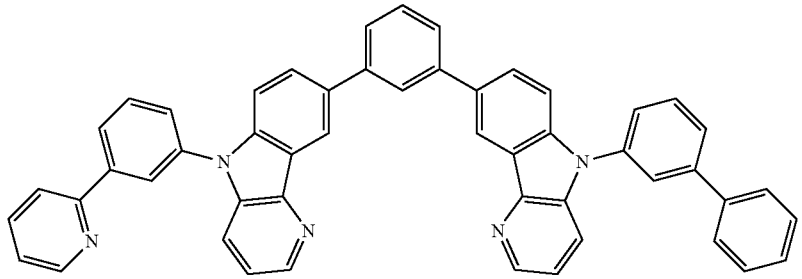
64
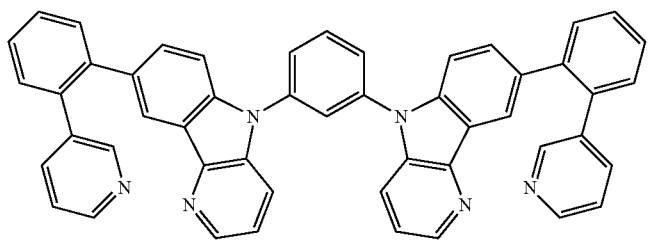
[Chem. 25]
65
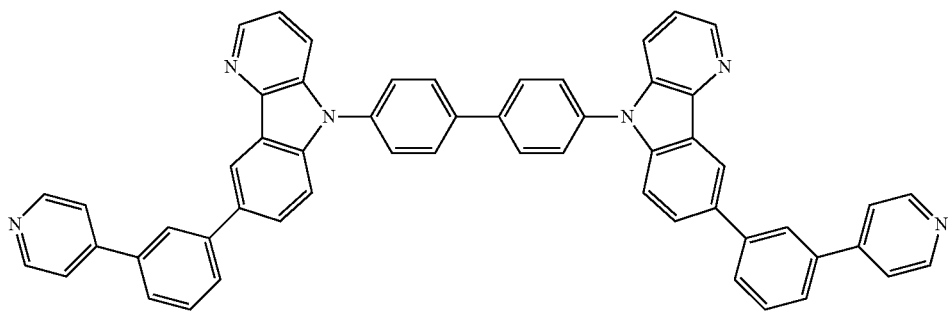
66
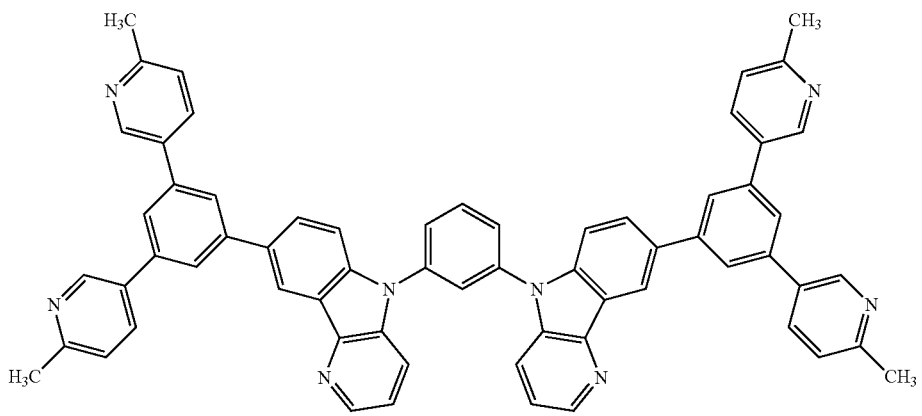

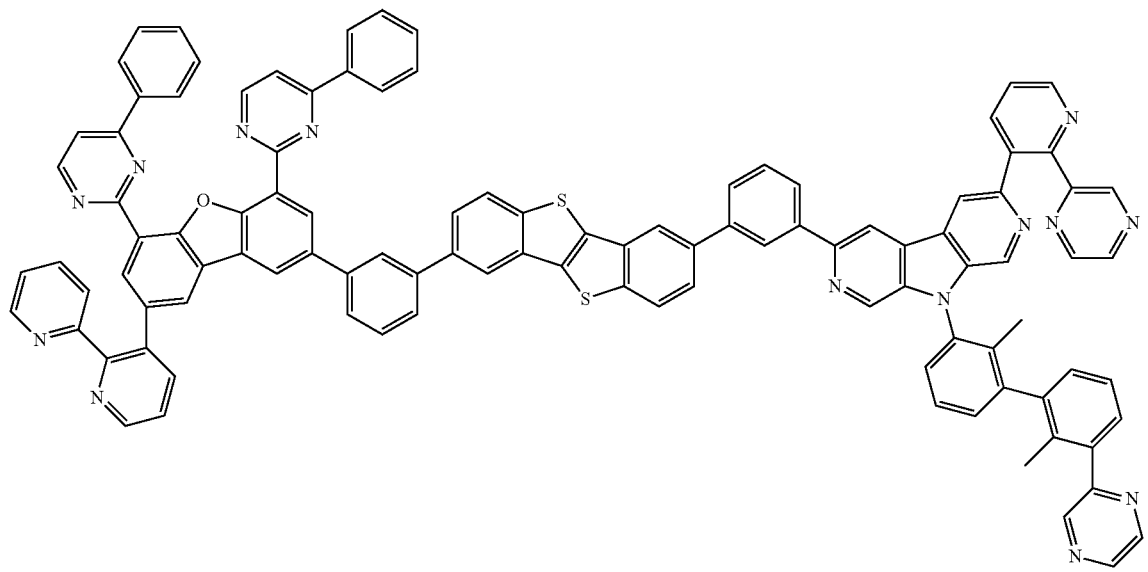
[Chem. 26]
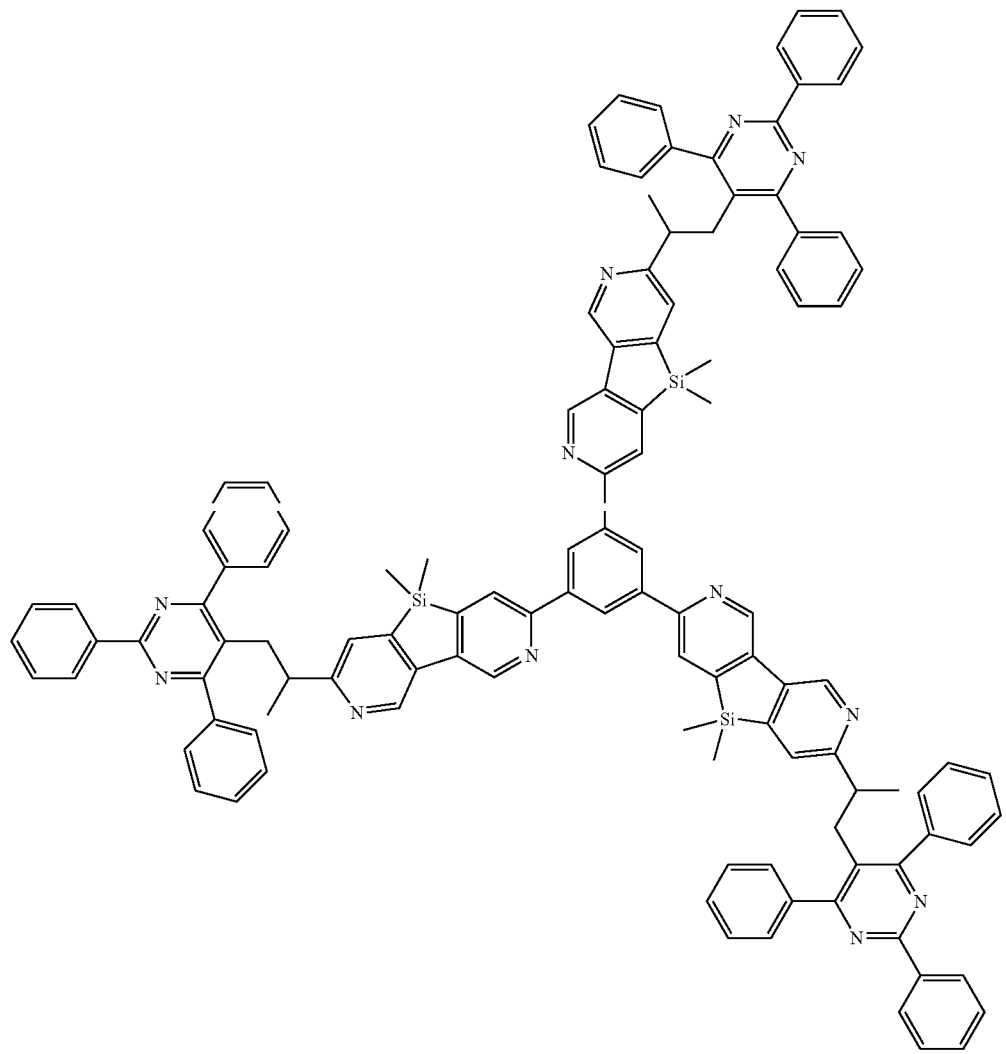

69
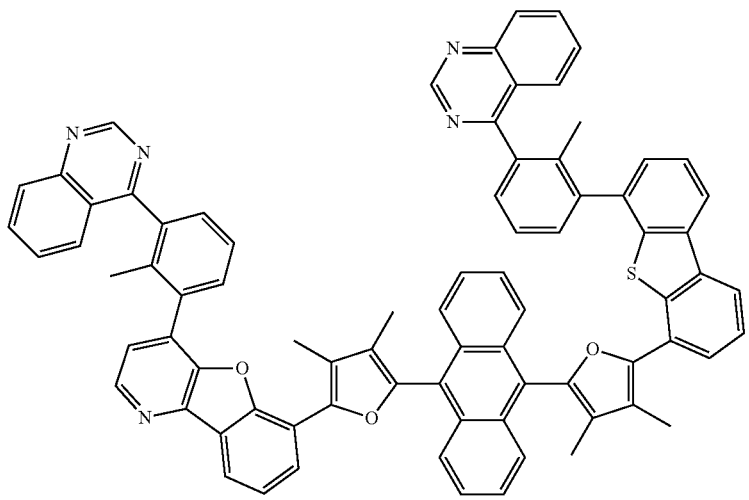
[Chem. 27]
70
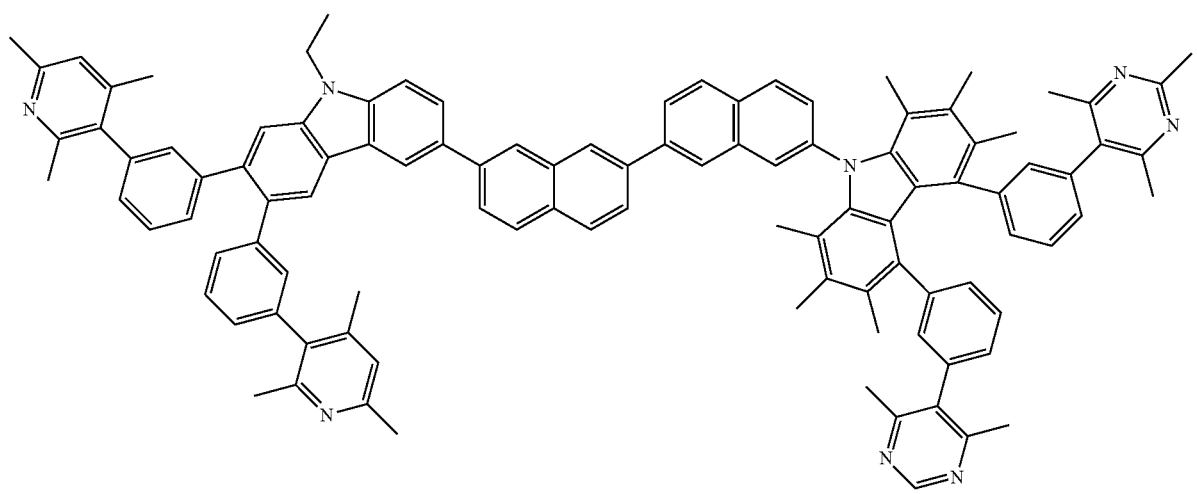
71
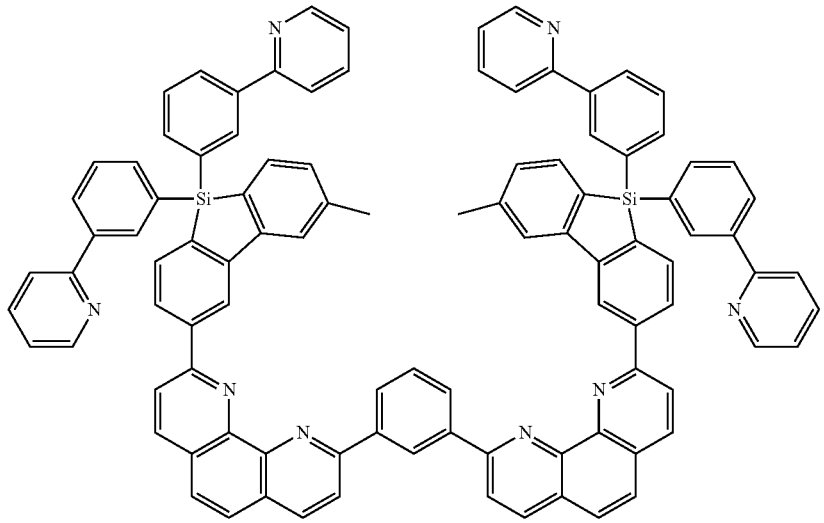

-continued
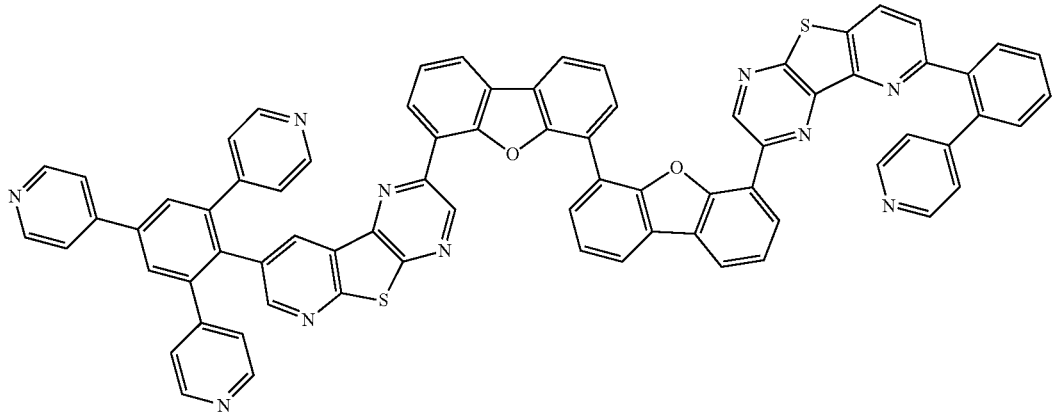
72
[Chem. 28]
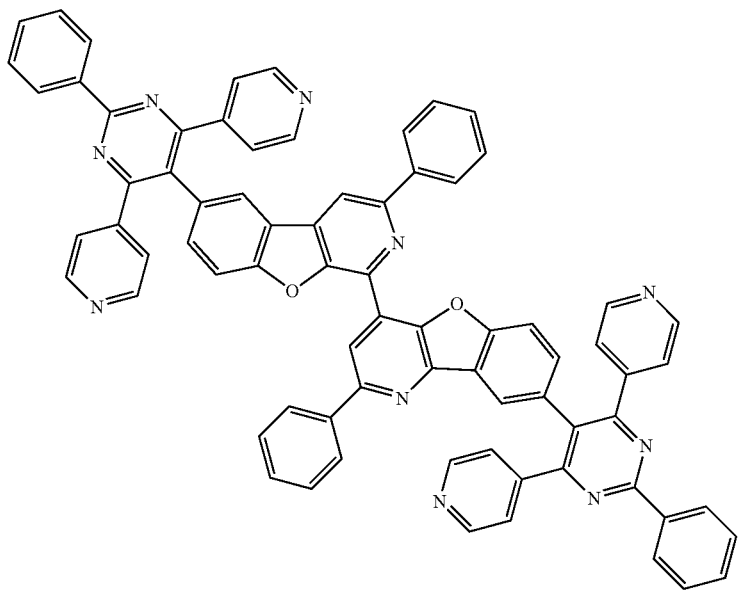
73
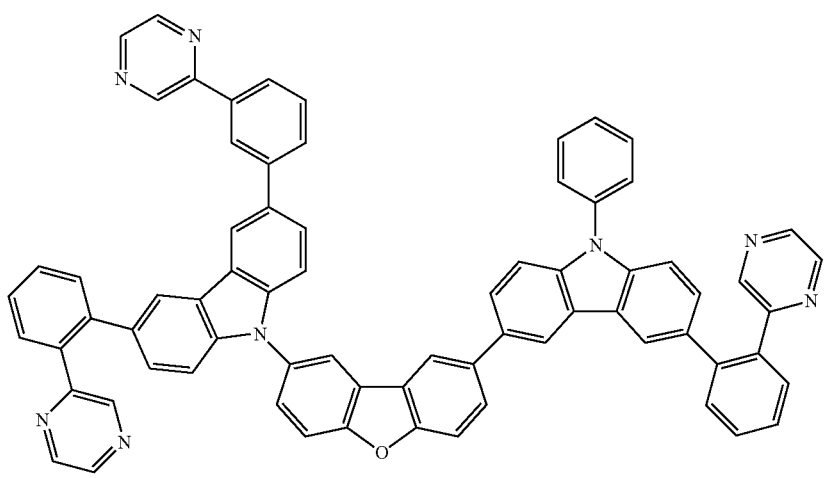
74

-continued
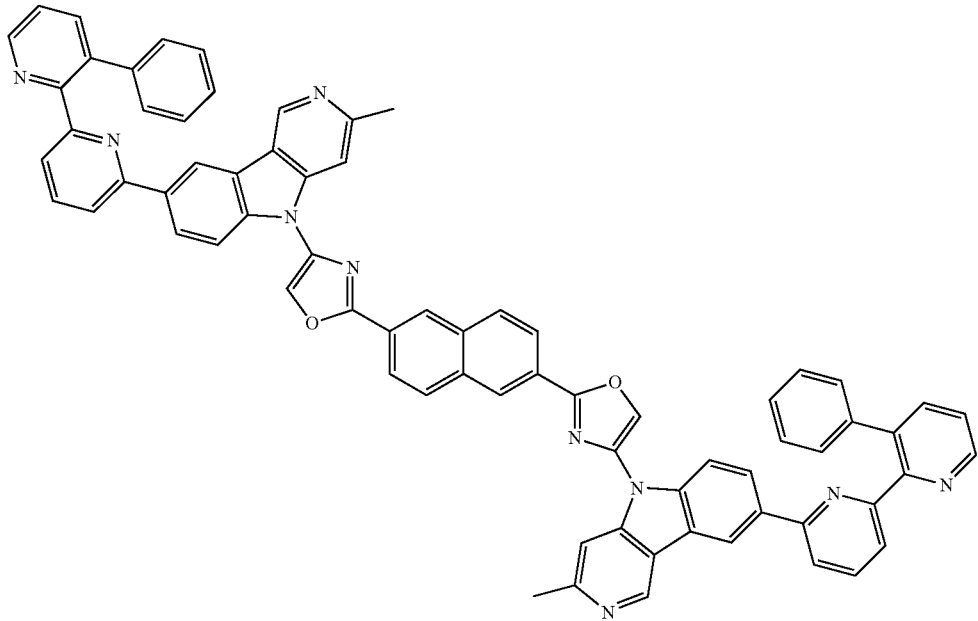
[Chem. 29]
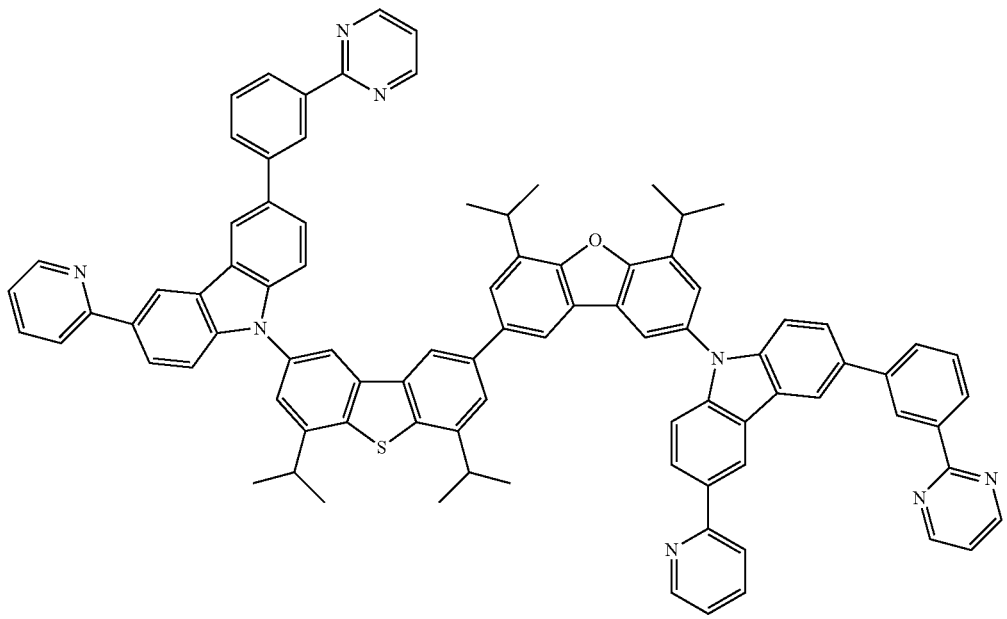

-continued
77
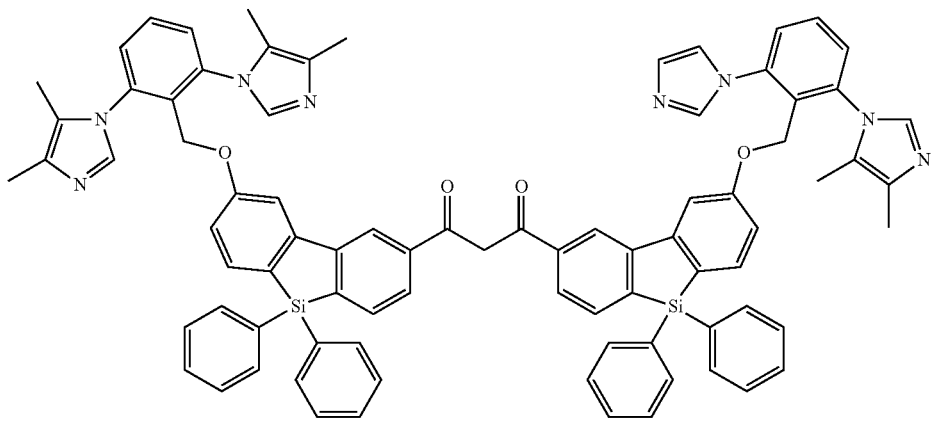
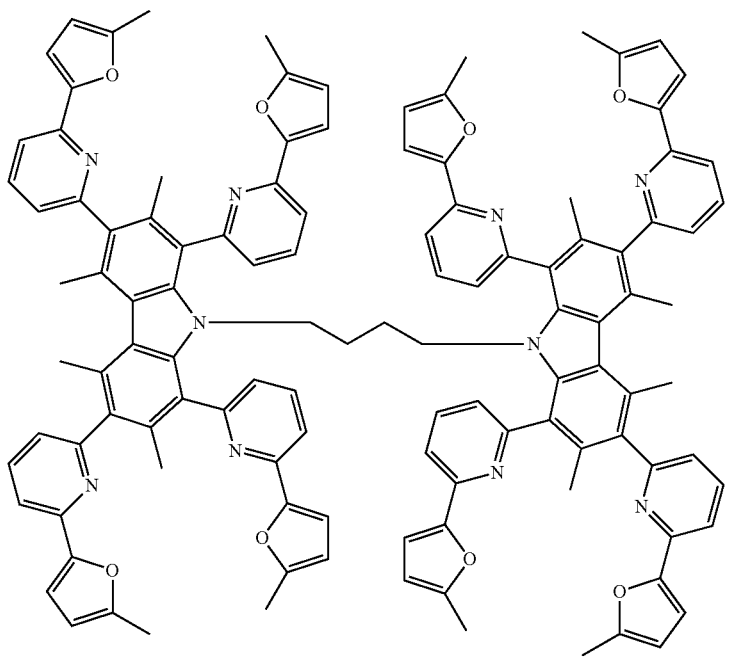
[Chem. 30]
78
79
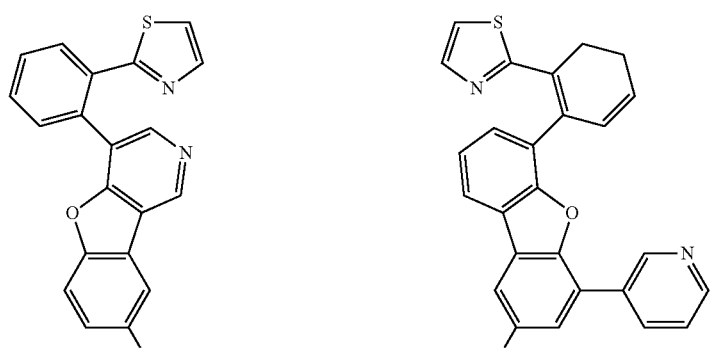

-continued
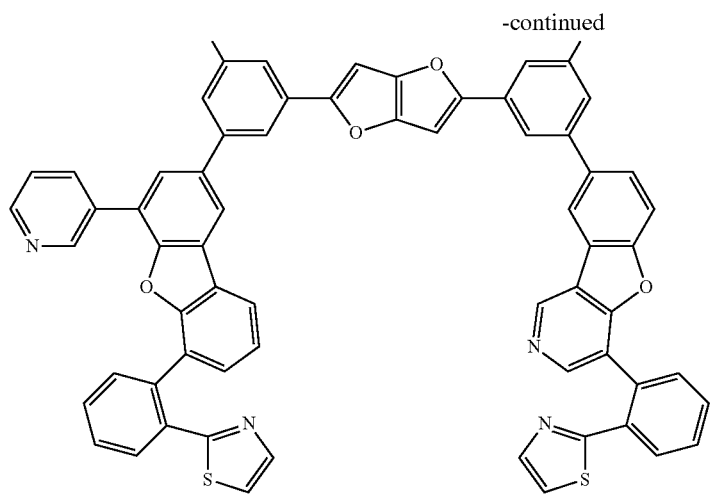
79
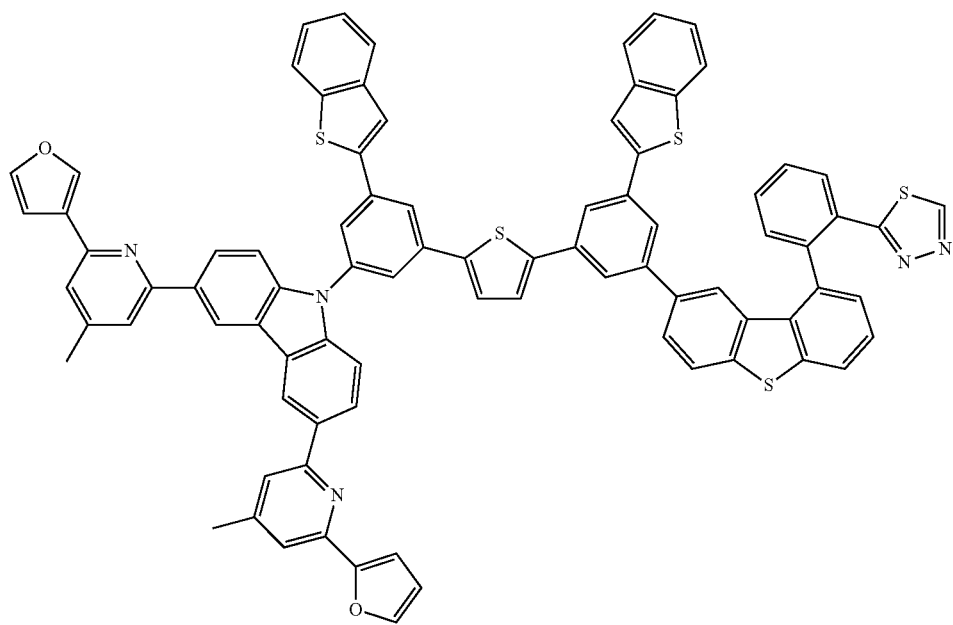
80
[Chem. 31]
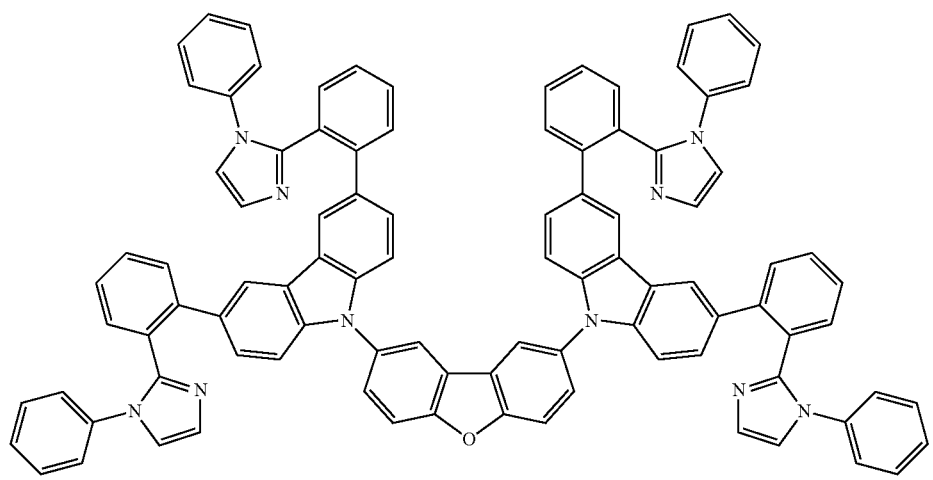
81

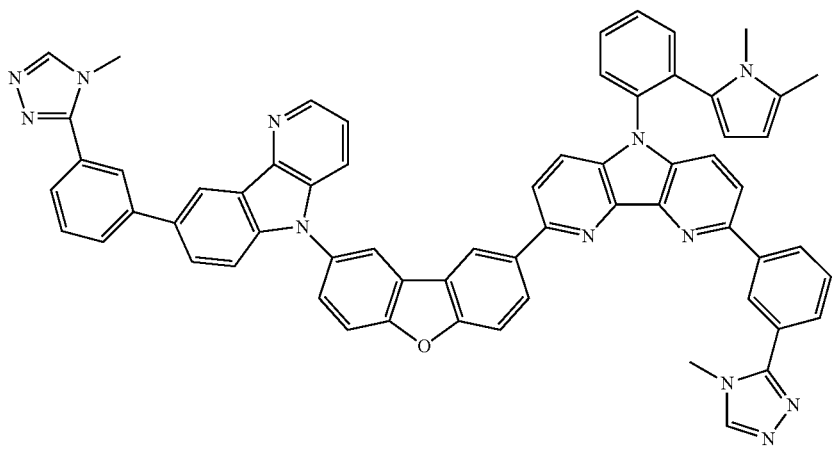
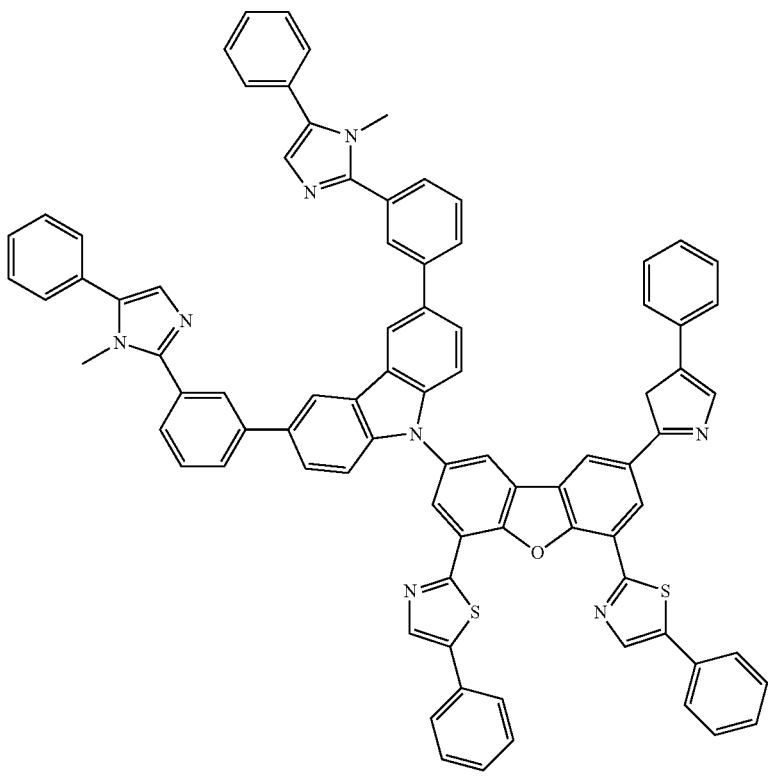

[Chem. 32]
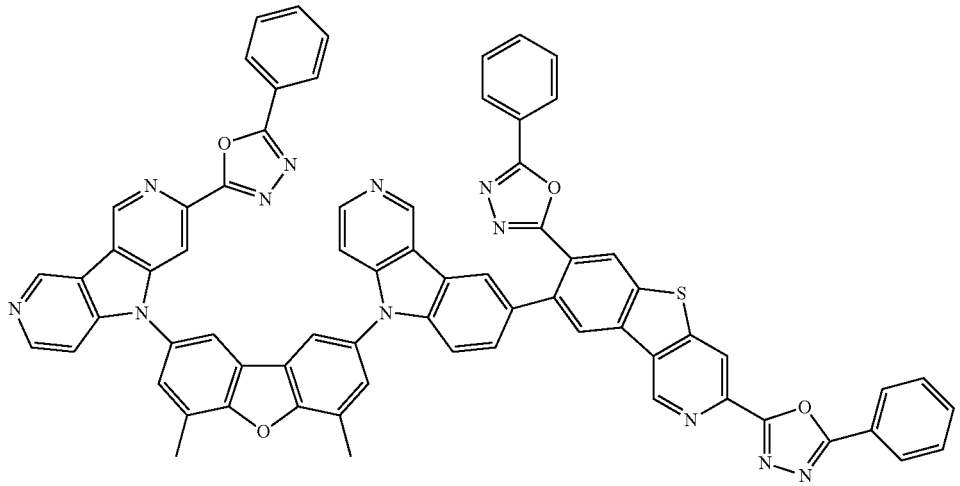
84
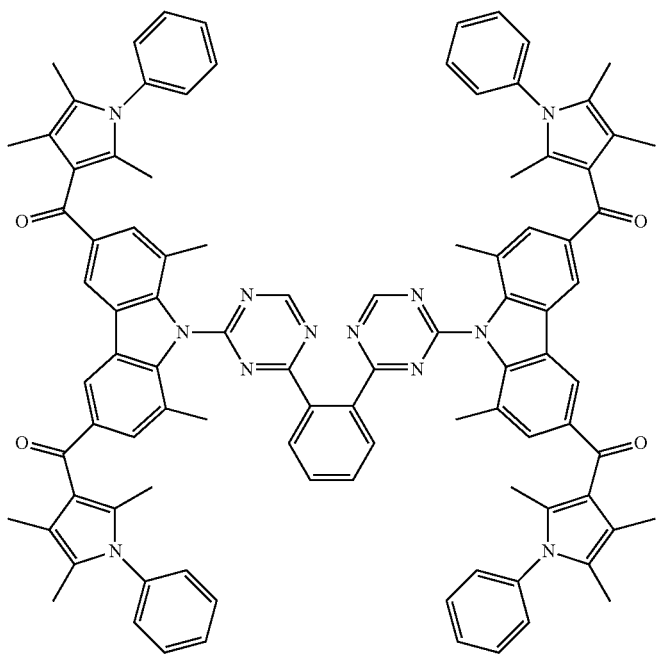
85
[Chem. 33]
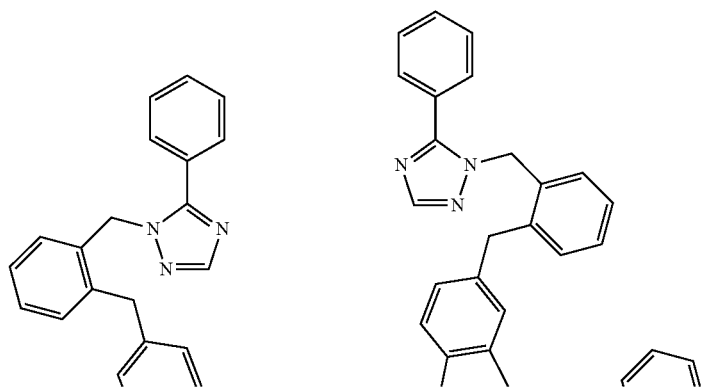
86

85 86
-continued
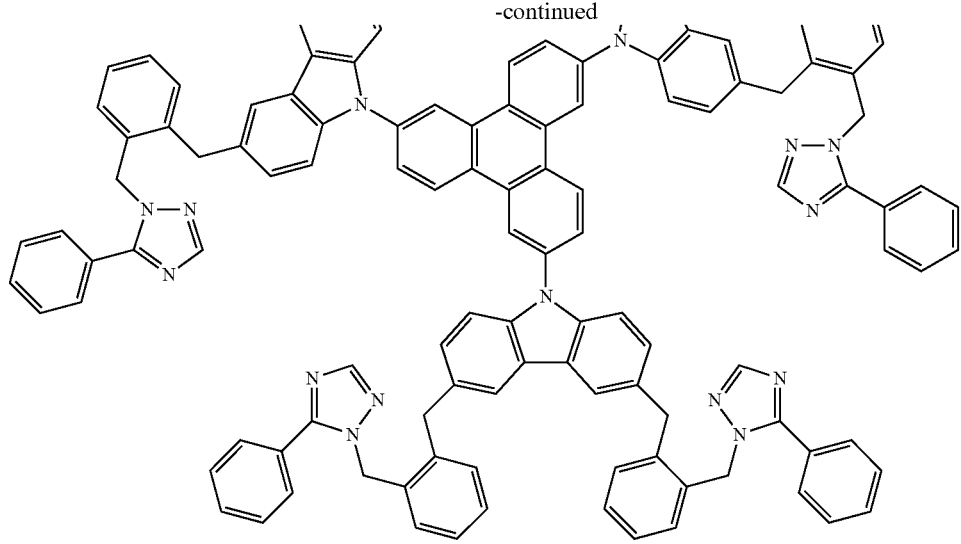
87
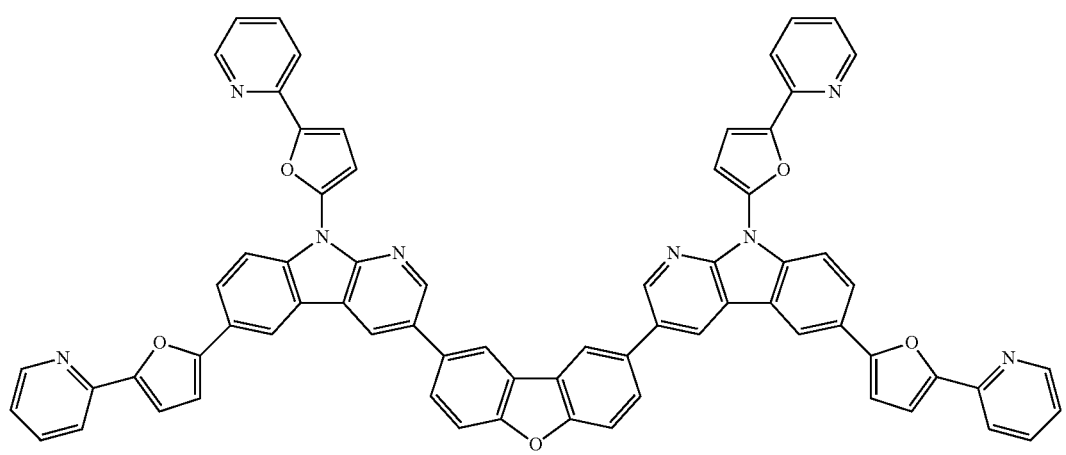
88
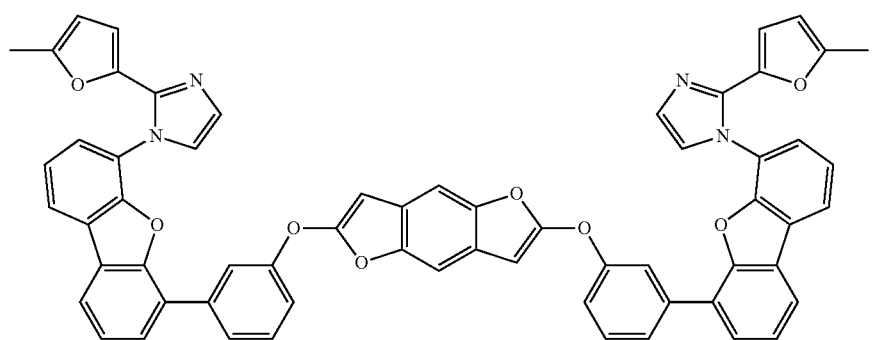

[Chem. 34]
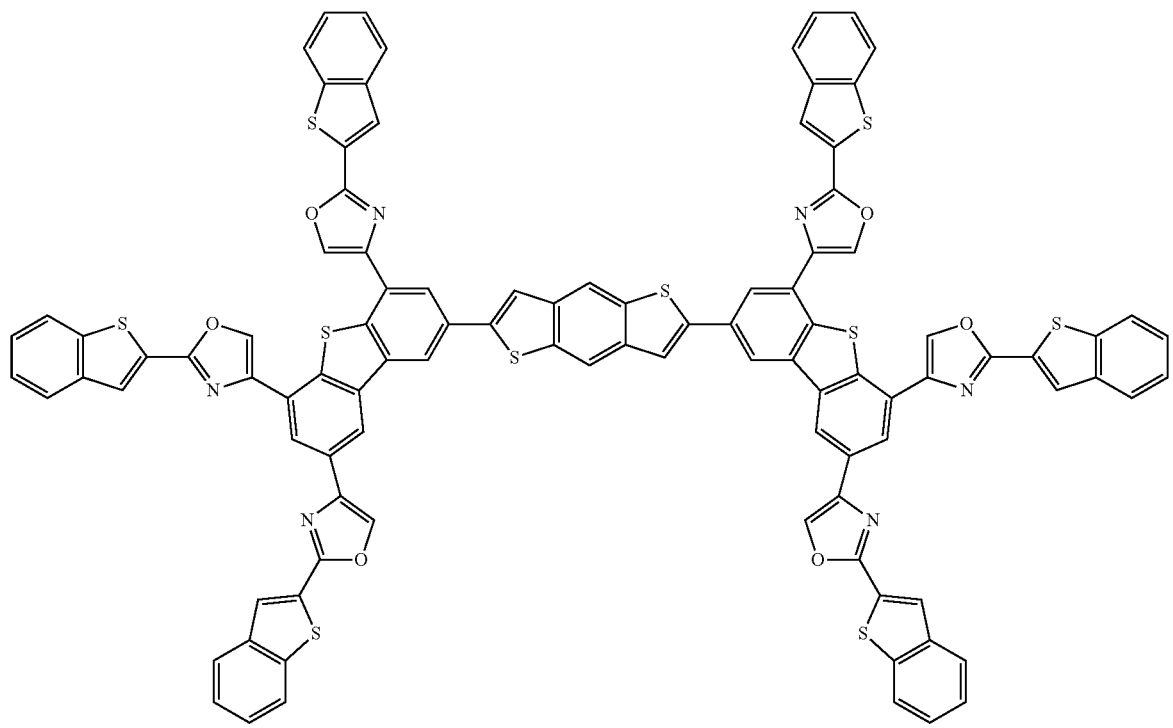
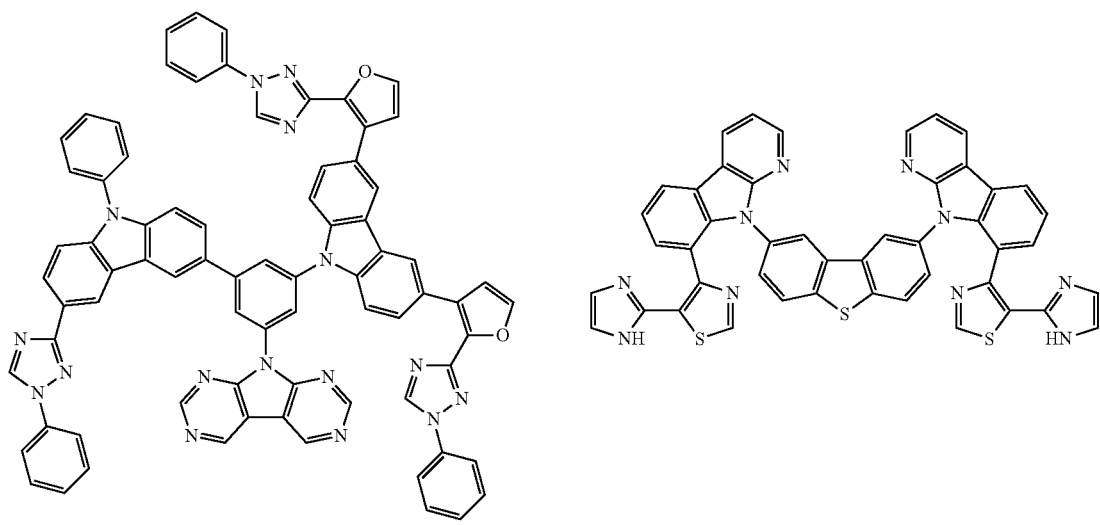

[Chem. 35]
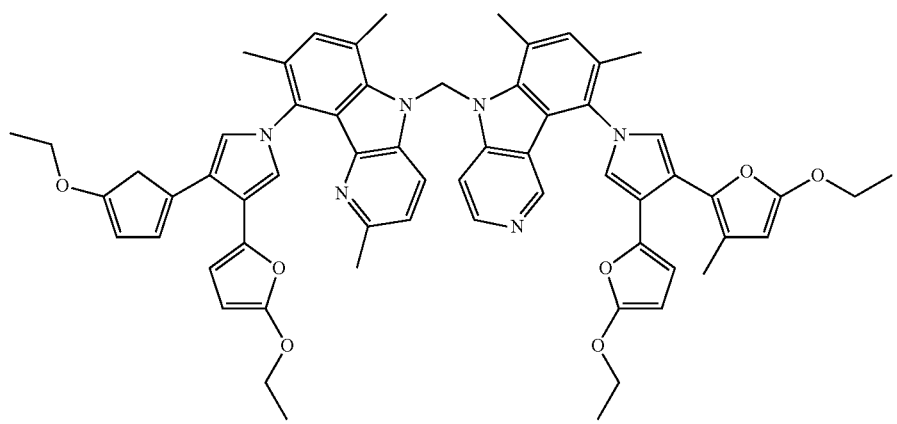
92
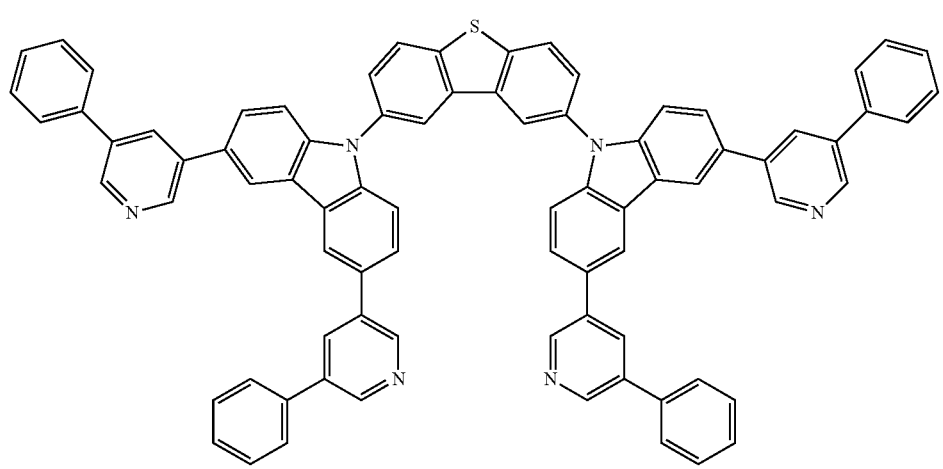
93
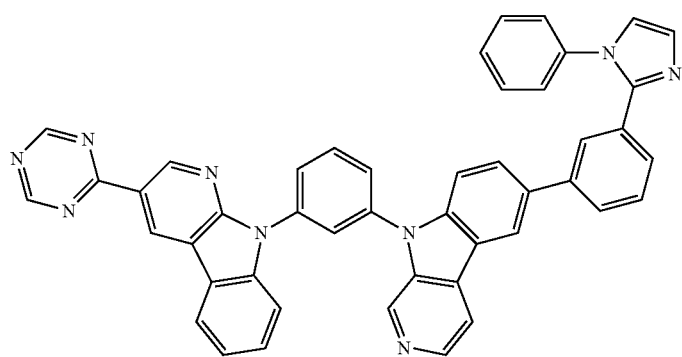
94

95
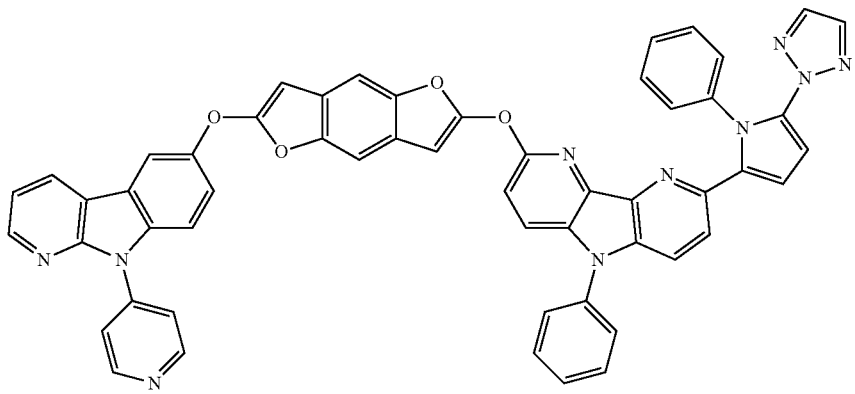
[Chem. 36]
96
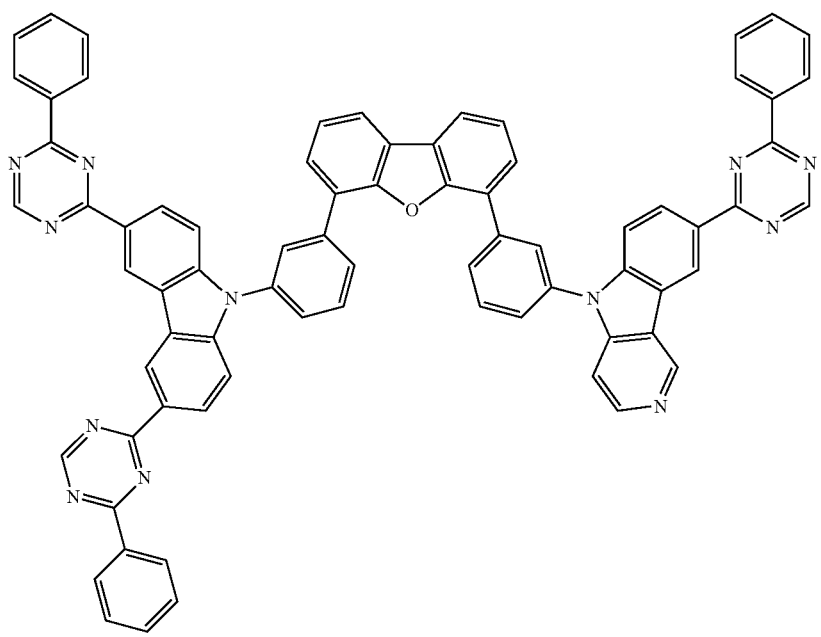
97
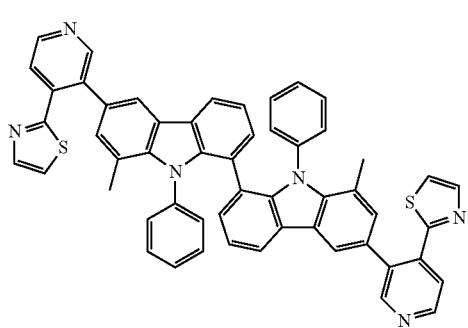
98
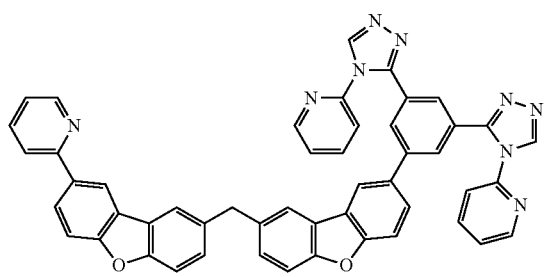

-continued
99
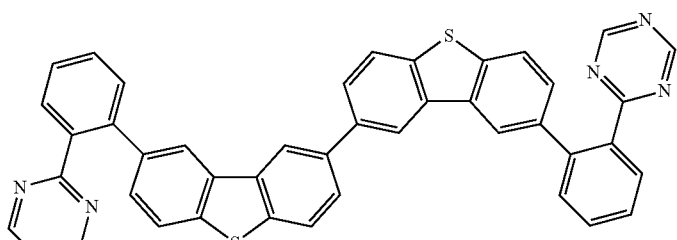
100
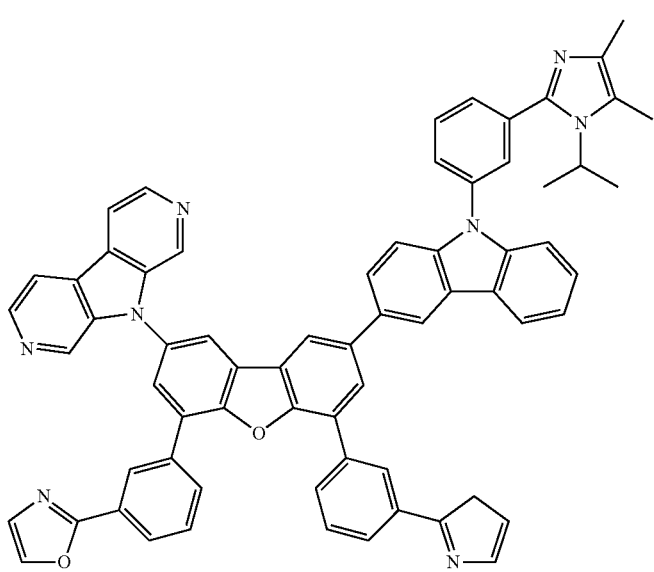
101
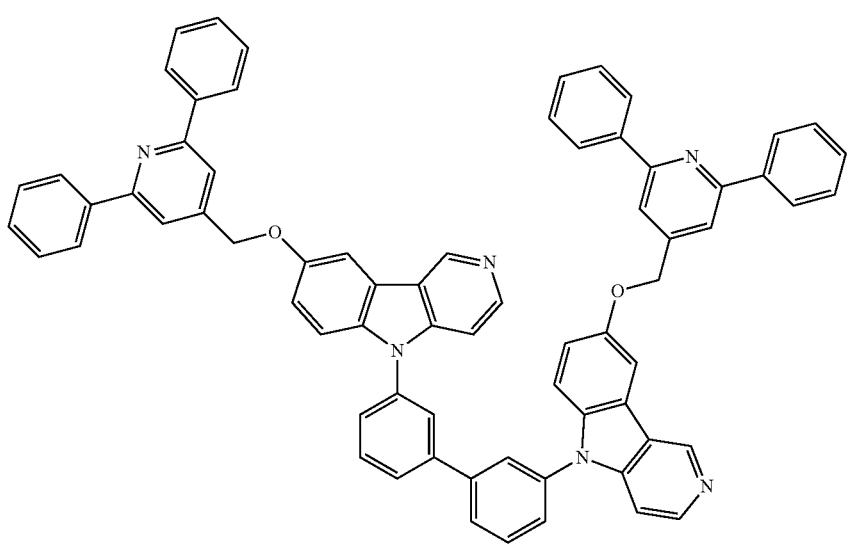

-continued
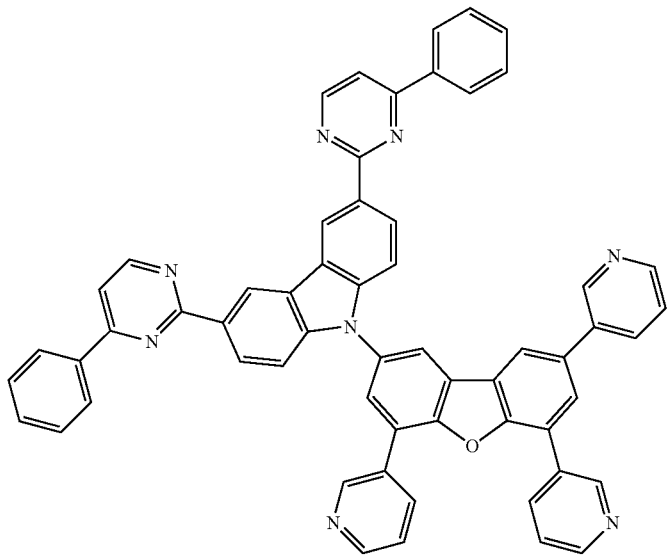
102
[Chem. 38]
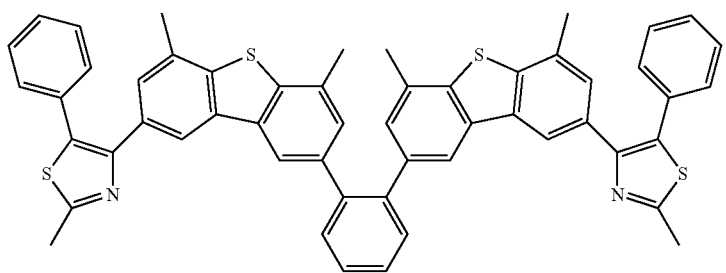
103
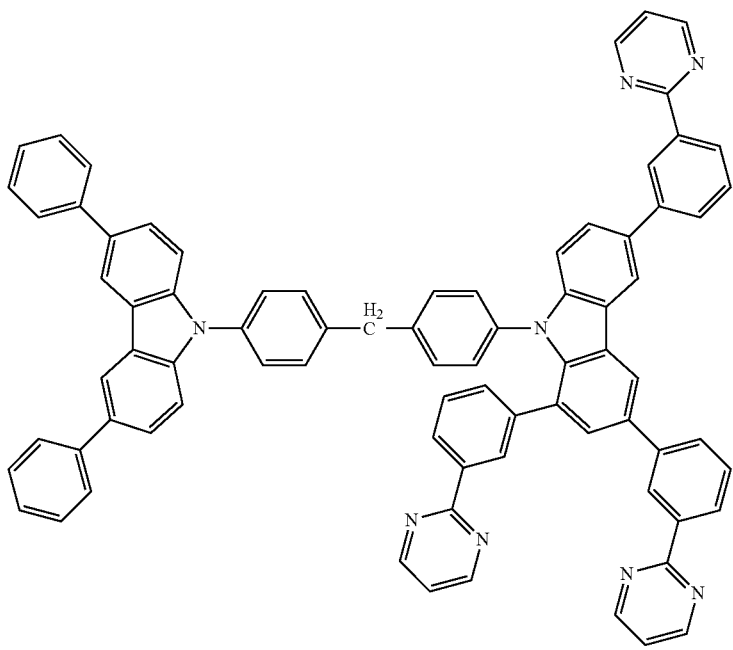
104

-continued
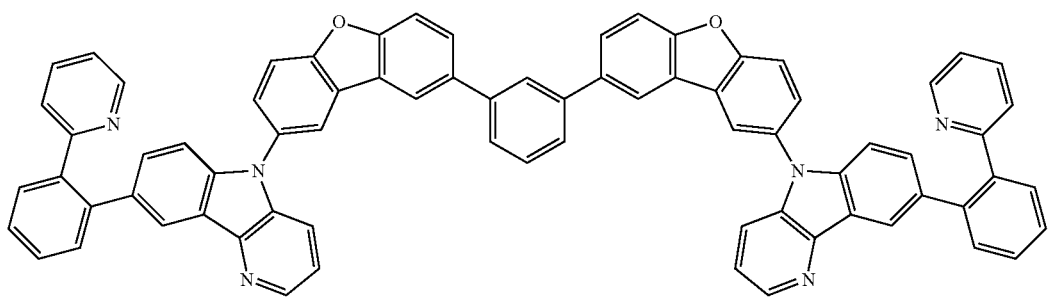
105
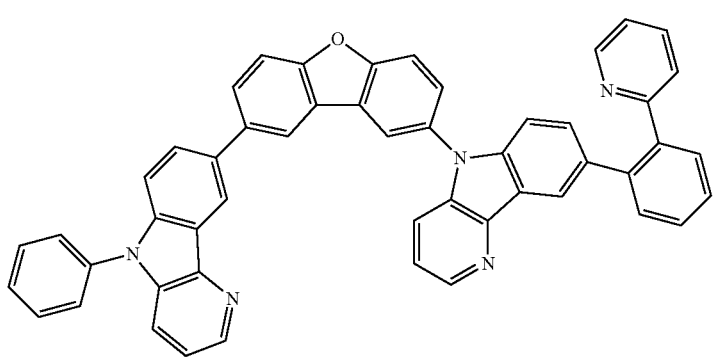
106
[Chem. 39]
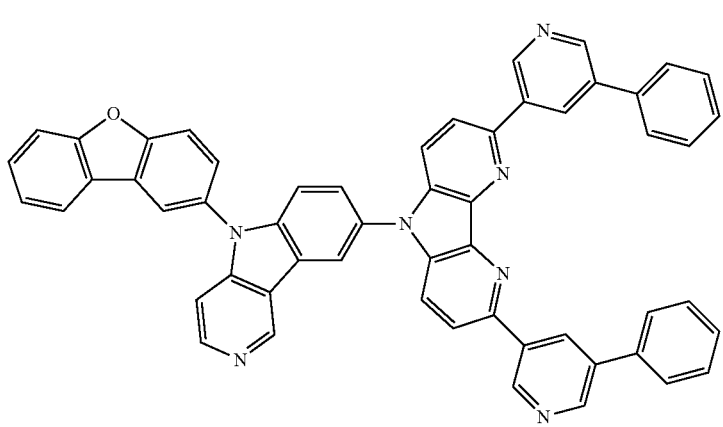
107
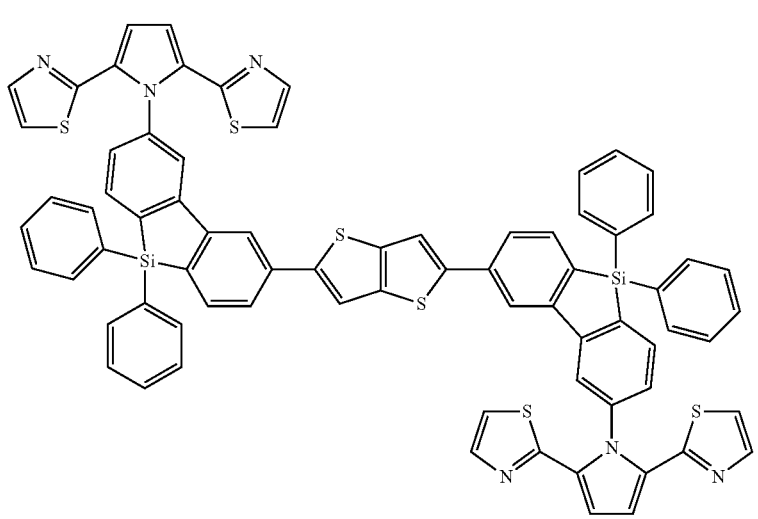
108

-continued
109
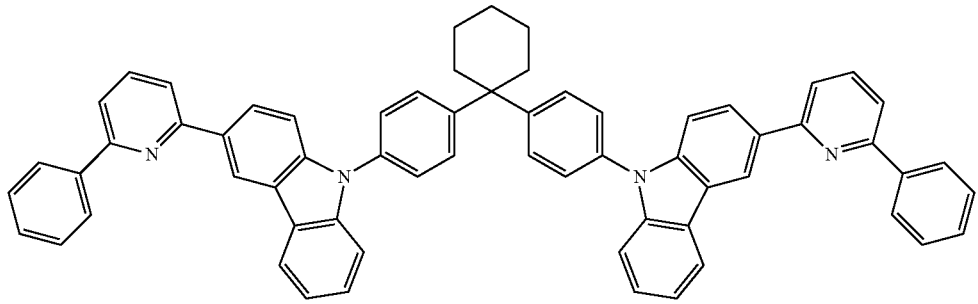
110
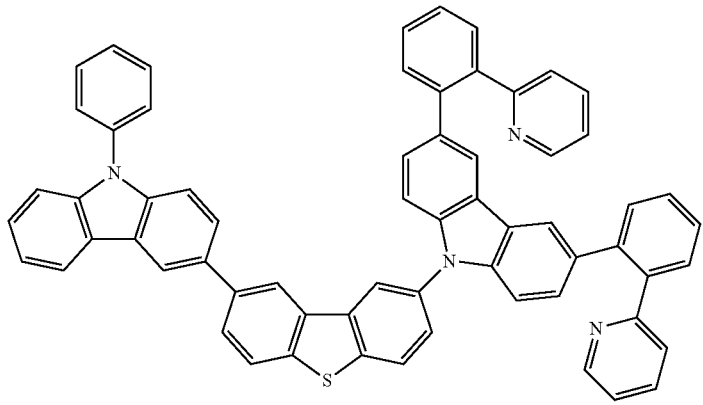
[Chem. 40]
111
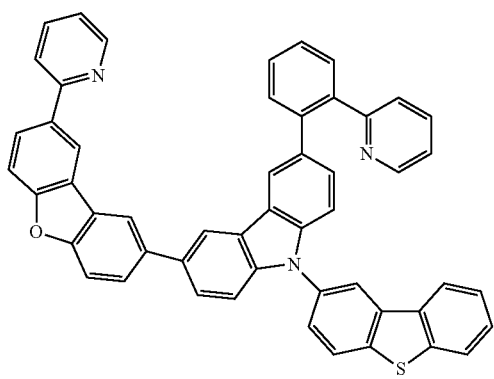
112
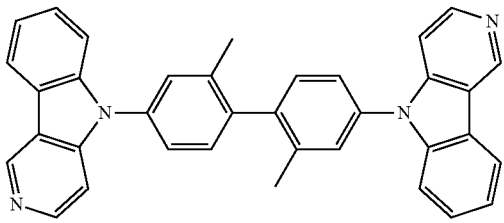
113
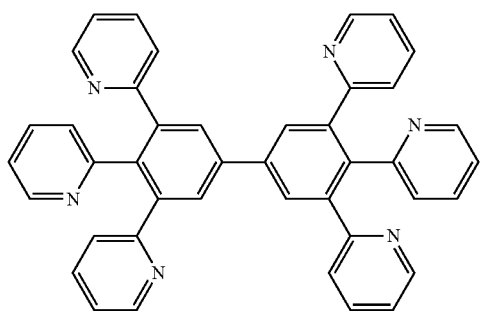
114
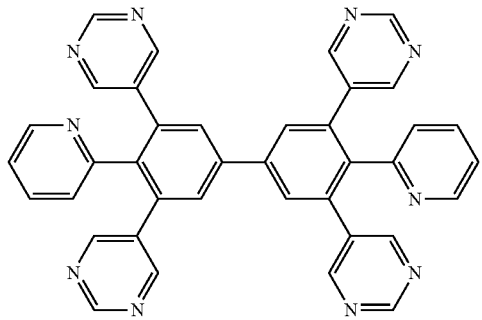

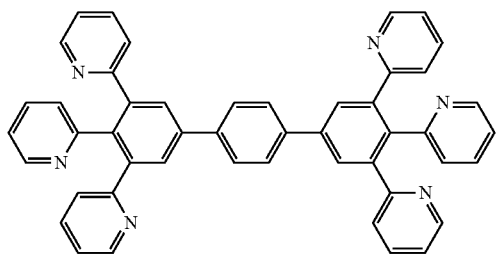
115

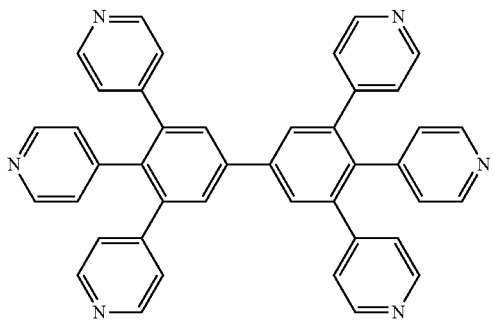
116

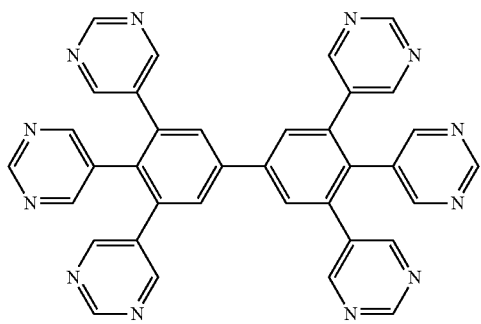
117

118

(Method of Forming Nitrogen-Containing Layer)

Examples of the method forming the nitrogen-containing layer according to the present invention include wet processes, such as application, ink jetting, coating, and dipping; and dry processes, such as vapor deposition (e.g., resistance heating and an EB deposition), sputtering, and CVD. In particular, vapor deposition is preferred.

If the nitrogen-containing layer is formed with a plurality of compounds, codeposition involving simultaneous supply of the compounds from different evaporation sources is employed. If a raw material is a polymer compound, an application process is preferably employed. In this case, a coating solution of the compound in a solvent is used. The solvent may be any one. In the case of forming the nitrogen-containing layer from a plurality of compounds, the coating solution can be prepared with a solvent that can dissolve these compounds.

[Luminous Unit]

In the organic EL element of the present invention, the luminous unit 4 is characterized by the structure including two or more luminous units layered between a first electrode and a second electrode, adjacent luminous units each being separated by an intermediate electrode layer. In the present invention, three or more luminous units including a blue luminous unit, a green luminous unit, and a red luminous unit may be layered to create an emission color having desired hue including white.

The luminous unit 4 according to the present invention may have any layer structure as a whole and may have a common layer structure. A typical structure is composed of "a hole-injecting layer, a hole-transporting layer, an organic luminous layer, an electron-transporting layer, and an electron-injecting layer" layered in this order from the first electrode or anode 3. In this configuration, the organic luminous layer (hereinafter, also simply referred to as luminous layer) at least including an organic material is an essential component. The hole-injecting layer and the hole-transporting layer may be disposed as a hole transporting and injecting layer. The electron-transporting layer and the electron-injecting layer may be disposed as an electron transporting and injecting layer. Among the layers constituting the luminous unit 4, for example, the electron-injecting layer may be made of an inorganic material.

The luminous unit 4 may further include layers, such as a hole-blocking layer and an electron-blocking layer, laminated at required positions as needed, in addition to the above-mentioned layers. Alternatively, the luminous unit may be composed of luminous layers that respectively emit light of different wavelength regions, the luminous layers being layered with a non-luminous intermediate layer therebetween. The intermediate layer may also function as a hole-blocking layer and/or an electron-blocking layer.

As shown in FIGS. 1 to 6, the luminous unit 4 may have a configuration including layered two luminous units or a configuration including layered three luminous units that emit light h having different colors.

The individual layers composing the luminous unit 4, i.e., the luminous layer, the injection layer, the hole-transporting layer, the electron-transporting layer, and the blocking layer, will now be described in sequence.

(Luminous Layer)

The luminous layer of the luminous unit 4 of the organic EL element (EL) preferably contains a phosphorescent compound as a luminescent material.

The luminous layer emits light by recombining electrons injected from an electrode or an electron-transporting layer and holes injected from a hole-transporting layer. The portion of emitting light may be the inside of the luminous layer or the interface with the layer adjoining the luminous layer.

The luminous layer may have any structure with the proviso that the luminescent material contained in the layer satisfies the requirements for light emission. The luminous layer may include multiple sublayers having the same emission spectrum or the same maximum emission wavelength. In such a case, an intermediate layer is preferably disposed between any two adjacent luminous sublayers.

The total thickness of the luminous layer is preferably within a range of 1 to 100 nm, more preferably 1 to 30 nm, from the viewpoint of a lower driving voltage. If one or more non-luminous intermediate layers are disposed between any two adjacent luminous sublayers, the total thickness of the luminous layer includes the total thickness of the intermediate layer(s).

In the luminous layer composed of a laminate of multiple sublayers, the thickness of each luminous sublayer is preferably within a range of 1 to 50 nm, more preferably 1 to 20 nm. In the laminate of the multiple luminous sublayers emitting light having different colors, blue, green, and red, the thicknesses of the blue, green, and red luminous sublayers can be independently determined.

The luminous layer can be formed from a luminescent material or a host compound described below by a known process, such as vacuum vapor deposition, spin coating, casting, a Langmuir Blodgett (LB) method, or ink jetting.

A single luminous layer may include a mixture of different luminescent materials or a mixture of a phosphorescent material and a fluorescent material (also referred to as fluorescent dopant or fluorescent compound). The luminous layer preferably contains a host compound (also referred to as, for example, luminescent host) and a luminescent material (also referred to as luminescent dopant) to emit light by the luminescent material.

<Host Compound>

The host compound contained in the luminous layer is preferably a compound having a phosphorescence quantum yield of phosphorescent emission of less than 0.1 at room temperature (25° C.), more preferably less than 0.01. The volume proportion of the compound in the luminous layer is preferably 50% or more based on the layer.

The host compound may be a known host compound or a combination of known host compounds. The use of a plurality of host compounds can control the transportation of charge and can enhance the efficiency of the organic EL element. Furthermore, use of a plurality of luminescent materials described below can generate any intended emission color by mixing different luminous colors.

The host compound used in the luminous layer may be a known low-molecular-weight compound, a high-molecular-weight compound having a repeating unit, or a low-molecular-weight compound having polymerizable group such as a vinyl group or an epoxy group (vapor deposition polymerizable luminescent host).

The known host compound preferably has hole transportability and electron transportability, preventing the shift of luminescence to the longer wavelength side, and having a high glass transition temperature (Tg). The glass transition temperature (Tg) herein is determined by a method in accordance with JIS-K-7121 with a differential scanning calorimetry (DSC).

Nonlimiting examples of the host compound applicable to the luminous unit 4 are shown below as compounds H1 to H79. In host compounds H68 to H79, x and y represent the ratio of each random copolymer, for example, x:y=1:10.

[Chem. 41]
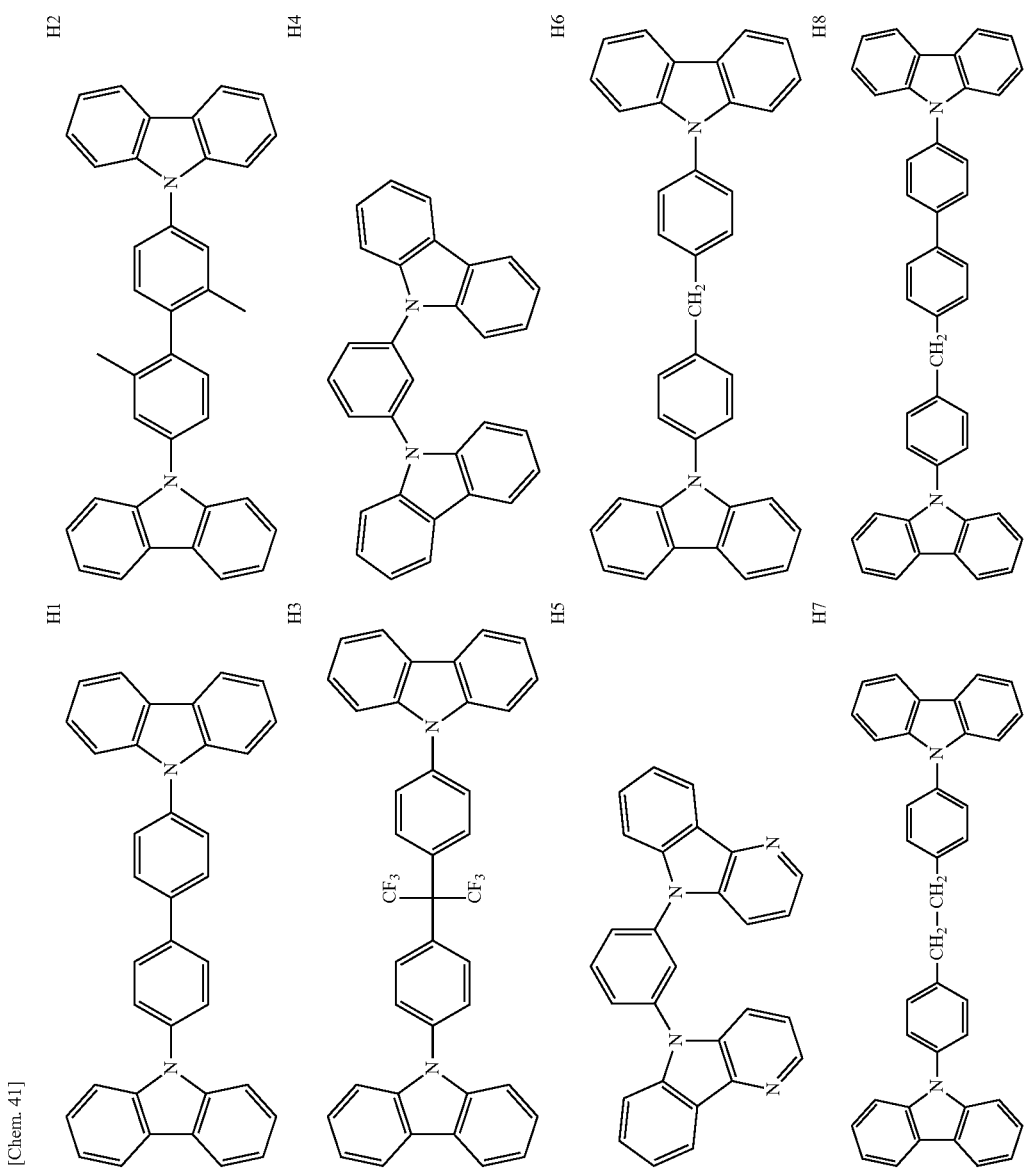

-continued
H9
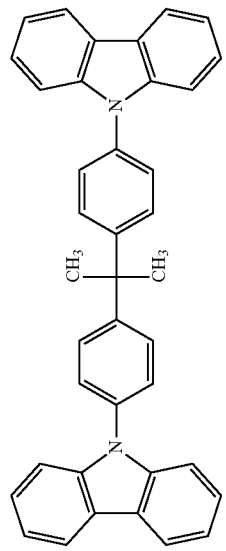
H10
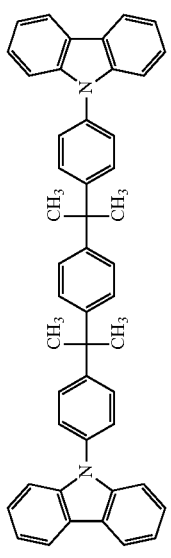
[Chem. 42]
H11
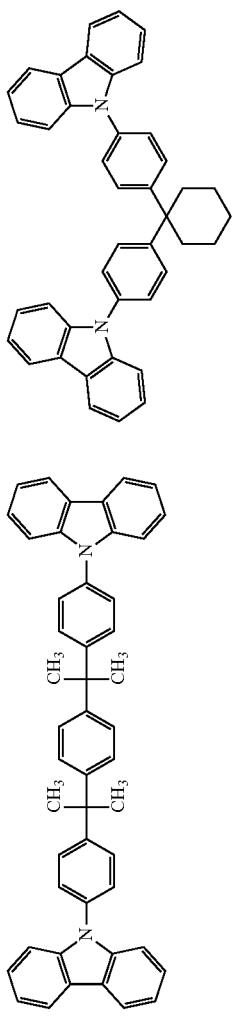
H12
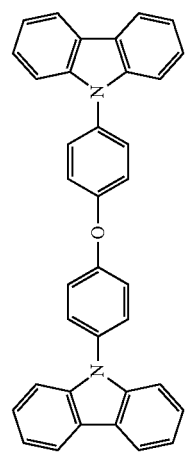
H13
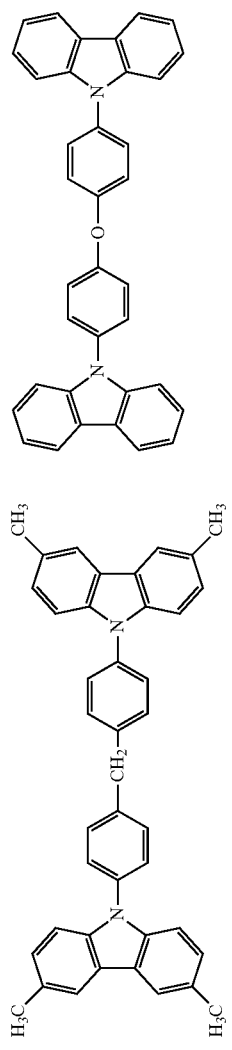

H14
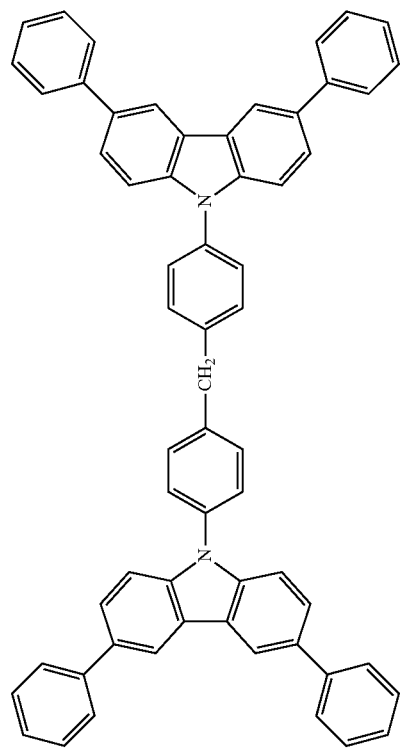
H16
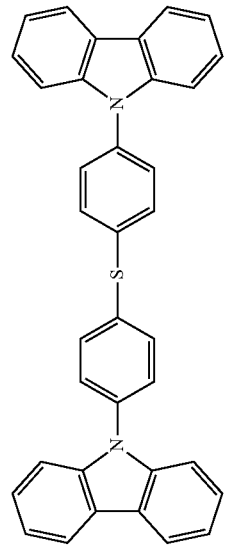
H15
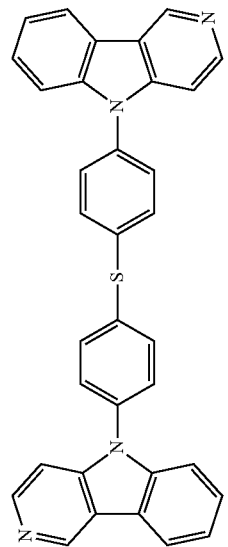
[Chem. 43]

-continued
H17
H18
H19
H20
H21
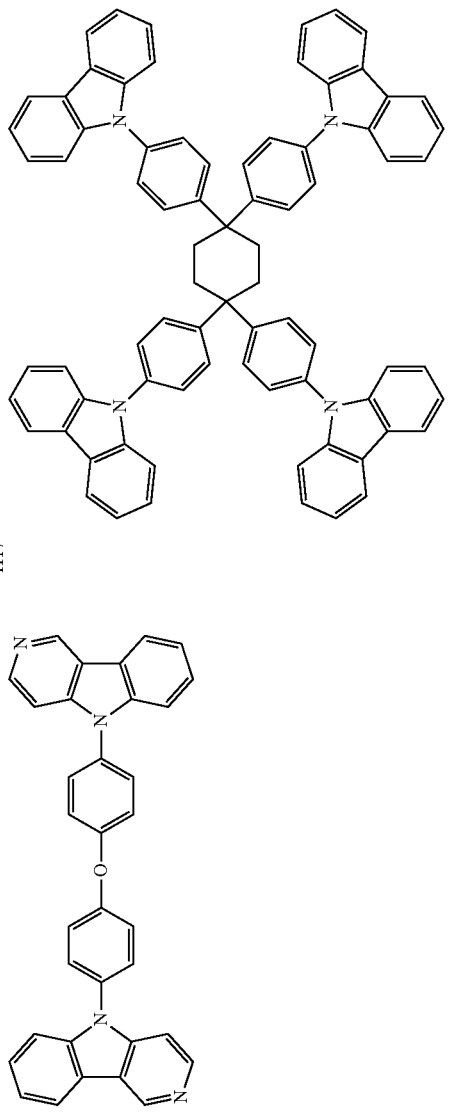
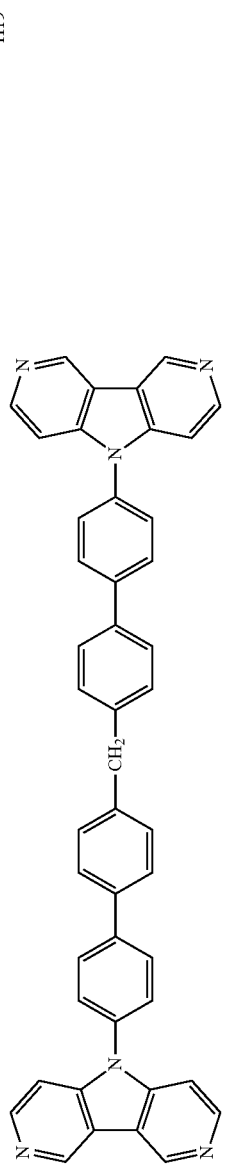

-continued
H22
H23 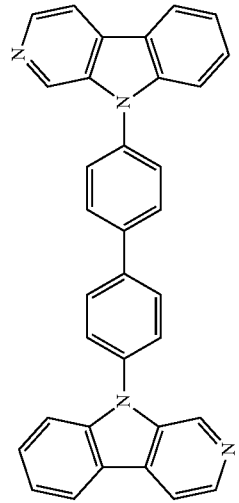
[Chem. 44]
H24 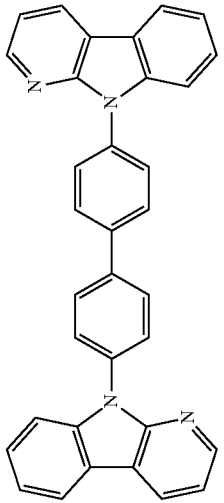
H25 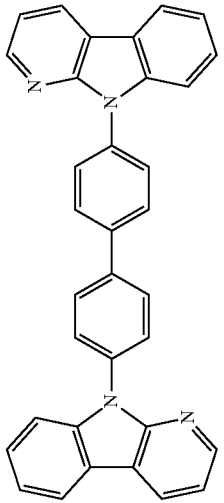
H26 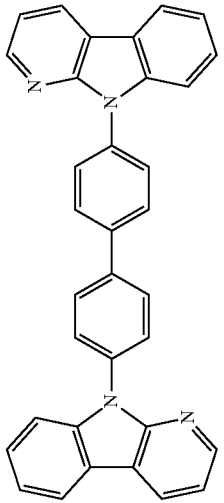
H27 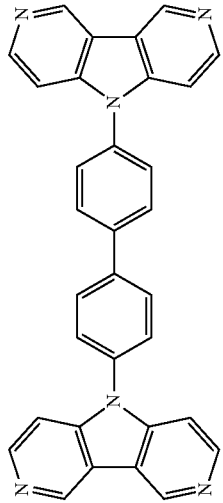
H28 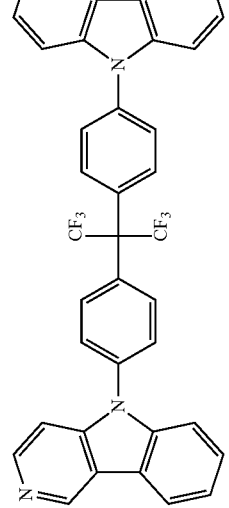

-continued
H29 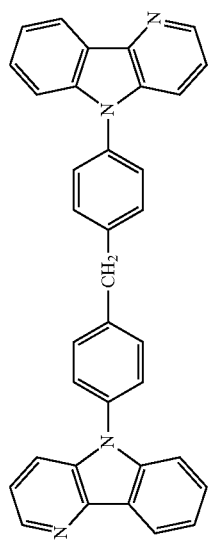
H30 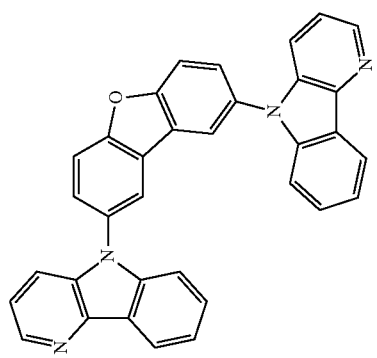
H31 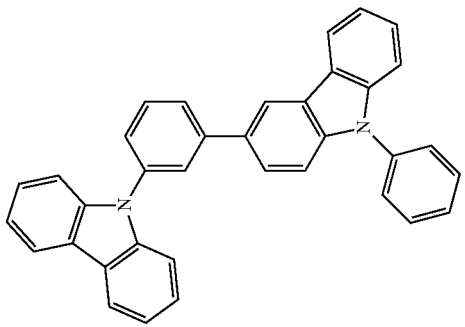
H32 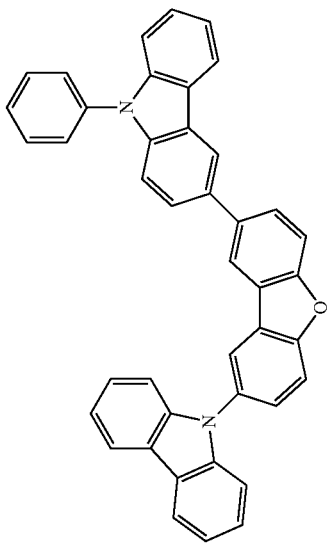
[Chem. 45]

-continued
H33
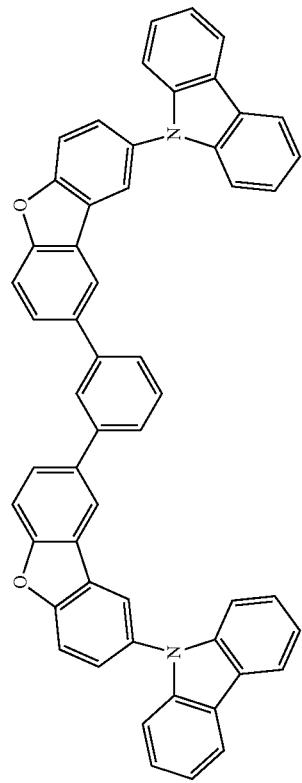
[Chem. 46]
H34
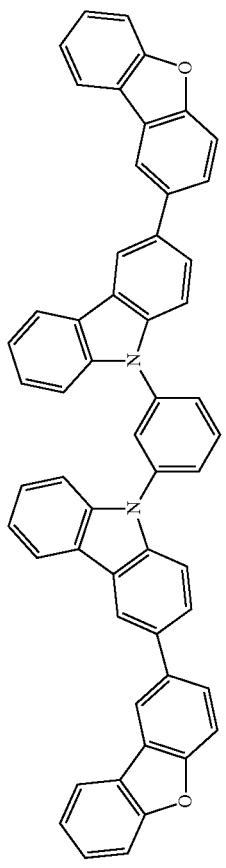
H35
H36
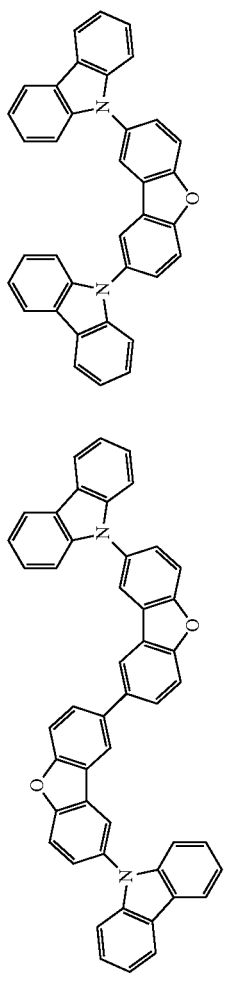

-continued
H37
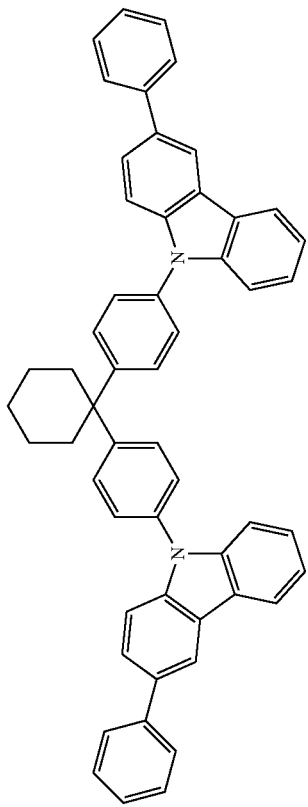
H39
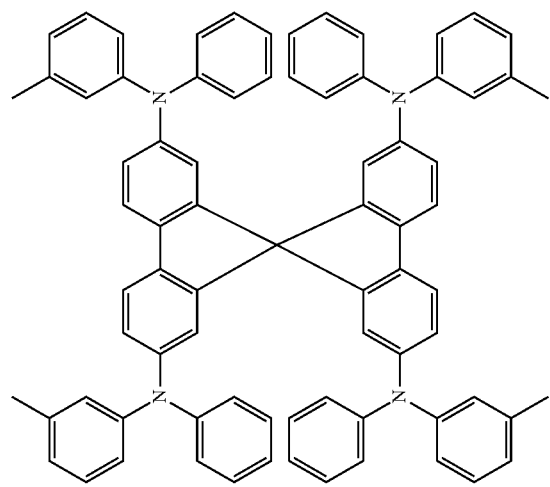
H38
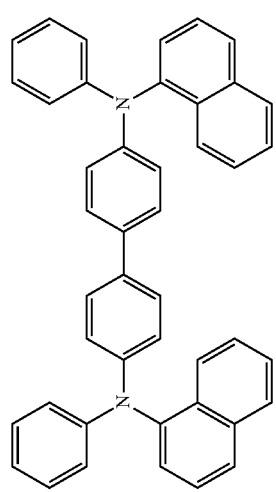

-continued
H41
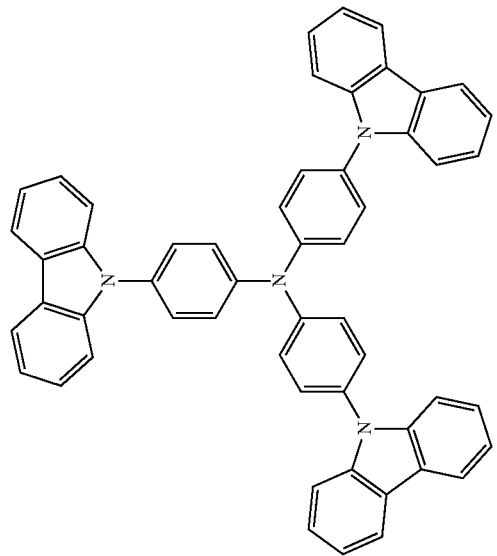
H43
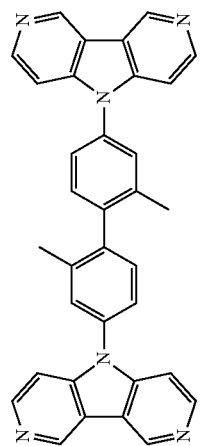
[Chem. 47]
H40
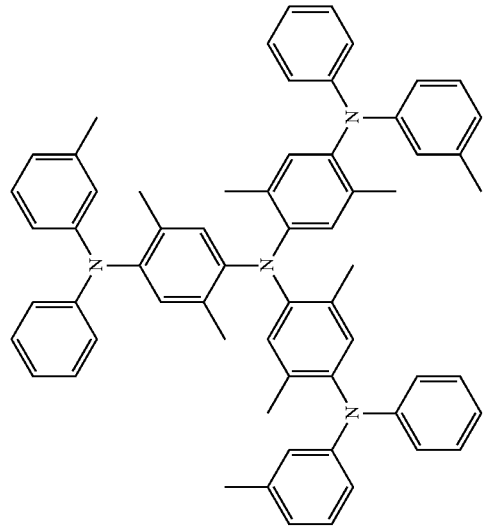
H42
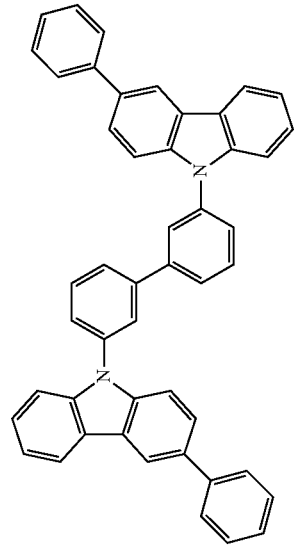

-continued
H44
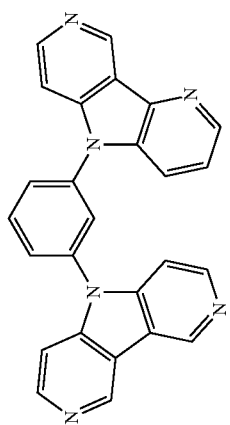
H45
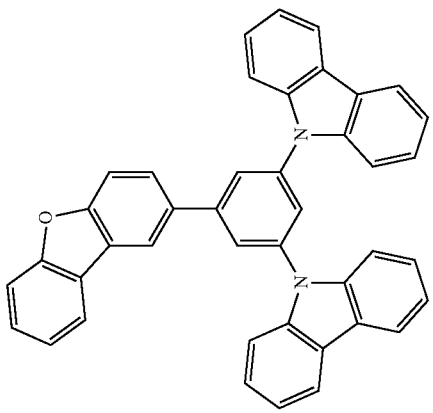
H46
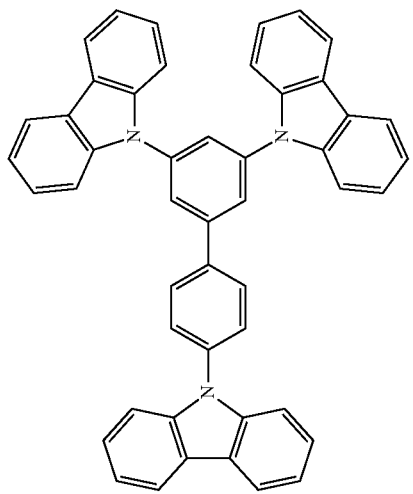
H47
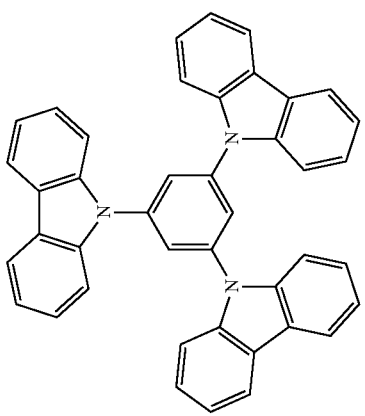

-continued
H48
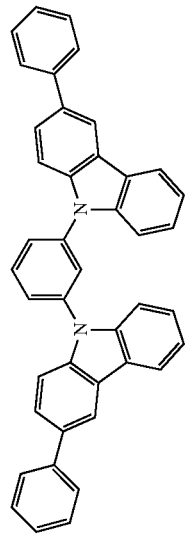
H49
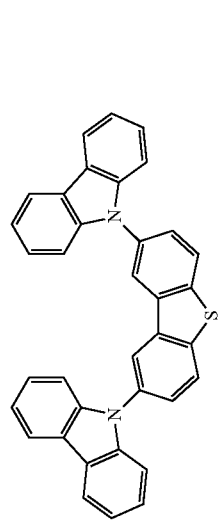
H50
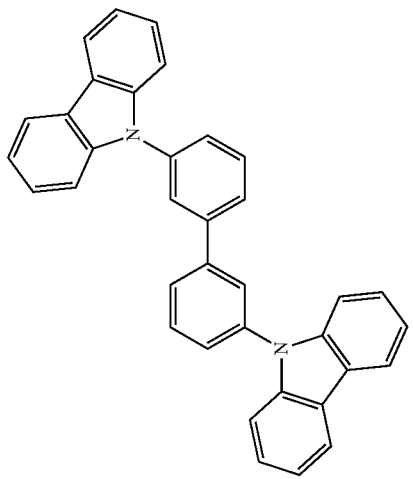
H51
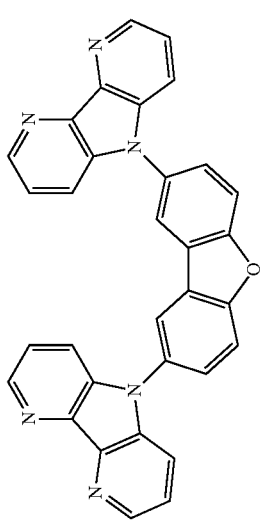
H52
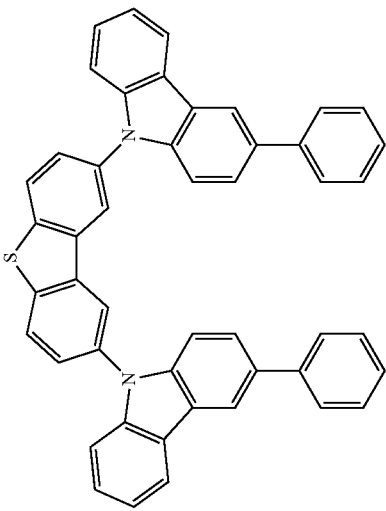
H53
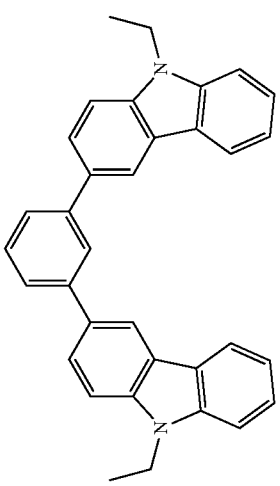
[Chem. 48]

-continued
H54 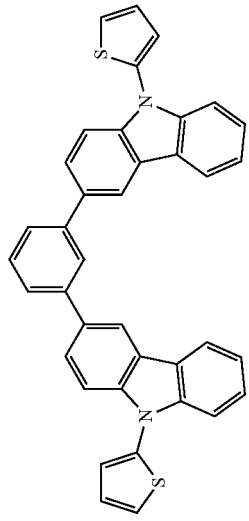
H55 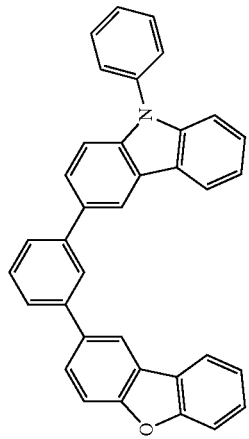
[Chem. 49]
H56 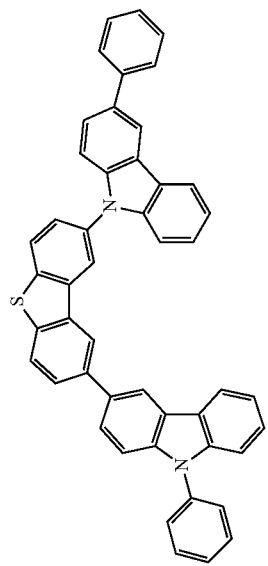
H57
H58 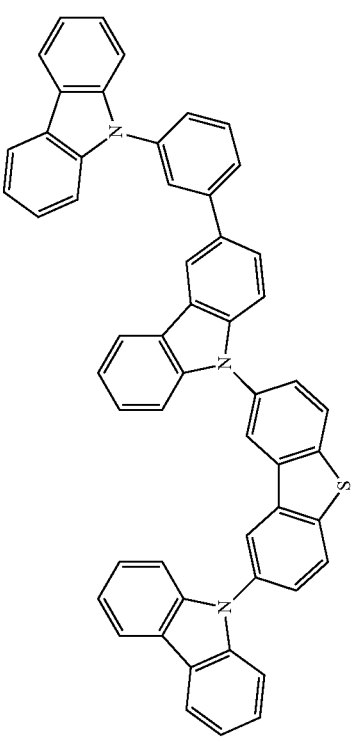

-continued
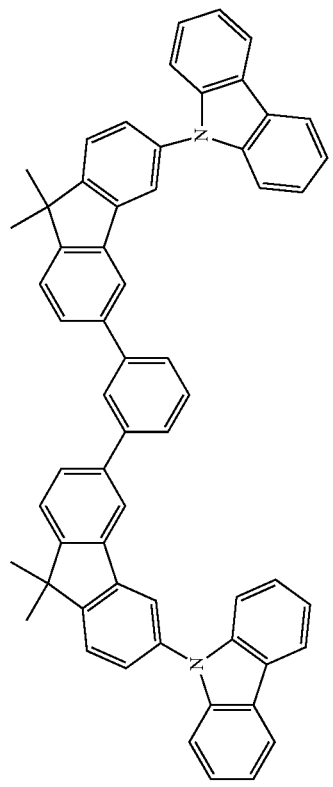
H59
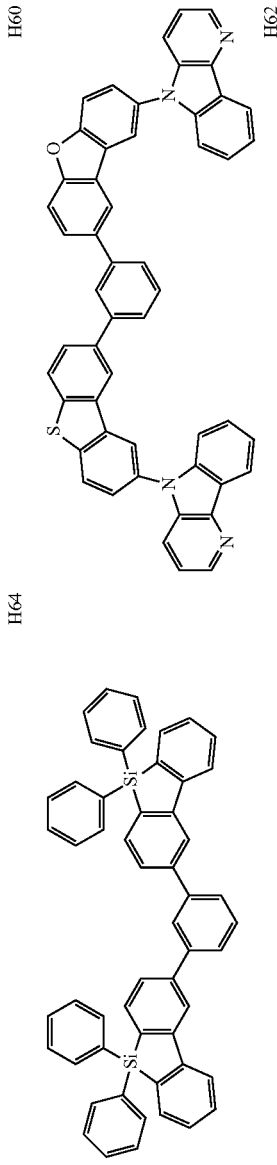
H60
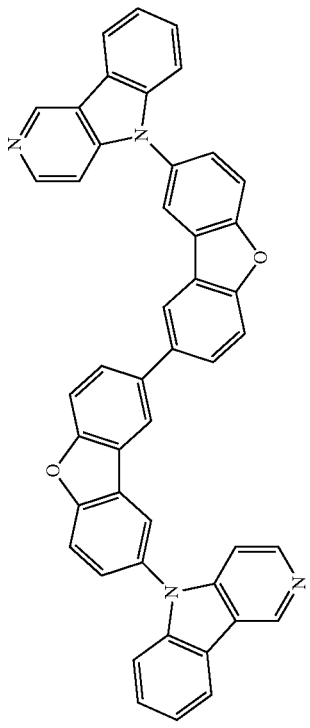
H62
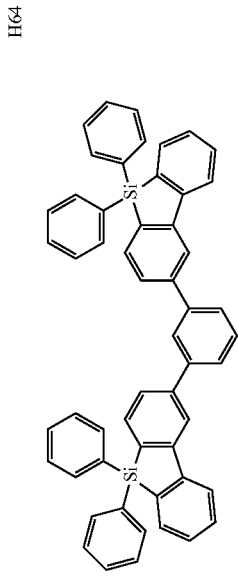
H64
[Chem. 50]

-continued
H63
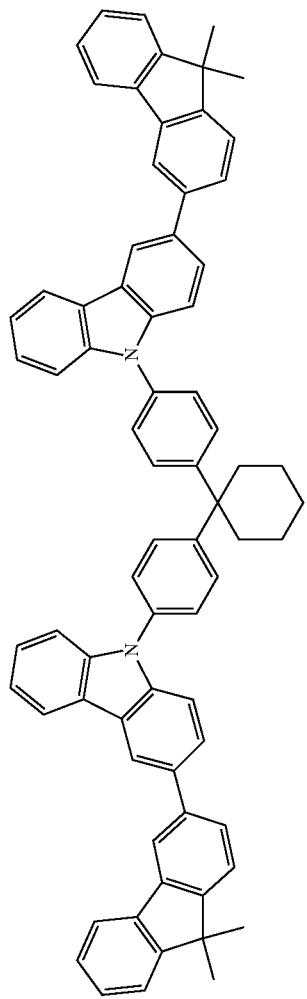
H64
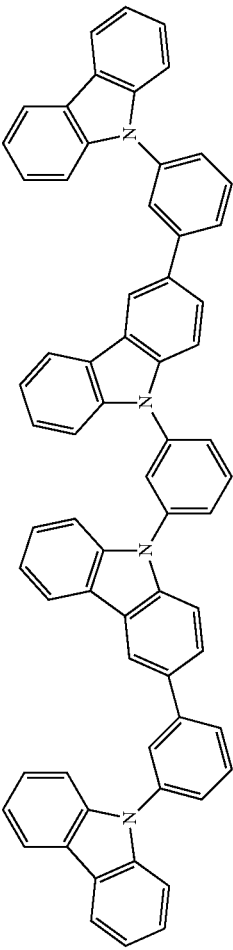
H65
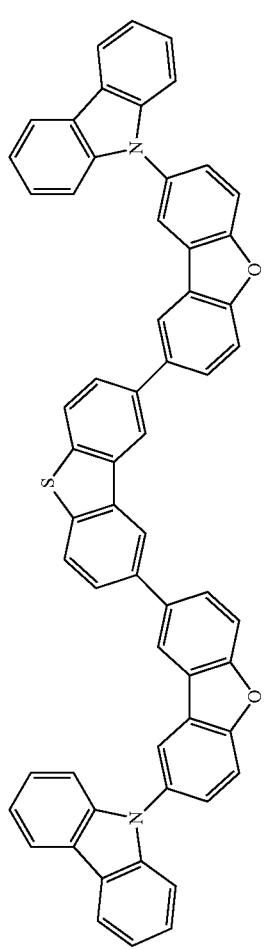
[Chem. 51]

-continued
H66
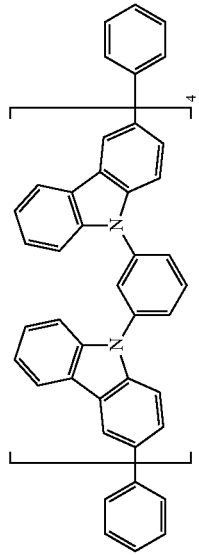
H67
[Chem. 52]
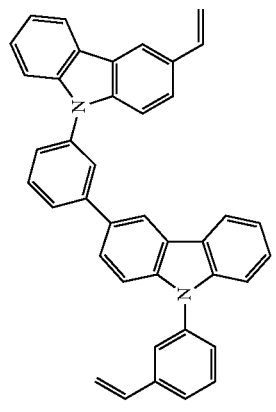
H68
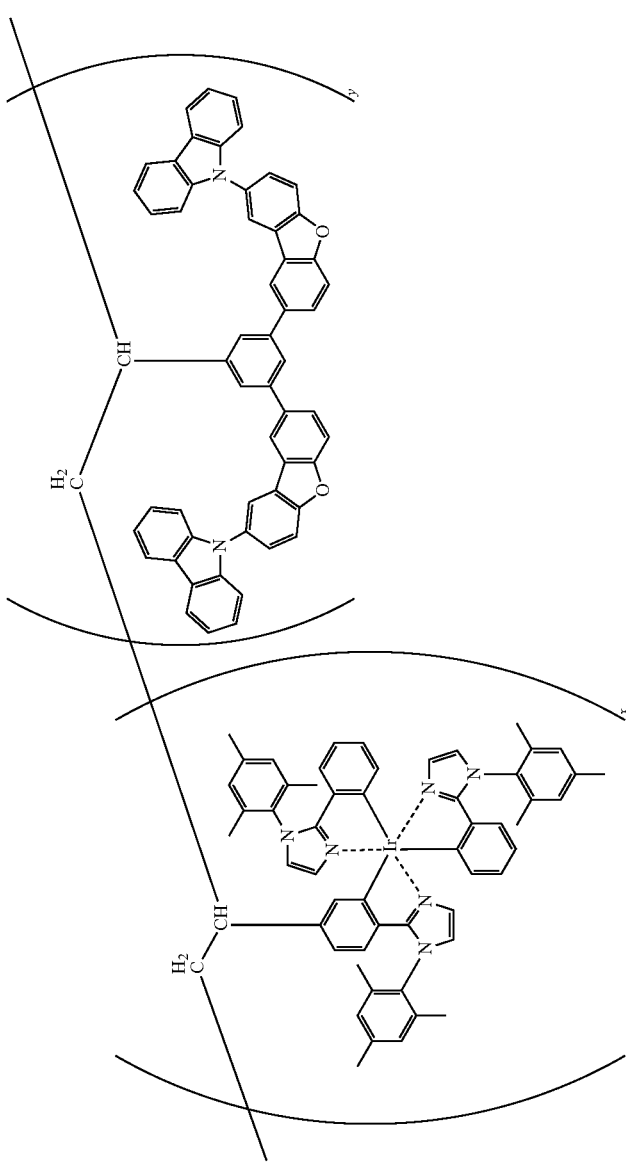
x:y = 1:10
ramdom co-polymer

[Chem. 53]
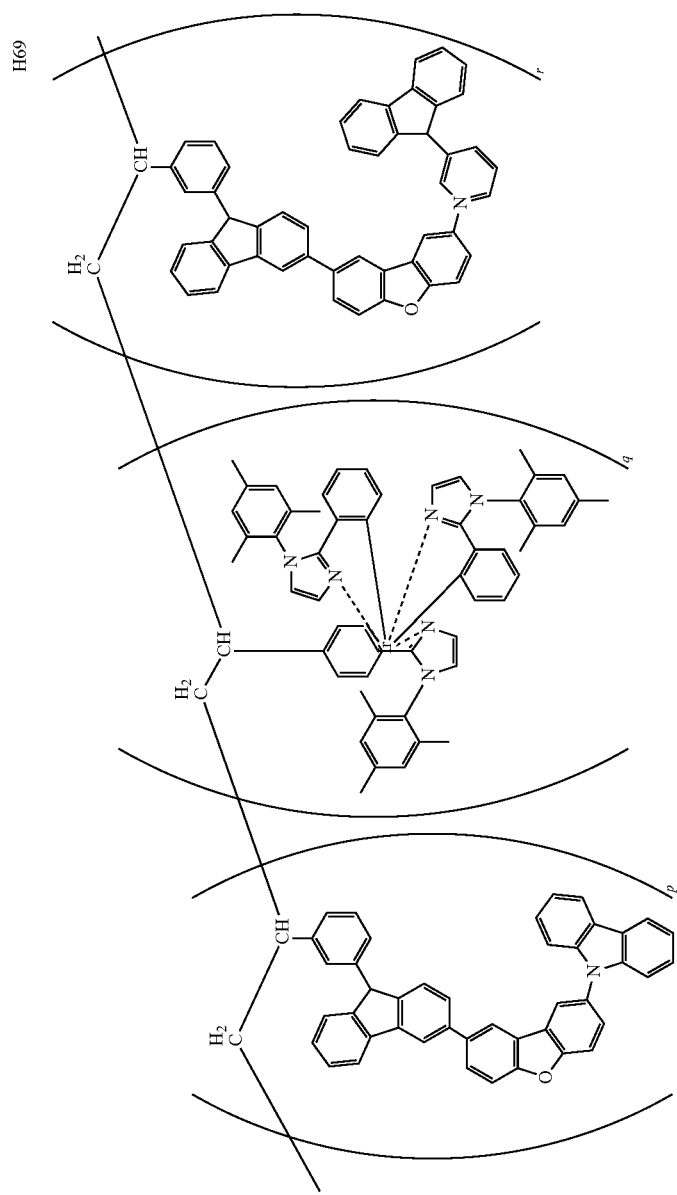

H70
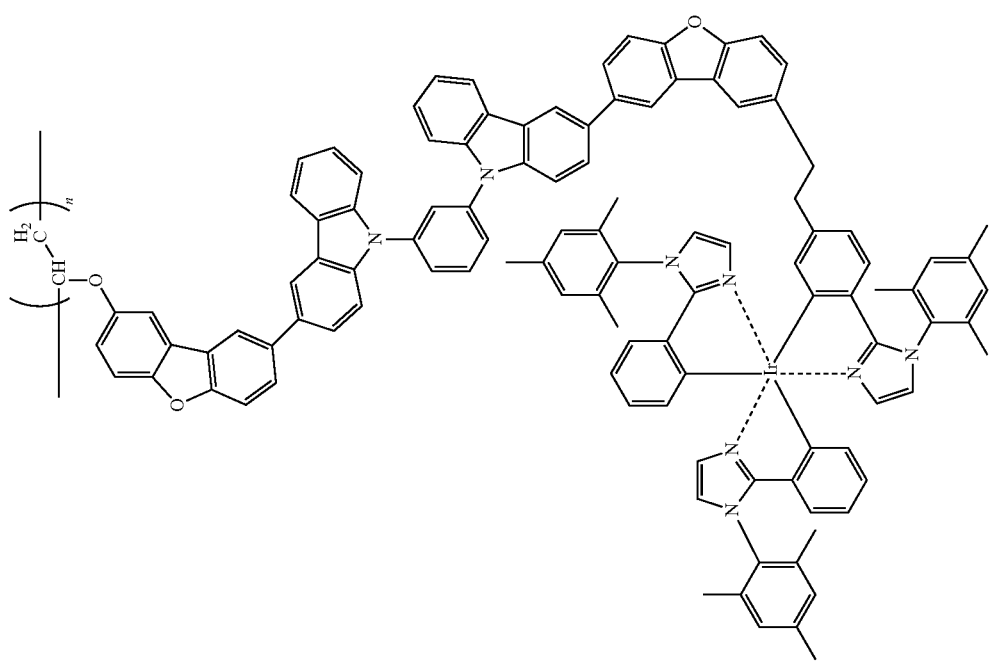
[Chem. 54]

-continued
H71
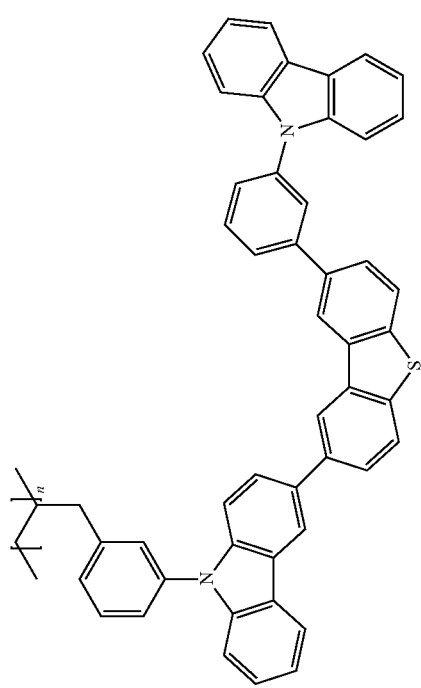
H72
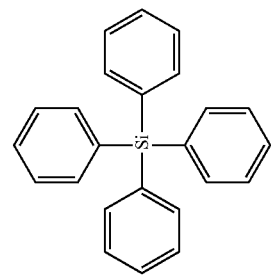
H73
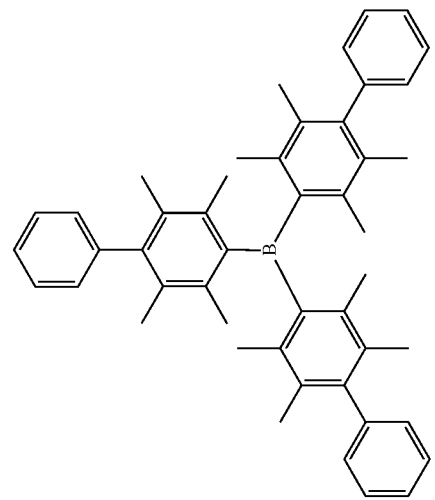
[Chem. 55]

-continued
H74
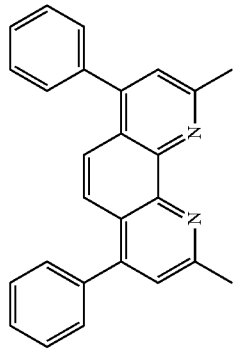
H75
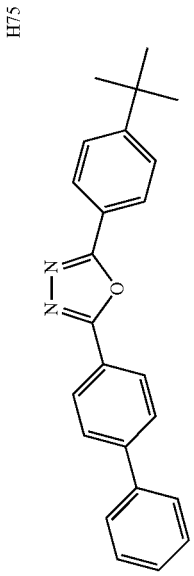
H76
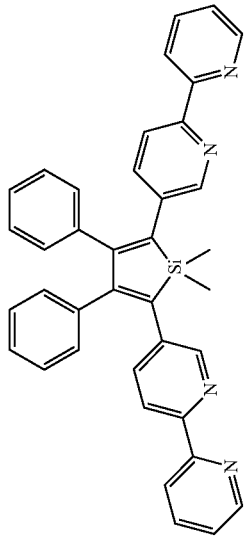
H77
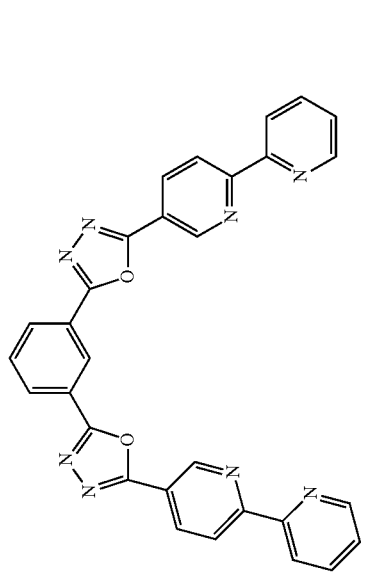
H78
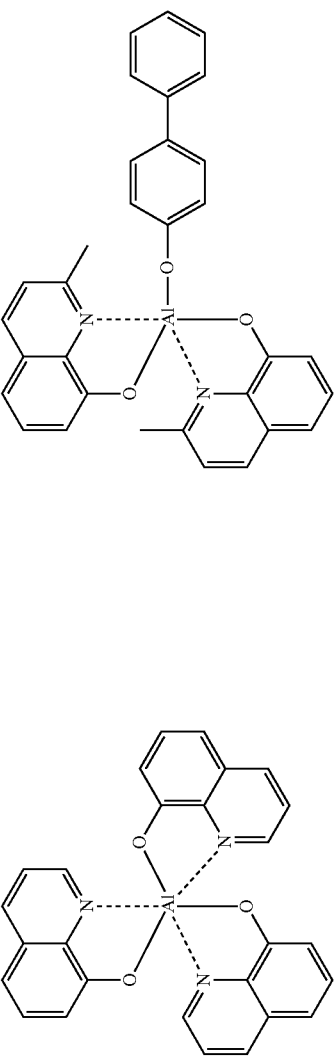
H79
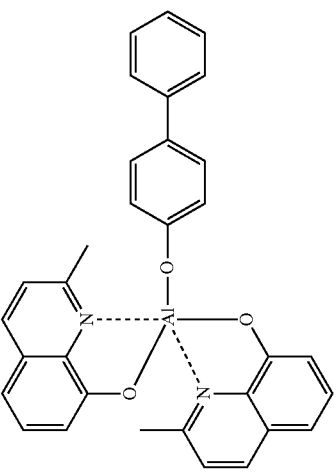

Examples of the known host compound applicable to the present invention include the compounds described in the following documents: e.g., Japanese Patent Laid-Open Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

<Luminescent Material>

Examples of the luminescent material that can be used in the present invention include phosphorescence-emitting compounds (hereinafter, also referred to as "phosphorescent compound" or "phosphorescent material").

The phosphorescent compound is a compound that emits light from an excited triplet state, specifically, a compound that emits phosphorescent light at room temperature (25° C.) and is defined as a compound having a phosphorescence quantum yield of 0.01 or more at 25° C. The phosphorescence quantum yield is preferably 0.1 or more.

The phosphorescence quantum yield can be measured by the method described in page 398 of Bunkoh II of Dai 4 Han Jikken Kagaku Koza 7 (Spectroscopy II of the 4th Series of Experimental Chemistry 7) (1992, published by Maruzen Co., Ltd.). In the measurement of the phosphorescence quantum yield in a solution, various solvents can be used. The only requirement for the phosphorescent compound according to the present invention is to achieve the above-mentioned phosphorescence quantum yield of 0.01 or more in any appropriate solvent.

The phosphorescent compound emits light based on any of the following two principles. One is based on energy transfer, wherein the recombination of carriers occurs on a host compound onto which the carriers are transferred to produce an excited state of the host compound, and then emission occurs from a phosphorescent compound via transfer of this energy to the phosphorescent compound. The other is based on carrier trap, wherein a phosphorescent compound serves as a carrier trap to cause recombination of carriers on the phosphorescent compound, and thereby emission from the phosphorescent compound occurs. In both types, it is essential that the energy in the excited state of the phosphorescent compound be lower than that in the excited state of the host compound.

The phosphorescent compound can be appropriately selected from known compounds that are used in the luminous layers of common organic EL elements and is preferably a complex compound containing a metal belonging to any one of Groups 8 to 10 on the periodic table of elements, more preferably an iridium compound, an osmium compound, a platinum compound (platinum complex compound), or a rare earth complex, and most preferably an iridium compound.

In the present invention, at least one luminous layer may contain two or more phosphorescent compounds. The concentration of the phosphorescent compounds in the luminous layer may vary in the thickness direction of the luminous layer.

The content of the phosphorescent compound preferably within a range of 0.1 to 30 vol % based on the total volume of the luminous layer.

<1> Compound Represented by Formula (A)

In the present invention, the phosphorescent compound preferably has a structure represented by Formula (A).

The phosphorescent compound (also referred to as phosphorescent metal complex) represented by Formula (A) is preferably contained in the luminous layer of the organic EL element (EL) as a luminescent dopant, but may be contained in the luminous unit other than the luminous layer.

[Chem. 56]

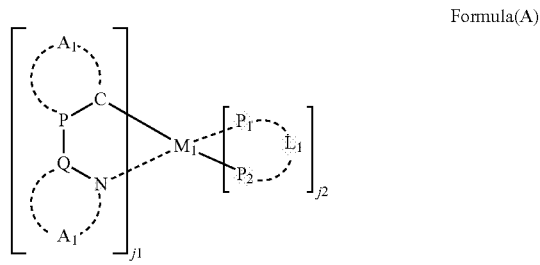

Formula(A)

In Formula (A), P and Q each independently represent a carbon atom or a nitrogen atom; $A_1$ represents an atomic group that forms an aromatic hydrocarbon ring or an aromatic heterocycle together with P—C; $A_2$ represents an atomic group that forms an aromatic heterocycle together with Q-N; $P_1$-$L_1$-$P_2$ represents a bidentate ligand, where $P_1$ and $P_2$ each independently represent a carbon atom, a nitrogen atom, or an oxygen atom, and $L_1$ represents an atomic group that forms the bidentate ligand together with $P_1$ and $P_2$; j1 represents an integer of 1 to 3; j2 represents an integer of 0 to 2, provided that the sum of j1 and j2 is 2 or 3; and $M_1$ represents a transition metal element belonging to any one of Groups 8 to 10 on the periodic table of elements.

In Formula (A), P and Q each independently represent a carbon atom or a nitrogen atom.

In Formula (A), examples of the aromatic hydrocarbon ring formed by $A_1$ together with P—C include benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthranthrene rings.

These rings may further have substituents. Examples of the substituents include alkyl groups (e.g., methyl, ethyl, propyl, isopropyl, tert-butyl, pentyl, hexyl, octyl, dodecyl, tridecyl, tetradecyl, and pentadecyl groups), cycloalkyl groups (e.g., cyclopentyl and cyclohexyl groups), alkenyl groups (e.g., vinyl and aryl groups), alkynyl groups (e.g., ethynyl and propargyl groups), aromatic hydrocarbon ring groups (also referred to as aromatic carbocyclic or aryl groups, e.g., phenyl, p-chlorophenyl, mesityl, tolyl, xylyl, naphthyl, anthryl, azulenyl, acenaphthenyl, fluorenyl, phenanthryl, indenyl, pyrenyl, and biphenylyl groups), aromatic heterocyclic groups (e.g., furyl, thienyl, pyridyl, pyridazinyl, pyrimidinyl, pyrazinyl, triazinyl, imidazolyl, pyrazolyl, thiazolyl, quinazolinyl, carbazolyl, carbolinyl, diazacarbazolyl (carbolinyl the carboline ring of which has one carbon atom of the ring replaced with a nitrogen atom), and phthalazinyl groups), heterocyclic groups (e.g., pyrrolidyl, imidazolidyl, morpholyl, and oxazolidyl groups), alkoxy groups (e.g., methoxy, ethoxy, propyloxy, pentyloxy, hexyloxy, octyloxy, and dodecyloxy groups), cycloalkoxy groups (e.g., cyclopentyloxy and cyclohexyloxy groups), aryloxy groups (e.g., phenoxy and naphthyloxy groups), alkylthio groups (e.g., methylthio, ethylthio, propylthio, pentylthio, hexylthio, octylthio, and dodecylthio groups), cycloalkylthio groups (e.g., cyclopentylthio and cyclohexylthio groups), arylthio groups (e.g., phenylthio and naphthylthio groups), alkoxycarbonyl groups (e.g., methyloxycarbonyl, ethyloxycarbonyl, butyloxycarbonyl, octyloxycarbonyl, and dodecyloxycarbonyl groups), aryloxycarbonyl groups (e.g., phenyloxycarbonyl and naphthyloxycarbonyl groups), sulfamoyl groups (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups), acyl groups (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups), acyloxy groups (e.g., acetyloxy, ethylcarbonyloxy, butylcarbonyloxy, octylcarbonyloxy, dodecylcarbonyloxy, and phenylcarbonyloxy groups), amido groups (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups), carbamoyl groups (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups), ureido groups (e.g., methylureido, ethylureido, pentylureido, cyclohexylureido, octylureido, dodecylureido, phenylureido, naphthylureido, and 2-pyridylaminoureido groups), sulfinyl groups (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups), alkylsulfonyl groups (e.g., methylsulfonyl, ethylsulfonyl, butylsulfonyl, cyclohexylsulfonyl, 2-ethylhexylsulfonyl, and dodecylsulfonyl groups), arylsulfonyl or heteroarylsulfonyl groups (e.g., phenylsulfonyl, naphthylsulfonyl, and 2-pyridylsulfonyl groups), amino groups (e.g., amino, ethylamino, dimethylamino, butylamino, cyclopentylamino, 2-ethylhexylamino, dodecylamino, anilino, naphthylamino, 2-pyridylamino, piperidyl (also referred to as piperidinyl), and 2,2,6,6-tetramethyl piperidinyl groups), halogen atoms (e.g., fluorine, chlorine, and bromine atoms), fluorohydrocarbon groups (e.g., fluoromethyl, trifluoromethyl, pentafluoroethyl, and pentafluorophenyl groups), a cyano group, a nitro group, a hydroxy group, a mercapto group, silyl groups (e.g., trimethylsilyl, triisopropylsilyl, triphenylsilyl, and phenyldiethylsilyl groups), phosphate groups (e.g., a dihexylphosphoryl group), phosphite groups (e.g., a diphenylphosphinyl group), and a phosphono group.

In Formula (A), examples of the aromatic heterocycle formed by $A_1$ together with P—C include furan, thiophene, oxazole, pyrrole, pyridine, pyridazine, pyrimidine, pyrazine, triazine, benzimidazole, oxadiazole, triazole, imidazole, pyrazole, thiazole, indole, benzimidazole, benzothiazole, benzoxazole, quinoxaline, quinazoline, phthalozine, carbazole, and azacarbazole rings.

Throughout the specification, the azacarbazole ring refers to a carbazole ring the benzene ring of which has at least one carbon atom of the ring replaced with a nitrogen atom.

These rings may further have substituents.

In Formula (A), examples of the aromatic heterocycle formed by $A_2$ together with Q-N include oxazole, oxadiazole, oxatriazole, isooxazole, tetrazole, thiadiazole, thiatriazole, isothiazole, pyrrole, pyridine, pyridazine, pyrimidine, pyrazine, triazine, imidazole, pyrazole, and triazole rings.

These rings may further have substituents.

In Formula (A), $P_1$-$L_1$-$P_2$ represents a bidentate ligand, where $P_1$ and $P_2$ each independently represent a carbon atom, a nitrogen atom, or an oxygen atom, and $L_1$ represents an atomic group that forms the bidentate ligand together with $P_1$ and $P_2$.

Examples of the bidentate ligand represented by $P_1$-$L_1$-$P_2$ include phenylpyridine, phenylpyrazole, phenylimidazole, phenyltriazole, phenyltetrazole, pyrazabole, acetylacetone, and picolinic acid.

In Formula (A), j1 represents an integer of 1 to 3; j2 represents an integer of 0 to 2, provided that the sum of j1 and j2 is 2 or 3. In particular, j2 is preferably 0.

In Formula (A), $M_1$ represents a transition metal element belonging to any one of Groups 8 to 10 on the periodic table of elements (also simply referred to as transition metal). In particular, $M_1$ represents iridium.

<2> Compound Represented by Formula (B)

The compounds having the structure represented by Formula (A) are preferably compounds further having a structure represented by Formula (B).

[Chem. 57]

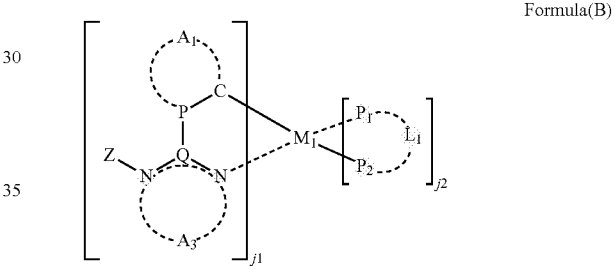

Formula(B)

In Formula (B), Z represents a hydrocarbon ring group or a heterocyclic group; P and Q each independently represent a carbon atom or a nitrogen atom; $A_1$ represents an atomic group that forms an aromatic hydrocarbon ring or an aromatic heterocycle together with P—C; $A_3$ represents —C($R_{01}$)=C($R_{02}$)—, —N=C($R_{02}$)—, —C($R_{01}$)=N—, or —N=N—; $R_{01}$ and $R_{02}$ each independently represent a hydrogen atom or a substituent; $P_1$-$L_1$-$P_2$ represents a bidentate ligand, where $P_1$ and $P_2$ each independently represent a carbon atom, a nitrogen atom, or an oxygen atom, and $L_1$ represents an atomic group that forms the bidentate ligand together with $P_1$ and $P_2$; j1 represents an integer of 1 to 3; j2 represents an integer of 0 to 2, provided that the sum of j1 and j2 is 2 or 3; and $M_1$ represents a transition metal element belonging to any one of Groups 8 to 10 on the periodic table of elements.

In Formula (B), examples of the hydrocarbon ring group represented by Z include non-aromatic hydrocarbon ring groups and aromatic hydrocarbon ring groups. Examples of the non-aromatic hydrocarbon ring group include a cyclopropyl group, a cyclopentyl group, and a cyclohexyl group. These groups may be unsubstituted groups or may have the same substituents that are optionally possessed by the ring represented by $A_1$ in Formula (A).

Examples of the aromatic hydrocarbon ring group (also referred to as aromatic hydrocarbon group or aryl group) include phenyl, p-chlorophenyl, mesityl, tolyl, xylyl, naphthyl, anthryl, azulenyl, acenaphthenyl, fluorenyl, phenanthryl, indenyl, pyrenyl, and biphenylyl groups.

These groups may be unsubstituted or may have substituents. Examples of the substituents include those that are optionally possessed by the ring represented by $A_1$ in Formula (A).

In Formula (B), examples of the heterocyclic group represented by Z include non-aromatic heterocyclic groups and aromatic heterocyclic groups. Examples of the non-aromatic heterocyclic groups include groups derived from, for example, epoxy, aziridine, thiirane, oxetane, azetidine, thietane, tetrahydrofuran, dioxolane, pyrrolidine, pyrazolidine, imidazolidine, oxazolidine, tetrahydrothiophene, sulfolane, thiazolidine, $\epsilon$-caprolactone, $\epsilon$-caprolactam, piperidine, hexahydropyridazine, hexahydropyrimidine, piperazine, morpholine, tetrahydropyran, 1,3-dioxane, 1,4-dioxane, trioxane, tetrahydrothiopyran, thiomorpholine, thiomorpholine-1,1-dioxide, pyranose, and diazabicyclo[2,2,2]-octane rings.

These groups may be unsubstituted or may have substituents. Examples of the substituents include those that are optionally possessed by the ring represented by $A_1$ in Formula (A).

Examples of the aromatic heterocyclic groups include pyridyl, pyrimidinyl, furyl, pyrrolyl, imidazolyl, benzimidazolyl, pyrazolyl, pyrazinyl, triazolyl (e.g., 1,2,4-triazol-1-yl and 1,2,3-triazol-1-yl groups), oxazolyl, benzoxazolyl, thiazolyl, isoxazolyl, isothiazolyl, furazanyl, thienyl, quinolyl, benzofuryl, dibenzofuryl, benzothienyl, dibenzothienyl, indolyl, carbazolyl, carbolinyl, diazacarbazolyl(carbolinyl the carboline ring of which has one carbon atom of the ring replaced with a nitrogen atom), quinoxalinyl, pyridazinyl, triazinyl, quinazolinyl, and phthalazinyl groups.

These groups may be unsubstituted or may have substituents. Examples of the substituents include those that are optionally possessed by the ring represented by $A_1$ in Formula (A).

The group represented by Z is preferably an aromatic hydrocarbon ring group or an aromatic heterocyclic group.

In Formula (B), examples of the aromatic hydrocarbon ring formed by $A_1$ together with P—C include benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthranthrene rings.

These rings may further have substituents. Examples of the substituents include those that are optionally possessed by the ring represented by $A_1$ in Formula (A).

In Formula (B), examples of the aromatic heterocycle formed by $A_1$ together with P—C include furan, thiophene, oxazole, pyrrole, pyridine, pyridazine, pyrimidine, pyrazine, triazine, benzimidazole, oxadiazole, triazole, imidazole, pyrazole, thiazole, indole, benzimidazole, benzothiazole, benzoxazole, quinoxaline, quinazoline, phthalozine, carbazole, carboline, and azacarbazole rings.

Throughout the specification, the azacarbazole ring refers to a carbazole ring the benzene ring of which has at least one carbon atom of the ring replaced with a nitrogen atom.

These rings may further have substituents. Examples of the substituents include those that are optionally possessed by the ring represented by $A_1$ in Formula (A).

In —C($R_{01}$)=C($R_{02}$)—, —N=C($R_{02}$), and C($R_{01}$)=N— represented by $A_3$ in Formula (B), the substituent represented by $R_{01}$ or $R_{02}$ is synonymous with the substituent that is optionally possessed by the ring represented by $A_1$ in Formula (A).

In Formula (B), examples of the bidentate ligand represented by $P_1$-$L_1$-$P_2$ include phenylpyridine, phenylpyrazole, phenylimidazole, phenyltriazole, phenyltetrazole, pyrazabole, acetylacetone, and picolinic acid.

In addition, j1 represents an integer of 1 to 3, and j2 represents an integer of 0 to 2, provided that the sum of j1 and j2 is 2 or 3. In particular, j2 is preferably 0.

In Formula (B), the transition metal element belonging to any one of Groups 8 to 10 on the periodic table of elements (also simply referred to as transition metal) represented by $M_1$ is synonymous with that represented by $M_1$ in Formula (A).

<3> Compound Having a Structure Represented by Formula (C)

In the present invention, preferred embodiments of the compound having a structure represented by Formula (B) include compounds having a structure represented by Formula (C).

[Chem. 58]

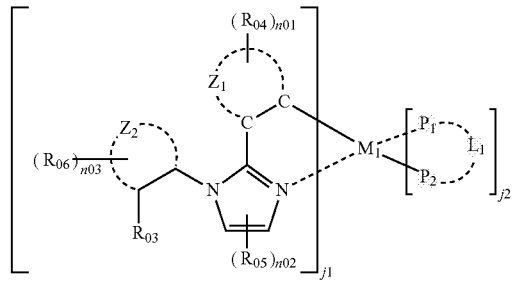

Formula(C)

In Formula (C), $R_{03}$ represents a substituent; $R_{04}$ represents a hydrogen atom or a substituent, where two or more of $R_{04}$'s optionally bond to each other to form a ring; n01 represents an integer of 1 to 4; $R_{05}$ represents a hydrogen atom or a substituent, where two or more of $R_{05}$'s optionally bond to each other to form a ring; n02 represents an integer of 1 to 2; $R_{06}$ represents a hydrogen atom or a substituent, where two or more of $R_{06}$'s optionally bond to each other to form a ring; n03 represents an integer of 1 to 4; $Z_1$ represents an atomic group necessary for forming a 6-membered aromatic hydrocarbon ring or a 5- or 6-membered aromatic heterocycle together with C—C; $Z_2$ represents an atomic group necessary for forming a hydrocarbon ring group or a heterocyclic group; $P_1$-$L_1$-$P_2$ represents a bidentate ligand, where $P_1$ and $P_2$ each independently represent a carbon atom, a nitrogen atom, or an oxygen atom, and $L_1$ represents an atomic group that forms the bidentate ligand together with $P_1$ and $P_2$; j1 represents an integer of 1 to 3; j2 represents an integer of 0 to 2, provided that the sum of j1 and j2 is 2 or 3; $M_1$ represents a transition metal element belonging to any one of Groups 8 to 10 on the periodic table of elements; and $R_{06}$ optionally bonds to $R_{03}$, $R_{04}$, or $R_{05}$ to form a ring.

In Formula (C), the substituent represented by $R_{03}$, $R_{04}$, $R_{05}$, or $R_{06}$ is synonymous with the substituent that is optionally possessed by the ring represented by $A_1$ in Formula (A).

In Formula (C), a typical 6-membered aromatic hydrocarbon ring formed by $Z_1$ together with C—C is a benzene ring.

These rings may further have substituents. Examples of the substituents include those that are optionally possessed by the ring represented by $A_1$ in Formula (A).

In Formula (C), examples of the 5- or 6-membered aromatic heterocycle formed by $Z_1$ together with C—C include oxazole, oxadiazole, oxatriazole, isooxazole, tetrazole, thiadiazole, thiatriazole, isothiazole, thiophene, furan, pyrrole, pyridine, pyridazine, pyrimidine, pyrazine, triazine, imidazole, pyrazole, and triazole rings.

These rings may further have substituents. Examples of the substituents include those that are optionally possessed by the ring represented by $A_1$ in Formula (A).

In Formula (C), examples of the hydrocarbon ring group represented by $Z_2$ include non-aromatic hydrocarbon ring groups and aromatic hydrocarbon ring groups. Examples of the non-aromatic hydrocarbon ring groups include cyclopropyl, cyclopentyl, and cyclohexyl groups. These groups may be unsubstituted or may have substituents. Examples of the substituents include those that are optionally possessed by the ring represented by $A_1$ in Formula (A).

Examples of the aromatic hydrocarbon ring group (also referred to as aromatic hydrocarbon group or aryl group) include phenyl, p-chlorophenyl, mesityl, tolyl, xylyl, naphthyl, anthryl, azulenyl, acenaphthenyl, fluorenyl, phenanthryl, indenyl, pyrenyl, and biphenylyl groups. These groups may be unsubstituted or may have substituents. Examples of the substituents include those that are optionally possessed by the ring represented by $A_1$ in Formula (A).

In Formula (C), examples of the heterocyclic group represented by $Z_2$ include non-aromatic heterocyclic groups and aromatic heterocyclic groups. Examples of the non-aromatic heterocyclic groups include groups derived from, for example, epoxy, aziridine, thiirane, oxetane, azetidine, thietane, tetrahydrofuran, dioxolane, pyrrolidine, pyrazolidine, imidazolidine, oxazolidine, tetrahydrothiophene, sulfolane, thiazolidine, ε-caprolactone, ε-caprolactam, piperidine, hexahydropyridazine, hexahydropyrimidine, piperazine, morpholine, tetrahydropyran, 1,3-dioxane, 1,4-dioxane, trioxane, tetrahydrothiopyran, thiomorpholine, thiomorpholine-1,1-dioxide, pyranose, and diazabicyclo[2,2,2]-octane rings. These groups may be unsubstituted or may have substituents. Examples of the substituents include those that are optionally possessed by the ring represented by $A_1$ in Formula (A).

Examples of the aromatic heterocyclic groups include pyridyl, pyrimidinyl, furyl, pyrrolyl, imidazolyl, benzimidazolyl, pyrazolyl, pyrazinyl, triazolyl (e.g., 1,2,4-triazol-1-yl and 1,2,3-triazol-1-yl), oxazolyl, benzoxazolyl, thiazolyl, isoxazolyl, isothiazolyl, furazanyl, thienyl, quinolyl, benzofuryl, dibenzofuryl, benzothienyl, dibenzothienyl, indolyl, carbazolyl, carbolinyl, diazacarbazolyl (carbolinyl the carboline ring of which has one carbon atom of the ring replaced with a nitrogen atom), quinoxalinyl, pyridazinyl, triazinyl, quinazolinyl, and phthalazinyl groups.

These groups may be unsubstituted or may have substituents. Examples of the substituents include those that are optionally possessed by the ring represented by $A_1$ in Formula (A).

In Formula (C), the group formed by $Z_1$ or $Z_2$ is preferably a benzene ring.

In Formula (C), the bidentate ligand represented by $P_1$-$L_1$-$P_2$ is synonymous with that represented by $P_1$-$L_1$-$P_2$ in Formula (A).

In Formula (C), the transition metal element belonging to any one of Groups 8 to 10 on the periodic table of elements represented by $M_1$ is synonymous with that represented by $M_1$ in Formula (A).

The phosphorescent compound can be appropriately selected from known compounds that are used in the luminous layer of the organic EL element 100.

The phosphorescent compound according to the present invention is preferably a complex compound containing a metal belonging to any one of Groups 8 to 10 on the periodic table of elements, more preferably an iridium compound, an osmium compound, a platinum compound (platinum complex compound), or a rare earth complex, and most preferably an iridium compound.

Examples of the phosphorescent compound according to the present invention are shown, but not limited to, below (Pt-1 to Pt-3, A-1, and Ir-1 to Ir-45). In these compounds, m and n each represent the number of repetition.

[Chem. 59]

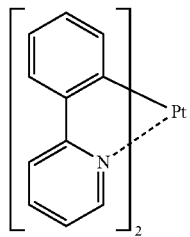

Pt-1

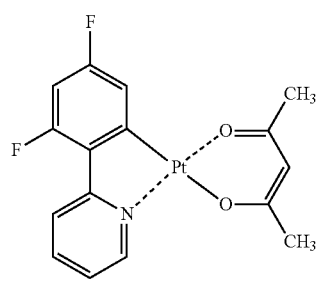

Pt-2

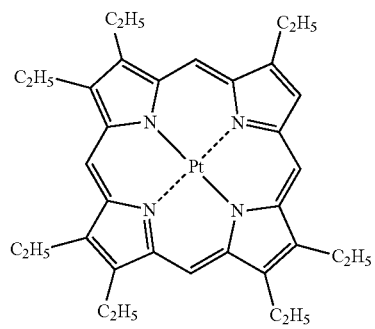

Pt-3

-continued
A-1
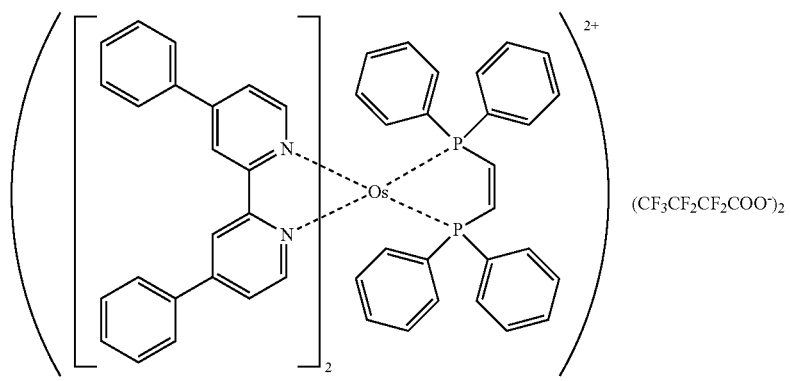
[Chem. 60]
Ir-1
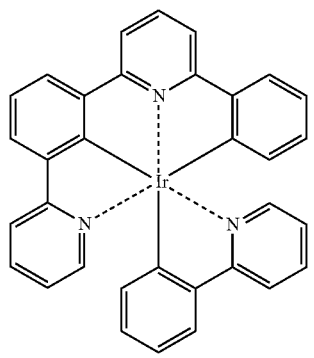
Ir-2
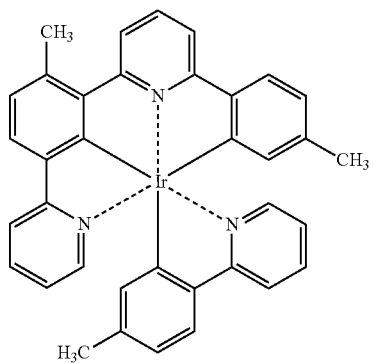
Ir-3
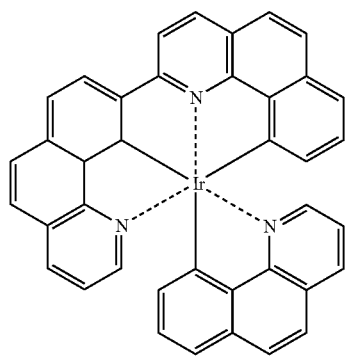
Ir-4
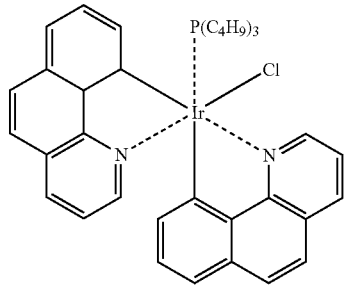
Ir-5
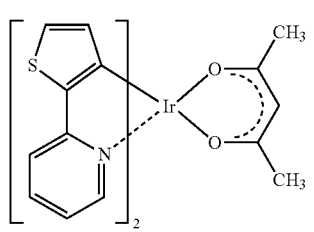
Ir-6
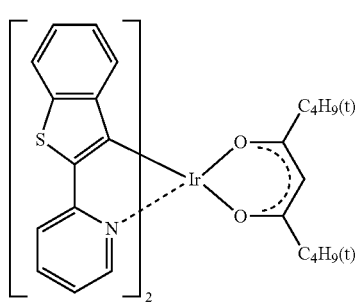

[Chem. 61]
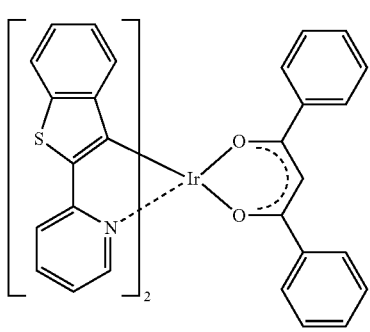 Ir-7
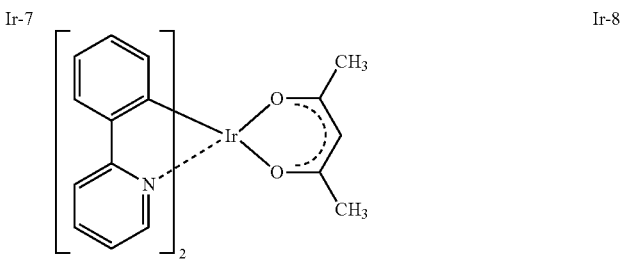 Ir-8
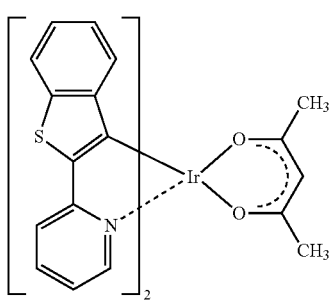 Ir-9
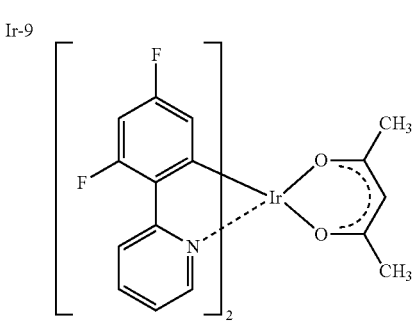 Ir-10
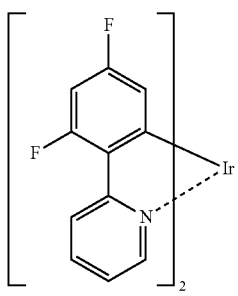 Ir-11
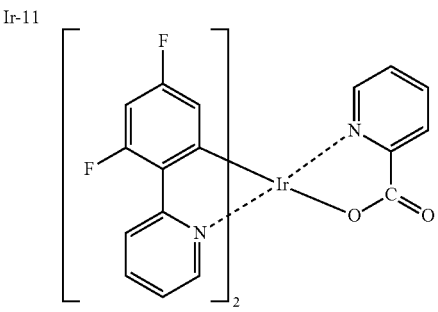 Ir-12
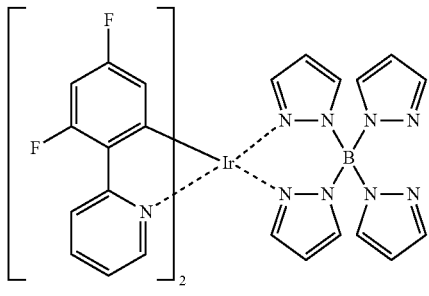 Ir-13
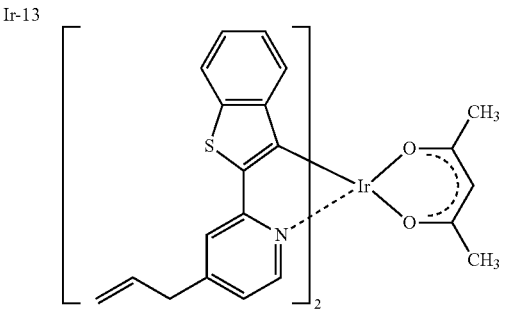 Ir-14
[Chem. 62]
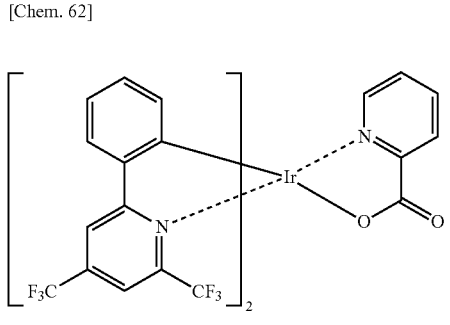 Ir-15
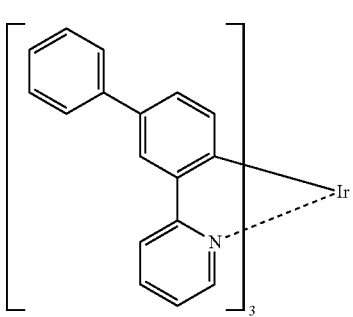 Ir-16

-continued
Ir-17
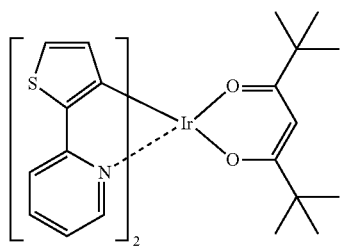
Ir-18
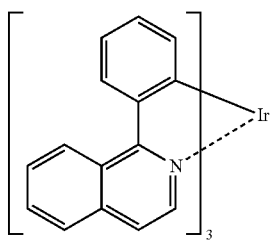
Ir-19
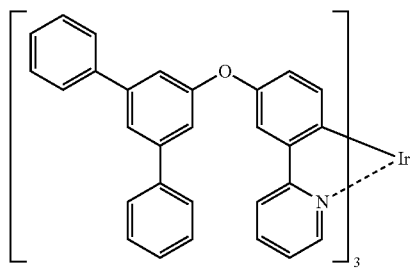
Ir-20
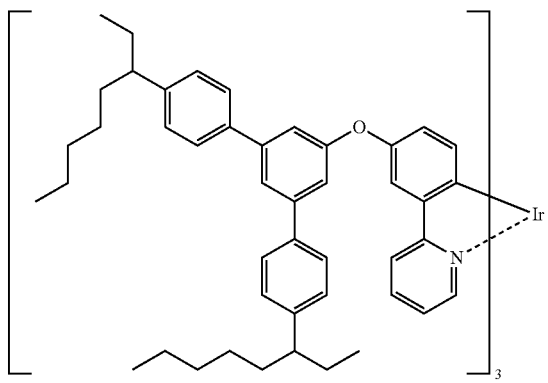
Ir-21
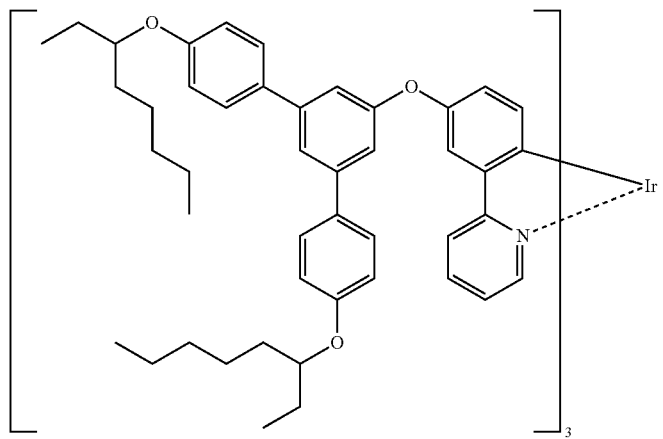
[Chem. 63]
Ir-22
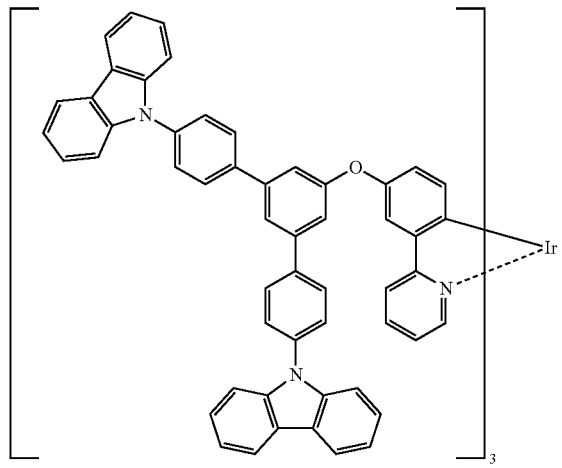
Ir-23
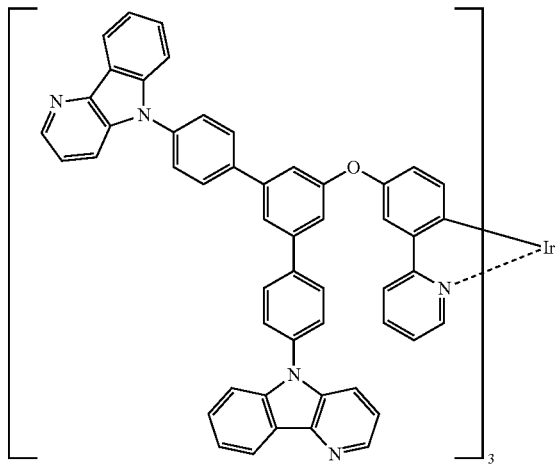

Ir-24 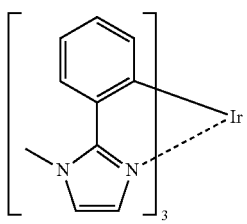
Ir-25 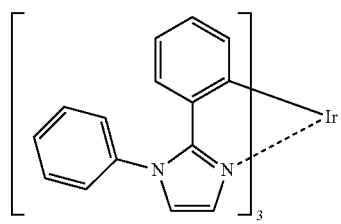
Ir-26
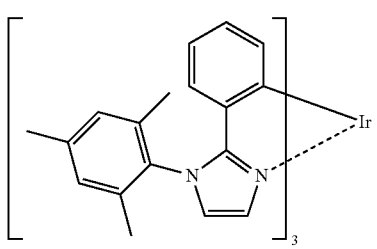
[Chem. 64]
Ir-27 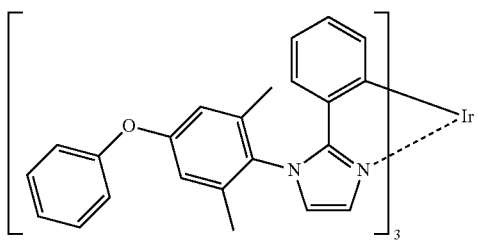
Ir-28 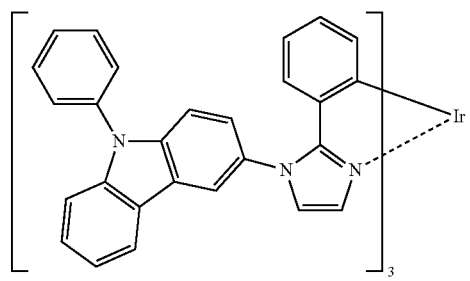
Ir-29 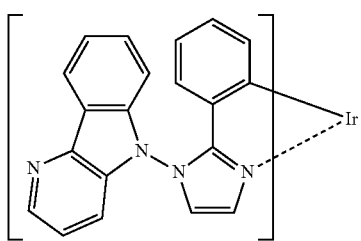
Ir-30 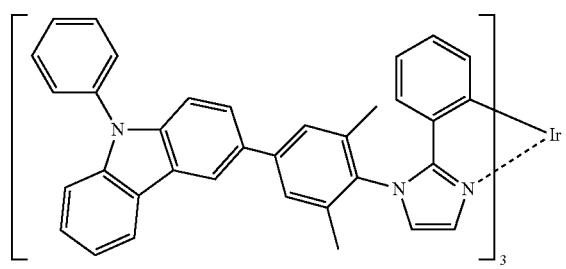
Ir-31 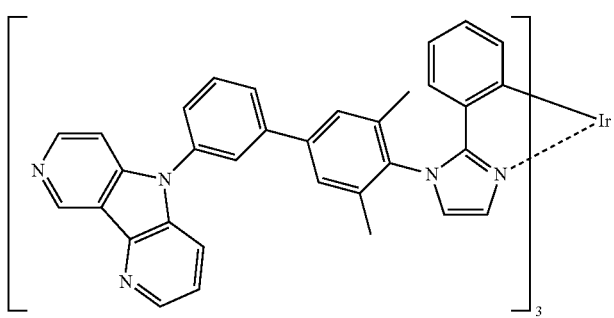

-continued
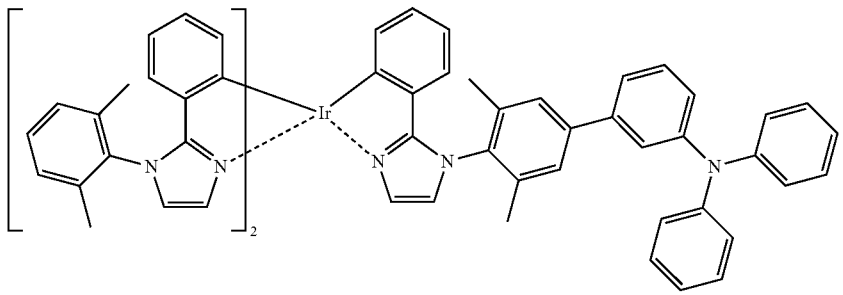
Ir-32
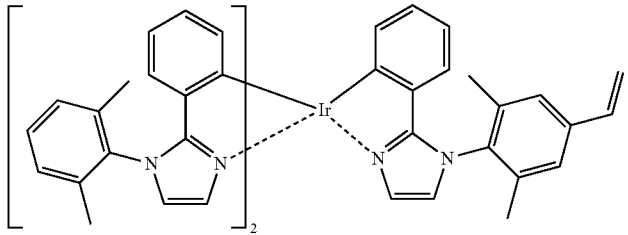
Ir-33
[Chem. 65]
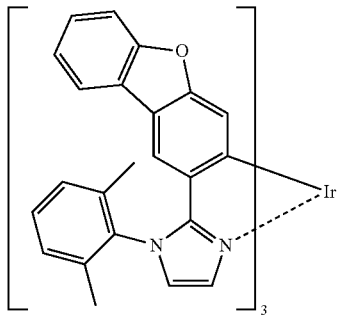
Ir-34
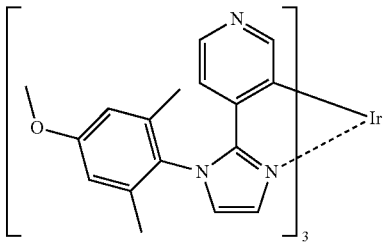
Ir-35
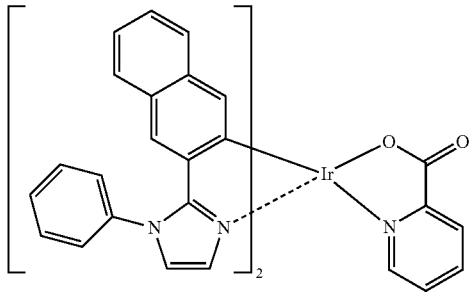
Ir-36
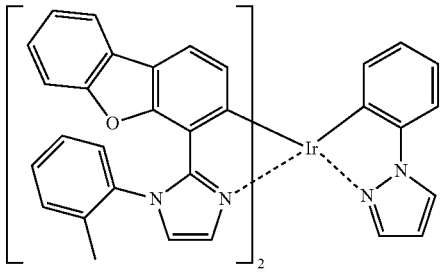
Ir-37
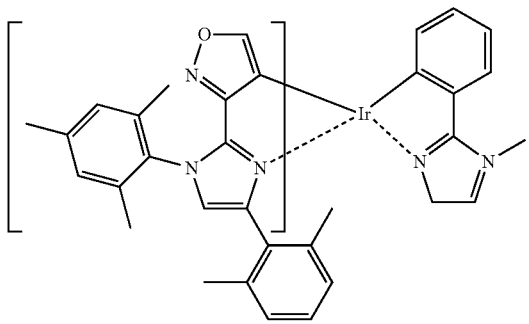
Ir-38
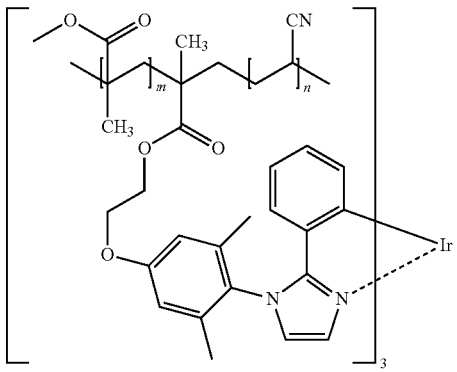
Ir-39

-continued
[Chem. 66]
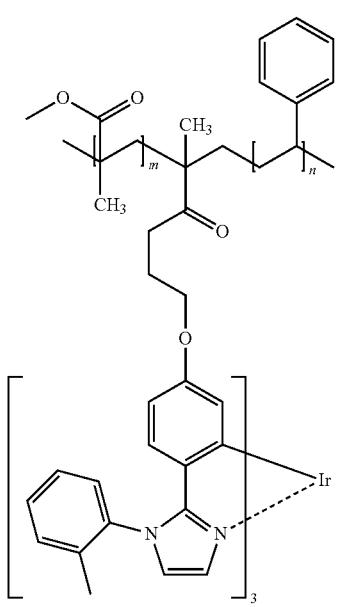
Ir-40
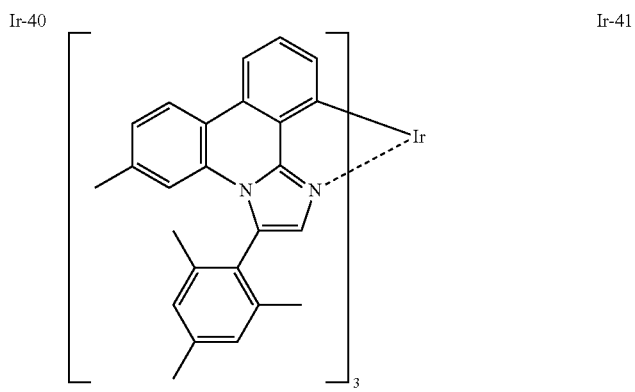
Ir-41
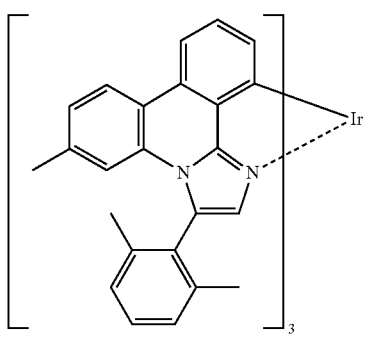
Ir-42
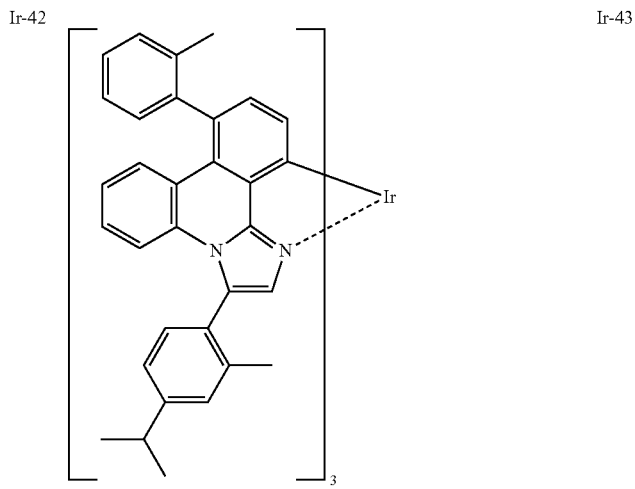
Ir-43
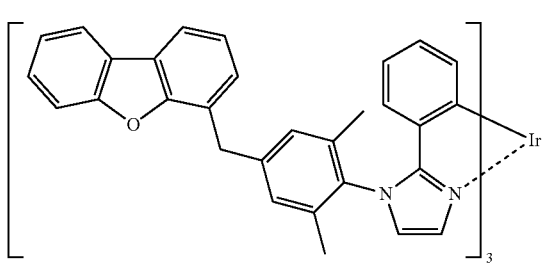
Ir-44
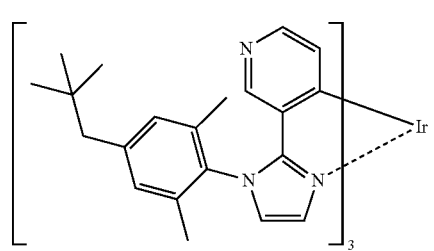
Ir-45

[Chem. 67]

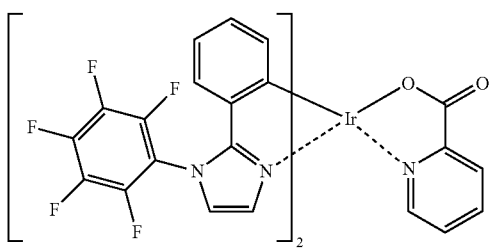
Ir-46

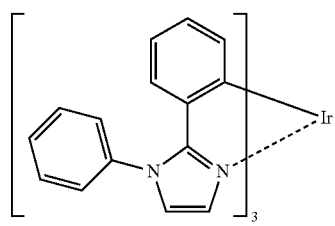
Ir-47

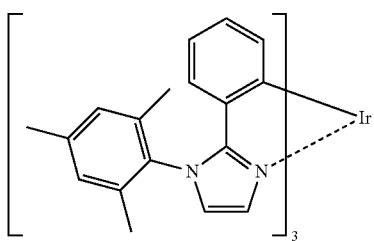
Ir-48

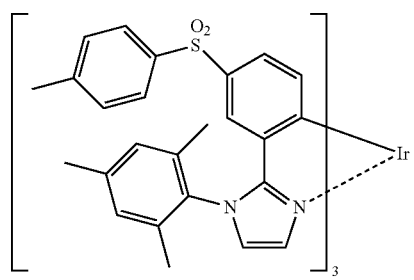
Ir-49

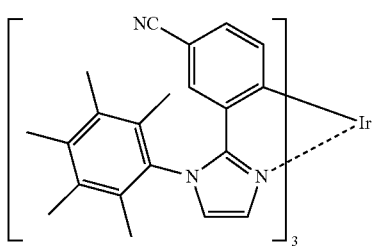
Ir-50

The phosphorescent compound (also referred to as phosphorescent metal complex) can be synthesized by a method described in, for example, Organic Letter, vol. 3, No. 16, pp. 2579-2581 (2001); Inorganic Chemistry, vol. 30, No. 8, pp. 1685-1687 (1991); J. Am. Chem. Soc., vol. 123, p. 4304 (2001), Inorganic Chemistry, vol. 40, No. 7, pp. 1704-1711 (2001), Inorganic Chemistry, vol. 41, No. 12, pp. 3055-3066 (2002), New Journal of Chemistry., vol. 26, p. 1171 (2002), European Journal of Organic Chemistry, vol. 4, pp. 695-709 (2004), and references mentioned in these documents.

<Fluorescent Material>

Examples of the fluorescent material include coumarin dyes, pyran dyes, cyanine dyes, chloconium dyes, squarylium dyes, oxobenzanthracene dyes, fluorescene dyes, rhodamine dyes, pyrylium dyes, perylene dyes, stilbene dyes, polythiophene dyes, and rare earth fluorescent complexes.

(Injecting Layer)

The injecting layer (hole-injecting layer or electron-injecting layer) is disposed between an electrode and a luminous layer for reducing the driving voltage and increasing the luminance and is described in detail in "Denkyoku zairyo (Electrode material)", Div. 2 Chapter 2 (pp. 123-166) of "Yuki EL soshi to sono kogyoka saizensen (Organic EL element and its frontier of industrialization)" (published by NTS Corporation, Nov. 30, 1998). The injecting layer is a hole-injecting layer or an electron-injecting layer.

The injecting layer is optionally disposed. A hole-injecting layer may be disposed between the anode and the luminous layer or the hole-transporting layer. An electron-injecting layer may be disposed between the cathode and the luminous layer or the electron-transporting layer.

The hole-injecting layer is described in detail in Japanese Patent Laid-Open Publication Nos. H09-45479, H09-260062, and H08-288069 for example, and examples thereof include phthalocyanine layers, such as a copper phthalocyanine layer; oxide layers, such as a vanadium oxide layer; amorphous carbon layers; and polymer layers containing electrically conductive polymers such as polyaniline (emeraldine) or polythiophene.

The electron-injecting layer is described in detail in Japanese Patent Laid-Open Publication Nos. H06-325871, H09-17574, and H10-74586 for example, and examples thereof include metal layers, such as a strontium or aluminum layer; alkali metal halide layers, such as a potassium fluoride layer; alkali earth metal compound layers, such as a magnesium fluoride layer; and oxide layers, such as a molybdenum oxide layer. In the present invention, the electron-injecting layer is desirably a significantly thin film, and preferably has a thickness in a range of 1 nm to 10 μm depending on the material.

(Hole-Transporting Layer)

The hole-transporting layer includes a hole-transporting material having hole transportability. The hole-injecting layer and the electron-blocking layer are also categorized into the hole-transporting layer in a broad sense. The hole-transporting layer may have a monolayer or multilayer structure.

The hole-transporting material has a hole injectability or transportability or an electron blockability and may be either an organic or inorganic material. Examples of the hole-transporting material include derivatives of triazole, oxadiazole, imidazole, polyarylalkane, pyrazoline, pyrazolone, phenylenediamine, arylamine, amino substituted chalcone, oxazole, styryl anthracene, fluorenone, hydrazone, stilbene, and silazane; aniline copolymers; and electrically conductive polymers/oligomers, such as thiophene oligomers.

These compounds can be used as hole-transporting materials. In addition, porphyrin compounds, aromatic tertiary amine compounds, and styrylamine compounds, in particular, aromatic tertiary amine compounds are preferred.

Typical examples of the aromatic tertiary amine compound and the styrylamine compound include N,N,N',N'-tetraphenyl-4,4'-diaminophenyl, N,N'-diphenyl-N,N'-bis(3-methylphenyl)-(1,1'-biphenyl)-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds having two condensed aromatic rings in the molecule, described in U.S. Pat. No. 5,061,569, such as 4,4'-bis[N-(1-naphthyl)-N-phenylamino]biphenyl (NPD), and compounds described in Japanese Patent Laid-Open Publication No. H04-308688, such as 4,4',4"-tris[N-(3-methylphenyl)-N-phenylamino]triphenylamine (MTDATA) in which three triphenylamine units are bonded into a starburst form.

Polymer materials having the compounds mentioned above introduced into the polymer chains or having the compounds mentioned above as main chains can also be used. Inorganic compounds such as p-type Si and p-type SiC can also be used as the hole-injecting material or the hole-transporting material.

So-called p-type hole-transporting materials as described in Japanese Patent Laid-Open Publication No. 1111-251067 or in J. Huang, et al., Applied Physics Letters, 80 (2002), p. 139 can also be used. In the present invention, these materials are preferably used, from the viewpoint of providing highly efficient light-emitting elements.

The hole-transporting layer can be formed as a thin film from the hole-transporting material by a known process, such as vacuum vapor deposition, spin coating, casting, printing including ink jetting, or a Langmuir Blodgett (LB) method. The hole-transporting layer may have any thickness, which is usually approximately 5 nm to 5 μm, preferably 5 to 200 nm. The hole-transporting layer may have a monolayer structure composed of one or more of these materials.

A hole-transporting layer having high p-type properties doped with an impurity can also be used. Examples thereof include those described in, for example, Japanese Patent Laid-Open Publication Nos. H04-297076, 2000-196140, and 2001-102175 and J. Appl. Phys., 95, 5773 (2004).

The use of such a hole-transporting layer having high p-type properties is preferred for producing an element with lower power consumption.

(Electron-Transporting Layer)

The electron-transporting layer includes a material having electron transportability, and the electron-injecting layer and the hole-blocking layer are categorized into the electron-transporting layer in a broad sense. The electron-transporting layer may have a monolayer or multilayer structure.

In an electron-transporting layer having a monolayer structure and the electron-transporting layer having a multilayer structure, the electron-transporting material (also serving as a hole-blocking material) of the layer adjacent to the luminous layer may be any material that has a function of transporting electrons injected from the cathode into the luminous layer. Such a material can be selected from known compounds. Examples of the material include nitro-substituted fluorene derivatives, diphenylquinone derivatives, thiopyran dioxide derivatives, carbodiimide, fluolenylidenemethane derivatives, anthraquinodimethane and anthrone derivatives, and oxadiazole derivatives. Furthermore, thiadiazole derivatives in which oxygen atoms of the oxadiazole rings of the oxadiazole derivatives mentioned above are replaced with sulfur atoms and quinoxaline derivatives having quinoxaline rings known as electron extraction groups can be used as the material for the electron-transporting layer. Polymer materials having these compounds introduced into the polymer chains or having these compounds as main chains can also be used.

Examples of the usable material for the electron-transporting layer include metal complexes of 8-quinolinol derivatives, such as aluminum tris(8-quinolinol) ($Alq_3$), aluminum tris(5,7-dichloro-8-quinolinol), aluminum tris(5,7-dibromo-8-quinolinol), aluminum tris(2-methyl-8-quinolinol), aluminum tris(5-methyl-8-quinolinol), and zinc bis(8-quinolinol) (Znq); and metal complexes in which the central metals of the metal complexes mentioned above are replaced with In, Mg, Cu, Ca, Sn, Ga, or Pb.

In addition, the material for the electron-transporting layer may be a metal-free or metal-containing phthalocyanine or its derivative having an end substituted by an alkyl or sulfonate group, for example. Alternatively, the material for the electron-transporting layer may be a distyrylpyrazine derivative exemplified as a material for the luminous layer or an inorganic semiconductor, such as n-type Si and n-type SiC, as in the hole-injecting layer or the hole-transporting layer.

The electron-transporting layer can be formed as a thin film from the above-mentioned material by a known process, such as vacuum vapor deposition, spin coating, casting, printing including ink jetting, or an LB method. The electron-transporting layer may have any thickness, which is usually approximately 5 nm to 5 μm, preferably 5 to 200 nm. The electron-transporting layer may have a monolayer structure composed of one or more of the above-mentioned materials.

An electron-transporting layer having high n-type properties doped with an impurity can also be used. Examples thereof include those described in, for example, Japanese Patent Laid-Open Publication Nos. H04-297076, H10-270172, 2000-196140, and 2001-102175 and J. Appl. Phys., 95, 5773 (2004). In addition, the electron-transporting layer preferably contains potassium or a potassium compound, such as potassium fluoride. An increase in the n-type properties of the electron-transporting layer as described above can provide an organic EL element with lower power consumption.

The material (electron-transporting compound) for the electron-transporting layer may be the same material for the intermediate layer described above. This can be similarly applied to an electron-transporting layer simultaneously functioning as an electron-injecting layer, i.e., the material of the layer may be the same material for the intermediate layer.

(Blocking Layer)

The blocking layer (hole-blocking layer or electron-blocking layer) is optionally provided in addition to each constitutive layer of the luminous unit 4 described above. The blocking layer is, for example, a hole-blocking layer described in Japanese Patent Laid-Open Publication Nos. H11-204258 and H11-204359 and on page 237 of "Organic EL element and its frontier of industrialization" (published by NTS Corporation, Nov. 30, 1998) for example.

The hole-blocking layer functions as an electron-transporting layer in a broad sense and includes a hole-blocking material having electron transportability but extremely poor hole transportability and can increase the probability of recombination of electrons and holes by transporting electrons and blocking holes. The structure of an electron-transporting layer can be optionally used as a hole-blocking layer. The hole-blocking layer is preferably disposed to adjoin the luminous layer.

Meanwhile, the electron-blocking layer functions as a hole-transporting layer in a broad sense and includes a material having hole transportability but extremely poor electron transportability and can increase the probability of recombination of electrons and holes by transporting holes and blocking electrons. The structure of a hole-transporting layer can be optionally used as an electron-blocking layer. The hole-blocking layer according to the present invention preferably has a thickness within a range of 3 to 100 nm, more preferably 5 to 30 nm.

[Second Electrode]

The second electrode 7 is an electrode film for supplying holes to the luminous unit 4 and is composed of a metal, an alloy, an organic or inorganic electrically conductive compound, or a mixture thereof. Examples of the material include gold, aluminum, silver, magnesium, lithium, mixtures of magnesium and copper, mixtures of magnesium and silver, mixtures of magnesium and aluminum, mixtures of magnesium and indium, indium, mixtures of lithium and aluminum, rare-earth metals, and oxide semiconductors such as ITO, ZnO, $TiO_2$, and $SnO_2$.

The second electrode 7 can be formed in the form of a thin film from such a conductive material by, for example, vapor deposition or sputtering. The second electrode 7 preferably has a sheet resistance of several hundred ohms per square or less and a thickness usually within a range of 5 nm to 5 μm, preferably 5 to 200 nm.

If the organic EL element (EL) is of a double-sided emission type, which extracts light also through the second electrode 7 (for example, the structure shown in FIG. 6), the intermediate electrode layer should have high optical transparency. In also this case, the above-described nitrogen-containing layer may be disposed to adjoin the transparent conductive metal layer.

[Sealing Member]

Examples of the sealing means for sealing the organic EL element (EL) include bonding a sealing member to the second electrode 7 and the substrate 1 with an adhesive.

The sealing member is disposed so as to cover the displaying area of the organic EL element (EL) and may be a concave plate or a flat plate. The sealing member may have any transparence and electrical insulation.

Examples of the sealing member include glass plates, polymer plates and films, and metal plates and films. Examples of the glass plate include plates of soda-lime glass, barium/strontium-containing glass, lead glass, aluminosilicate glass, borosilicate glass, barium borosilicate glass, and quartz. Examples of the polymer plate include plates of polycarbonates, acryl, poly(ethylene terephthalate), poly(ether sulfide), and polysulfones. Examples of the metal plate include plates composed of at least one metal or alloy selected from the group consisting of stainless steel, iron, copper, aluminum, magnesium, nickel, zinc, chromium, titanium, molybdenum, silicon, germanium, and tantalum.

The sealing member is preferably a polymer film or a metal film, from the viewpoint of a reduction in the total thickness of the organic EL element (EL). The polymer film preferably has an oxygen permeability of $1 \times 10^3$ g/(m²·day) or less and a vapor permeability of $1 \times 10^{-3}$ g/(m²·day) or less, more preferably an oxygen permeability of $1 \times 10^{-5}$ g/(m²·day) or less and a vapor permeability of $1 \times 10^{-5}$ g/(m²·day) or less.

The sealing member is formed into a concave shape by, for example, sand blasting or chemical etching. Examples of the adhesive include photo-curable or thermo-curable adhesives having reactive vinyl groups, such as acrylic acid oligomers and methacrylic acid oligomers; moisture curable adhesives such as 2-cyanoacrylate; and thermally or chemically curable (two-liquid mixing type) adhesives, such as epoxy adhesives. Examples of the adhesive also include hot-melt polyamide, polyester, and polyolefin adhesives; and cationically UV curable epoxy resin adhesives.

Since the organic EL element (EL) may be degraded during heat treatment, preferred adhesives are curable at a temperature within a range of room temperature to 80° C. A drying agent may be dispersed in the adhesive. The adhesive may be applied to the sealing member with a commercially available dispenser or by printing, such as screen printing.

It is also preferred that an inorganic or organic layer is formed as a sealing film on the exterior of the second electrode 7 placed on the luminous unit 4 on the substrate 1 so as to cover the second electrode 7 and the luminous unit 4 and to come into contact with the substrate 1. In such a case, the sealing film may be formed of any material that can block the migration of substances, such as water and oxygen, which causes degradation of the organic EL element (EL). Usable examples of the material include silicon oxide, silicon dioxide, and silicon nitride. In order to reduce the brittleness of the sealing film, the sealing film preferably has a laminate structure composed of an inorganic layer and an organic material layer. These films may be formed by any method, for example, vacuum vapor deposition, sputtering, reactive sputtering, molecular beam epitaxy, ionized-cluster beam deposition, ion plating, plasma polymerization, atmospheric pressure plasma polymerization, plasma enhanced CVD, laser CVD, thermal CVD, or coating.

The gap between the sealing member and the displaying area of the organic EL element (EL) is preferably filled with an inert gas, such as nitrogen or argon, or an inactive liquid, such as fluorohydrocarbon or silicone oil, in the form of a gas or liquid phase. The gap between the sealing member and the displaying area of the organic EL element (EL) can be in a vacuum state or may be filled with a hygroscopic compound.

Examples of the hygroscopic compound include metal oxides (e.g., sodium oxide, potassium oxide, calcium oxide, barium oxide, magnesium oxide, and aluminum oxide), sulfates (e.g., sodium sulfate, calcium sulfate, magnesium sulfate, and cobalt sulfate), metal halides (e.g., calcium chloride, magnesium chloride, cesium fluoride, tantalum fluoride, cerium bromide, magnesium bromide, barium iodide, and magnesium iodide), and perchlorates (e.g., barium perchlorate and magnesium perchlorate). The sulfates, metal halides, and perchlorates are preferably used in the form of anhydrides.

<Application>

The organic EL element (EL) of the present invention is applicable to display devices, displays, and various light emission sources. Examples of the light emission source include, but not limited to, home lamps, room lamps in vehicles, backlights for watches and liquid crystals, light sources for board advertisements, traffic lights, and optical memory media, light sources for electrophotographic copiers, light sources for optical communication instruments, and light sources for optical sensors. In particular, the organic EL element (EL) can be effectively used as a backlight for a liquid crystal display device in combination with a color filter or for a lighting source.

In the use of the organic EL element (EL) as a backlight for a liquid crystal display device in combination with a color filter, it is preferred to also use a light-condensing sheet for further enhancing the luminance.

Examples

The present invention will now be described by examples, which should not be intended to limit the present invention. It is noted that "part(s)" and "%" in examples indicate "part (s) by mass" and "% by mass", respectively, unless defined otherwise.

<<Production of Organic EL Element>>

[Production of Organic EL Element 1: One Luminous Unit (Comparative Example)] (Preparation of Substrate)

A biaxially stretched poly(ethylene naphthalate) film (PEN film, thickness: 100 μm, width: 350 mm, manufactured by Teijin DuPont Films Japan Ltd., trade name: "Teonex Q65FA") was used as a substrate.

(Formation of Underlying Layer)

A UV curable organic/inorganic hybrid hard coating material OPSTAR Z7501 (manufactured by JSR Corp.) was applied to the easily adhesive surface of the substrate to give a dried thickness of 4 μm with a wire bar. After drying at 80° C. for 3 minutes, the applied coating material was irradiated with light of 1.0 J/cm² under an air atmosphere with a high-pressure mercury lamp to form an underlying layer.

(Formation of First Electrode)

An indium tin oxide (ITO) film having a thickness of 150 nm was formed on the underlying layer on the substrate by sputtering and was then patterned by photolithography to form a first electrode (anode) having a light-emitting area of 50 mm².

(Formation of Luminous Unit 1)

A commercially available vacuum deposition apparatus was evacuated to 1×10⁻⁴ Pa, and then compound HT-1 was deposited at a deposition rate of 0.1 nm/sec into a hole-transporting layer (HTL) having a thickness of 20 nm, while the substrate being moved.

Subsequently, a heating boat containing host material H-1 and heating boats respectively containing phosphorescent compound A-3 (blue luminescent dopant), compound A-1 (green luminescent dopant), and compound A-2 (red luminescent dopant) were independently energized to form a luminous layer composed of the host material H-1 and the phosphorescent compounds of the individual colors on the hole-transporting layer. The energization to the heating boats was controlled such that the deposition ratio of host compound H-1: compound A-3 (blue luminescent dopant): compound A-1 (green luminescent dopant): compound A-2 (red luminescent dopant) was 88:7:4:1 (volume ratio). The thickness of the luminous layer was 30 nm.

Compound ET-1 was then deposited on the luminous layer into an electron-transporting layer having a thickness of 30 nm.

Compound HT-1, compounds A-1 to A-3, compound H-1, and compound ET-1 are shown below.

[Chem. 68]

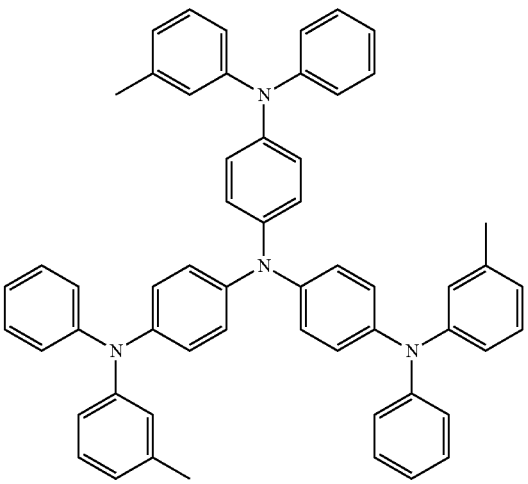

HT-1

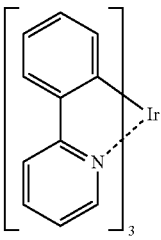

A-1

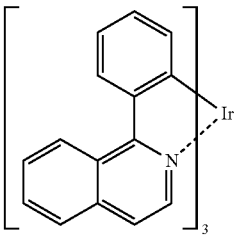

A-2

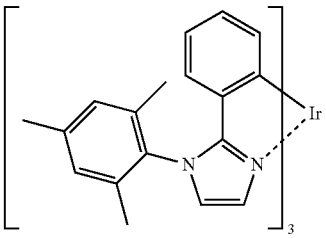

A-3

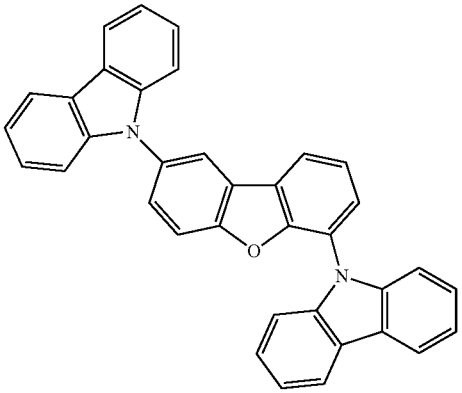

H-1

-continued

ET-1

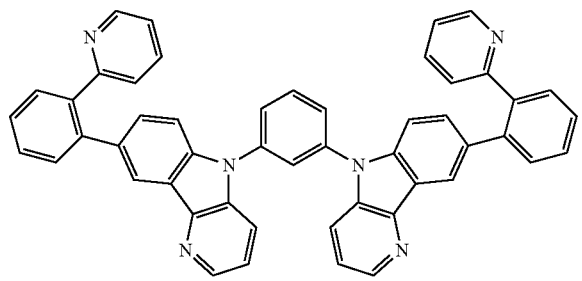

(Formation of Second Electrode)

A film of potassium fluoride (KF) having a thickness of 2 nm was then formed, and then aluminum was deposited at a thickness of 110 nm into a second electrode (cathode).

(Sealing)

The sample provided with the second electrode (cathode) was sealed with a sealing member composed of aluminum foil having a thickness of 100 μm and a thermo-curable liquid adhesive (epoxy resin) disposed at a thickness of 30 μm on a surface of the aluminum foil. The sealing was performed such that the terminals of the extraction electrodes of the first and the second electrodes of the organic EL element were exposed by continuously laminating the adhesive surface of the sealing member and the organic functional layer surface of the organic EL element through dry lamination. A sealed organic EL element 1 was thus produced.

The sealing was performed under an atmospheric pressure in a nitrogen atmosphere having a moisture content of 1 ppm or less, at a cleanliness of class 100 measured in accordance with JIS B 9920, and at an atmospheric pressure having a dew-point temperature of −80° C. or less and an oxygen concentration of 0.8 ppm or less. The description for the formation of the extraction wirings from the anode and cathode and other components are omitted.

[Production of Organic EL Element 2: Two Luminous Units (Comparative Example)]

The process until the formation of the luminous unit 1 was performed as in the production of the organic EL element 1. This sample was placed in a first vacuum chamber having a tungsten resistance heating boat containing silver (Ag). The vacuum chamber was evacuated to 4×10$^{-4}$ Pa, and then the resistance heating boat was electrically heated to form an intermediate electrode layer of silver (Ag) having a thickness of 8 nm.

A luminous unit 2 was then formed on the intermediate electrode layer as in the formation of the luminous layer 1 in the production of the organic EL element 1. The formation of a second electrode and the sealing were then performed as in the production of the organic EL element 1 to produce an organic EL element 2 including two luminous units with toning properties.

[Production of Organic EL Element 3: Two Luminous Units (Comparative Example)]

An organic EL element 3 was produced as in the production of the organic EL element 2 except that prior to the formation of the first electrode on the substrate; a homogeneous thin-film layer of SiO$_2$ was formed on the underlying layer on the substrate by vacuum vapor deposition; and a first electrode (anode) was formed on the thin-film layer.

(Formation of Thin-Film Layer: Vacuum Vapor Deposition)

The thin-film layer of SiO$_2$ having a thickness of 500 nm was formed on the surface of the underlying layer at a deposition rate of 1 to 2 nm/sec with a vacuum deposition apparatus by electrical heating of a resistance heating boat containing SiO$_2$.

[Production of Organic EL Element 4: Two Luminous Units (the Present Invention)]

An organic EL element 4 was produced as in the production of the organic EL element 3 except that the thin-film layer was formed with the plasma discharge CVD system including rollers to which a magnetic field is applied shown in FIG. 10 instead of the vacuum vapor deposition.

(Formation of Thin-Film Layer: Roller CVD)

The substrate was mounted on the plasma discharge CVD system including rollers to which a magnetic field is applied (hereinafter, the method using this system is referred to as roller CVD) shown in FIG. 10 such that the surface of the substrate on the opposite side of the surface having the underlying layer is in contact with the film-forming roller. A thin-film layer having a thickness of 500 nm was formed on the underlying layer under the following film formation conditions (plasma enhanced CVD conditions).

<Conditions of Plasma Enhanced CVD>

Feed rate of a source gas (hexamethyldisiloxane, hereinafter abbreviated as "HMDSO"): 50 standard cubic centimeter per minute (sccm)

Feed rate of oxygen gas (O$_2$): 500 sccm

Degree of vacuum in vacuum chamber: 3 Pa

Applied power from power supply for plasma generation: 0.8 kW

Frequency of power supply for plasma generation: 70 kHz

Transfer rate of substrate having underlying layer: 0.8 m/min

[Production of Organic EL Element 5: Two Luminous Units (the Present Invention)]

A thin-film layer was formed on the underlying layer on the substrate produced as in the production of the organic EL element 4, and then a gas barrier layer was formed by the following process.

(Formation of Gas Barrier Layer)

A gas barrier layer having a thickness of 300 nm was formed on the thin-film layer through modification with the following excimer light.

<Preparation of Polysilazane Layer-Forming Coating Solution>

The polysilazane layer-forming coating solution used was a solution of 10% by mass perhydropolysilazane (Aquamica NN120-10, non-catalytic type, manufactured by AZ Electronic Materials (Merck's Performance Materials division)) in dibutyl ether.

<Formation of Polysilazane Layer>

The polysilazane layer-forming coating solution was applied with a wire bar into a dried (average) thickness of 300 nm, followed by drying in an atmosphere of a temperature of 85° C. and a relative humidity of 55% for 1 minute and in an atmosphere of a temperature of 25° C. and a relative humidity of 10% (dew-point temperature: −8° C.) for 10 minutes for dehumidification. A polysilazane layer was thus formed.

<Formation of Gas Barrier Layer: Silica Conversion of Polysilazane Layer with Ultraviolet Light>

The following UV irradiation device was placed in a vacuum chamber, and the resulting polysilazane layer was subjected to silica conversion by adjusting the pressure in the chamber.

<UV Irradiation Device>

Device: excimer light irradiation device manufactured by M. D. COM. Inc., MODEL: MECL-M-1-200

Irradiation wavelength: 172 nm
Lamp filler gas: Xe
<Modification Conditions>
The substrate having the polysilazane layer was fixed on the operation stage and was modified under the following conditions to form a gas barrier layer.
Light intensity of excimer lamp: 130 mW/cm$^2$ (172 nm)
Distance between sample and light source: 1 mm
Stage heating temperature: 70° C.
Oxygen concentration in irradiation device: 1.0%
Irradiation time with excimer lamp: 5 seconds
(Formation of Layers from First Electrode to Luminous Unit 1)
Layers from the first electrode to the luminous unit 1 were formed as in the production of the organic EL element 4.
(Formation of Nitrogen-Containing Layer and Intermediate Electrode Layer)
The sample provided with the luminous unit 1 was fixed to the substrate holder of a commercially available vacuum deposition apparatus and was then installed in the vacuum chamber of a vacuum deposition apparatus.
A nitrogen-containing compound, Example compound No. 10, was put in a tantalum resistance heating boat. The substrate holder and the heating boat were placed in the first vacuum chamber of the vacuum deposition apparatus. A tungsten resistance heating boat containing silver (Ag) was placed in the second vacuum chamber.
The vacuum chambers were evacuated to $4 \times 10^{-4}$ Pa. The resistance heating boat in the first vacuum chamber was electrically heated to form a nitrogen-containing layer having a thickness of 25 nm. The resistance heating boat in the second vacuum chamber was then electrically heated to form an intermediate electrode layer of silver (Ag) having a thickness of 8 nm.
(Luminous Unit 2, Second Electrode, and Sealing)
A luminous unit 2 was formed on the intermediate electrode layer, a second electrode was formed thereon, and sealing was then performed, as in the production of the organic EL element 4 to form an organic EL element 5.
[Production of Organic EL Element 6: Three Luminous Units (Comparative Example)]
(Preparation of Substrate)
A substrate having an underlying layer was prepared as in the production of the organic EL element 1.
(Formation of First Electrode)
An indium tin oxide (ITO) film having a thickness of 150 nm was formed on the underlying layer on the substrate by sputtering and was then patterned by photolithography to form a first electrode (anode) having a light-emitting area of 50 mm$^2$.
(Formation of Luminous Unit B1 (Luminous Unit 1))
A commercially available vacuum deposition apparatus was evacuated to $1 \times 10^{-4}$ Pa, and then compound HT-1 was deposited at a deposition rate of 0.1 nm/sec into a hole-transporting layer (HTL) having a thickness of 20 nm, while the substrate being moved.
Subsequently, a heating boat containing host material H-1 and a heating boat containing phosphorescent compound A-3 (blue luminescent dopant) were independently energized to form a luminous layer composed of the host material H-1 and the blue luminescent dopant and emitting blue light on the hole-transporting layer. The energization to the heating boats was controlled such that the deposition ratio of host compound H-1: compound A-3 (blue luminescent dopant) was 93:7 (volume ratio). The thickness of the luminous layer was 30 nm.
Compound ET-1 was then deposited into an electron-transporting layer having a thickness of 30 nm to form a luminous unit B1 emitting blue light.
(Formation of Intermediate Electrode Layer 1)
The sample provided with the luminous unit B1 was placed in a first vacuum chamber having a tungsten resistance heating boat containing silver (Ag). The vacuum chamber was evacuated to $4 \times 10^{-4}$ Pa, and then the resistance heating boat was electrically heated to form an intermediate electrode layer 1 of silver (Ag) having a thickness of 8 nm.
(Formation of Luminous Unit G1 (Luminous Unit 2))
A commercially available vacuum deposition apparatus was evacuated to $1 \times 10^{-4}$ Pa, and then compound HT-1 was deposited at a deposition rate of 0.1 nm/sec to form a hole-transporting layer (HTL) having a thickness of 20 nm, while the substrate provided with the intermediate electrode layer 1 being moved.
Subsequently, a heating boat containing host material H-1 and a heating boat containing phosphorescent compound A-1 (green luminescent dopant) were independently energized to form a luminous layer composed of the host material H-1 and the green luminescent dopant and emitting green light on the hole-transporting layer. The energization to the heating boats was controlled such that the deposition ratio of host compound H-1: compound A-1 (green luminescent dopant) was 96:4 (volume ratio). The thickness of the luminous layer was 30 nm.
Compound ET-1 was then deposited to form an electron-transporting layer having a thickness of 30 nm.
(Formation of Intermediate Electrode Layer 2)
The sample provided with the luminous unit G1 was placed in a first vacuum chamber having a tungsten resistance heating boat containing silver (Ag). The vacuum chamber was evacuated to $4 \times 10^{-4}$ Pa, and then the resistance heating boat was electrically heated to form an intermediate electrode layer 2 of silver (Ag) having a thickness of 8 nm.
(Formation of Luminous Unit R1 (Luminous Unit 3))
A commercially available vacuum deposition apparatus was evacuated to $1 \times 10^{-4}$ Pa, and then compound HT-1 was deposited at a deposition rate of 0.1 nm/sec into a hole-transporting layer (HTL) having a thickness of 20 nm, while the substrate being moved.
Subsequently, a heating boat containing host material H-1 and a heating boat containing compound A-2 (red luminescent dopant) were independently energized to forma luminous layer composed of the host material H-1 and the red luminescent dopant and emitting red light on the hole-transporting layer. The energization to the heating boats was controlled such that the deposition ratio of host compound H-1: compound A-2 (red luminescent dopant) was 99:1 (volume ratio). The thickness of the luminous layer was 30 nm.
Compound ET-1 was then deposited into an electron-transporting layer having a thickness of 30 nm.
(Formation of Second Electrode and Sealing)
The formation of a second electrode on the luminous unit R1 and the sealing were then performed as in the production of the organic EL element 1 to produce an organic EL element 6 including three luminous units with toning properties.
[Production of Organic EL Element 7: Three Luminous Units (Comparative Example)]
(Preparation of Substrate)
A substrate having an underlying layer was prepared as in the production of the organic EL element 1.
(Formation of Thin-Film Layer)
A thin-film layer was formed on the underlying layer as in the formation (vacuum vapor deposition) of the thin-film layer in the production of the organic EL element 3.

(Formation of Gas Barrier Layer)

A gas barrier layer was then formed on the thin-film layer as in the formation (an excimer process) of the gas barrier layer in the production of the organic EL element 5.

(Formation of First Electrode)

An indium tin oxide (ITO) film having a thickness of 150 nm was formed on the gas barrier layer by sputtering and was then patterned by photolithography to form a first electrode (anode) having a light-emitting area of 50 mm².

(Formation of Luminous Unit B2, Luminous Unit G2, and Luminous Unit R2)

Luminous unit B2, luminous unit G2, and luminous unit R2 were formed as in the production of the organic EL element 6 except that a nitrogen-containing layer was formed between the luminous unit B1 and the intermediate electrode layer 1 and between the luminous unit G1 and the intermediate electrode layer 2 in the organic EL element 6 through the following process.

(Formation of Second Electrode and Sealing)

The formation of a second electrode on the luminous unit R2 and the sealing were then performed as in the production of the organic EL element 1 to produce an organic EL element 7 including three luminous units with toning properties.

[Production of Organic EL Element 8: Three Luminous Units (Comparative Example)]

An organic EL element 8 was produced as in the production of the organic EL element 7 except that the thin-film layer was formed by the following excimer process instead of vacuum vapor deposition.

(Formation of Thin-Film Layer by Excimer Process)

A thin-film layer having a thickness of 500 nm was formed on the gas barrier layer by irradiation with PHPS-excimer light.

<Preparation of Polysilazane Layer-Forming Coating Solution>

The polysilazane layer-forming coating solution used was a solution of 10% by mass perhydropolysilazane (Aquamica NN120-10, non-catalytic type, manufactured by AZ Electronic Materials (Merck's Performance Materials division)) in dibutyl ether.

<Formation of Polysilazane Layer>

The polysilazane layer-forming coating solution was applied with a wire bar into a dried (average) thickness of 300 nm, followed by drying in an atmosphere of a temperature of 85° C. and a relative humidity of 55% for 1 minute and then in an atmosphere of a temperature of 25° C. and a relative humidity of 10% (dew-point temperature: −8° C.) for 10 minutes for dehumidification. A polysilazane layer was thus formed.

<Formation of Thin-Film Layer: Silica Conversion of Polysilazane Layer with Ultraviolet Light>

The following UV irradiation device was placed in a vacuum chamber, and the resulting polysilazane layer was subjected to silica conversion by adjusting the pressure in the chamber.

<UV Irradiation Device>

Device: excimer light irradiation device manufactured by M. D. COM. Inc., MODEL: MECL-M-1-200

Irradiation wavelength: 172 nm

Lamp filler gas: Xe

<Modification Conditions>

The sample having the polysilazane layer was fixed on the operation stage and was modified under the following conditions to form a thin-film layer.

Light intensity of excimer lamp: 130 mW/cm² (172 nm)

Distance between sample and light source: 1 mm

Stage heating temperature: 70° C.

Oxygen concentration in irradiation device: 1.0%

Irradiation time with excimer lamp: 5 seconds

[Production of Organic EL Element 9: Three Luminous Units (the Present Invention)]

An organic EL element 9 of the present invention having a three layer structure and toning properties was produced as in the production of the organic EL element 4 (formation of the thin-film layer: roller CVD, the present invention) except that a luminous unit B1, a luminous unit G1, and a luminous unit R1 (each of which includes no nitrogen-containing layer) were formed as in the production of the organic EL element 6, instead of the luminous unit 1 and luminous unit 2 of the organic EL element 4.

[Production of Organic EL Element 10: Three Luminous Units (the Present Invention)]

An organic EL element 10 of the present invention having a three layer structure and toning properties was produced as in the production of the organic EL element 9 except that a luminous unit B2, a luminous unit G2, and a luminous unit R2 (which included a nitrogen-containing layer) were formed as in the production of the organic EL element 7 instead of the luminous unit B1, luminous unit G1, and luminous unit R1 of the organic EL element 9.

[Production of Organic EL Element 11: Three Luminous Units (the Present Invention)]

An organic EL element 11 was produced as in the production of the organic EL element 9 except that a gas barrier layer was produced between the thin-film layer and the first electrode by an excimer process as in the production of the organic EL element 7.

[Production of Organic EL Element 12: Three Luminous Units (the Present Invention)]

An organic EL element 12 was produced as in the production of the organic EL element 10 except that a gas barrier layer was produced between the thin-film layer and the first electrode by an excimer process as in the production of the organic EL element 7.

[Production of Organic EL Element 13: Three Luminous Units (the Present Invention)]

An organic EL element 13 was produced as in the production of the organic EL element 12 except that the conditions for forming a thin-film layer (carbon atom difference: 4.0 at %, refractive index difference: 0.1) by roller CVD were as follows.

(Conditions for Forming Thin-Film Layer: Roller CVD)

Feed rate of source gas (HMDSO): 50 standard cubic centimeter per minute (sccm)

Feed rate of oxygen gas ($O_2$): 500 sccm

Degree of vacuum in vacuum chamber: 3 Pa

Applied power from power supply for plasma generation: 1.2 kW

Frequency of power supply for plasma generation: 80 kHz

Transfer rate of film: 0.5 m/min

[Production of Organic EL Element 14: Three Luminous Units (the Present Invention)]

An organic EL element 14 was produced as in the production of the organic EL element 12 except that the conditions for forming a thin-film layer (carbon atom difference: 6.5 at %, refractive index difference: 0.2) by roller CVD were as follows.

(Conditions for Forming Thin-Film Layer: Roller CVD)

Feed rate of source gas (HMDSO): 50 standard cubic centimeter per minute (sccm)

Feed rate of oxygen gas ($O_2$): 500 sccm

Degree of vacuum in vacuum chamber: 3 Pa

Applied power from power supply for plasma generation: 0.8 kW

Frequency of power supply for plasma generation: 80 kHz
Transfer rate of film: 0.9 m/min

[Production of Organic EL Elements 15 to 18: Three Luminous Units (the Present Invention)]

Organic EL elements 15 to 18 were produced as in the production of the organic EL element 12 except that Example compound No. 7, Example compound No. 38, Example compound 4, and Example compound 33 were respectively used instead of Example compound No. 10 as the nitrogen-containing compound used in the formation of the nitrogen-containing layer.

[Production of Organic EL Element 19: Three Luminous Units (the Present Invention)]

An organic EL element 19 was produced as in the production of the organic EL element 12 except that the intermediate electrode layer was formed using indium tin oxide (ITO) as the constituent material instead of a silver-metal.

[Production of Organic EL Element 20: Three Luminous Units (the Present Invention)]

An organic EL element 20 was produced as in the production of the organic EL element 12 except that a transparent non-alkali glass substrate (in Table 1, shown as "glass") having a thickness of 150 μm was used instead of the poly (ethylene naphthalate) (PEN) film.

[Production of Organic EL Elements 21 to 24: Three Luminous Units (the Present Invention)]

Organic EL elements 21 to 24 were produced as in the production of the organic EL element 12 except that each thin-film layer was formed by roller CVD through by appropriate control of the feed rates of the source gas (hexamethyldisiloxane: HMDSO) and oxygen gas ($O_2$) such that the average atomic percent of silicon at a 90% to 95% depth from the surface of each thin-film layer across the thickness was 22 at %, 26 at %, 44 at %, or 48 at %.

TABLE 1

| Organic EL element No | The number of luminous units | Substrate | Presence of thin-film layer | Process | Existence of extreme value | Carbon atom difference | Refractive index difference |
|---|---|---|---|---|---|---|---|
| 1 | 1 | PEN | Without | — | — | — | — |
| 2 | 2 | PEN | Without | — | — | — | — |
| 3 | 2 | PEN | With | Vacuum vapor deposition | Without | Without | Without |
| 4 | 2 | PEN | With | Roller CVD | With | 8.5 | 0.3 |
| 5 | 2 | PEN | With | Roller CVD | With | 8.5 | 0.3 |
| 6 | 3 | PEN | Without | — | — | — | — |
| 7 | 3 | PEN | With | Vacuum vapor deposition | Without | Without | Without |
| 8 | 3 | PEN | With | Excimer | Without | Without | Without |
| 9 | 3 | PEN | With | Roller CVD | With | 8.5 | 0.3 |
| 10 | 3 | PEN | With | Roller CVD | With | 8.5 | 0.3 |
| 11 | 3 | PEN | With | Roller CVD | With | 8.5 | 0.3 |
| 12 | 3 | PEN | With | Roller CVD | With | 8.5 | 0.3 |
| 13 | 3 | PEN | With | Roller CVD | With | 4.0 | 0.1 |
| 14 | 3 | PEN | With | Roller CVD | With | 6.5 | 0.2 |
| 15 | 3 | PEN | With | Roller CVD | With | 8.5 | 0.3 |
| 16 | 3 | PEN | With | Roller CVD | With | 8.5 | 0.3 |
| 17 | 3 | PEN | With | Roller CVD | With | 8.5 | 0.3 |
| 18 | 3 | PEN | With | Roller CVD | With | 8.5 | 0.3 |
| 19 | 3 | PEN | With | Roller CVD | With | 8.5 | 0.3 |
| 20 | 3 | Glass | With | Roller CVD | With | 8.5 | 0.3 |
| 21 | 3 | PEN | With | Roller CVD | With | 8.5 | 0.3 |
| 22 | 3 | PEN | With | Roller CVD | With | 8.5 | 0.3 |
| 23 | 3 | PEN | With | Roller CVD | With | 8.5 | 0.3 |
| 24 | 3 | PEN | With | Roller CVD | With | 8.5 | 0.3 |

| Organic EL element No | Thin-film layer Element distribution at 90% to 95% depth | | Presence of gas barrier layer | Material of intermediate electrode layer | Compound of nitrogen-containing layer | Note |
|---|---|---|---|---|---|---|
| | Atomic percent of element | Atomic percent of silica | | | | |
| 1 | — | — | — | — | — | Comparative Example |
| 2 | — | — | — | Silver | — | Comparative Example |
| 3 | — | — | — | Silver | — | Comparative Example |
| 4 | *1 | 32 | — | Silver | — | Present invention |
| 5 | *1 | 32 | ○ | Silver | No. 10 | Present invention |
| 6 | — | — | — | Silver | — | Comparative Example |
| 7 | — | — | ○ | Silver | No. 10 | Comparative Example |
| 8 | — | — | ○ | Silver | No. 10 | Comparative Example |
| 9 | *1 | 32 | — | Silver | — | Present invention |
| 10 | *1 | 32 | — | Silver | No. 10 | Present invention |
| 11 | *1 | 32 | ○ | Silver | — | Present invention |
| 12 | *1 | 32 | ○ | Silver | No. 10 | Present invention |
| 13 | *1 | 32 | ○ | Silver | No. 10 | Present invention |
| 14 | *1 | 32 | ○ | Silver | No. 10 | Present invention |
| 15 | *1 | 32 | ○ | Silver | No. 7 | Present invention |

TABLE 1-continued

| 16 | *1 | 32 | ○ | Silver | No. 38 | Present invention |
| 17 | *1 | 32 | ○ | Silver | 4 | Present invention |
| 18 | *1 | 32 | ○ | Silver | 33 | Present invention |
| 19 | *1 | 32 | ○ | ITO | No. 10 | Present invention |
| 20 | *1 | 32 | ○ | Silver | No. 10 | Present invention |
| 21 | *1 | 22 | ○ | Silver | No. 10 | Present invention |
| 22 | *1 | 26 | ○ | Silver | No. 10 | Present invention |
| 23 | *1 | 44 | ○ | Silver | No. 10 | Present invention |
| 24 | *1 | 48 | ○ | Silver | No. 10 | Present invention |

*1: Satisfying a relationship of (average atomic percent of oxygen) > (average atomic percent of silicon) > (average atomic percent of carbon).

In Table 1, the atomic distribution profile (XPS data) and refractive index data of each thin-film layer were measured by the following methods.

(XPS Data and Refractive Index Data)

The XPS depth profile was measured under the following conditions to obtain the distributions of silicon, oxygen, carbon, and oxygen and carbon versus the distance or depth from the surface of the thin-film layer across the thickness.

Etching ion species: argon ($Ar^+$)
Etching rate ($SiO_2$ thermal oxide film equivalent value): 0.05 nm/sec
Etching interval ($SiO_2$ equivalent value): 10 nm
X-ray photoelectron spectrometer: manufactured by Thermo Fisher Scientific Inc., model name: VG Theta Probe
Radiated X-ray: single-crystal spectroscopic Al—Kα
X-ray spot and its size: ellipse of 800×400 μm The refractive index was measured with a spectroscopic ellipsometer (ELC-300, manufactured by JASCO Corp.) to determine the refractive index distribution in a thin film.

Based on the distributions of silicon, oxygen, carbon, and oxygen and carbon measured in the entire region across the thickness, the followings were determined: the existence of an extreme value; the difference between the largest value and the smallest value of carbon atomic percent; the difference in refractive index; each average atomic percent of silicon, oxygen, and carbon atoms to the total number of atoms of these elements at a 90% to 95% depth from the surface of the thin-film layer across the thickness; and the average atomic percent of silicon to the total number of silicon, oxygen, and carbon atoms.

In Table 1, "*1" indicates that the atomic percent of each element satisfies a relationship defined by Expression (1): (average atomic percent of oxygen)>(average atomic percent of silicon)>(average atomic percent of carbon).

<<Evaluation of Organic EL Element>>

[Evaluation of Power Efficiency]

The front luminance and the angular dependence of luminance of each organic EL element were measured with a spectral emission brightness meter CS-1000 (manufactured by Konica Minolta, Inc.). The power efficiency at a front luminance of 1000 cd/m² was determined. The power efficiency was a relative value to the power efficiency "100" of the organic EL element 4. A larger value indicates a higher power efficiency.

[Evaluation of Emission Lifetime]

The organic EL elements were each driven to successively emit light with a constant current of 2.5 mA/cm² in an environment at 23° C. and 50% RH. The time (half-life: $\tau_{1/2}$) needed for reducing the luminance to a half of the initial luminance was measured with a spectral emission brightness meter CS-1000 (manufactured by Konica Minolta, Inc.) and was used as a measure of the emission lifetime. The emission lifetime was a relative value to the half-life (emission lifetime) "100" of the organic EL element 4. A larger value indicates a longer emission lifetime.

[Light Distribution]

The organic EL elements were each driven to emit light with a constant current of 2.5 mA/cm² in an environment at 23° C. and 50% RH, and the viewing angle dependence (light distribution) was evaluated in accordance with the method for evaluating viewing angle dependence described in Organic EL Symposium (2012), The 14th Meeting Proceedings, pp. 11-12. The viewing angle dependence (light distribution) of the organic EL element 4 was defined as "C". An organic EL element having a lower viewing angle dependence than that of the organic EL element 4 was defined as "B", and that having a significantly lower viewing angle dependence than that of the organic EL element 4 was defined as "A". An organic EL element having a slightly higher viewing angle dependence (light distribution) than that of the organic EL element 4 was defined as "D", and that having a significantly higher viewing angle dependence than that of the organic EL element 4 was defined as "E".

[Evaluation of Durability]

The power efficiency of each organic EL element at a front luminance of 1000 cd/m² was determined before and after high temperature and high humidity treatment in an environment at 85° C. and 85% RH for 750 hours. The degree of deterioration in power efficiency by the high temperature and high humidity treatment was a relative value to the degree of deterioration "100" of the organic EL element 4. A smaller relative value indicates a higher emission efficiency after the storage in the high temperature and high humidity environment. The front luminance was measured with a spectral emission brightness meter CS-1000 (manufactured by Konica Minolta, Inc.).

Table 2 shows the evaluation results.

TABLE 2

| Organic EL Element No. | Quantum efficiency (relative value) | Emission lifetime (relative value) | Light distribution (viewing angle dependence) | Durability (relative value) | Note |
|---|---|---|---|---|---|
| 1 | 69 | 61 | E | 122 | Comparative Example |
| 2 | 72 | 67 | E | 124 | Comparative Example |
| 3 | 89 | 82 | D | 118 | Comparative Example |
| 4 | 100 | 100 | C | 100 | Present invention |
| 5 | 113 | 115 | B | 81 | Present invention |
| 6 | 77 | 78 | E | 126 | Comparative Example |

TABLE 2-continued

| | Results of evaluation | | | | |
|---|---|---|---|---|---|
| Organic EL Element No. | Quantum efficiency (relative value) | Emission lifetime (relative value) | Light distribution (viewing angle dependence) | Durability (relative value) | Note |
| 7 | 91 | 93 | D | 117 | Comparative Example |
| 8 | 90 | 89 | D | 119 | Comparative Example |
| 9 | 105 | 109 | C | 98 | Present invention |
| 10 | 115 | 117 | B | 79 | Present invention |
| 11 | 118 | 119 | B | 76 | Present invention |
| 12 | 130 | 134 | A | 45 | Present invention |
| 13 | 103 | 109 | C | 88 | Present invention |
| 14 | 116 | 118 | B | 72 | Present invention |
| 15 | 132 | 133 | A | 42 | Present invention |
| 16 | 135 | 136 | A | 38 | Present invention |
| 17 | 128 | 130 | A | 47 | Present invention |
| 18 | 133 | 132 | A | 39 | Present invention |
| 19 | 109 | 110 | C | 84 | Present invention |
| 20 | 115 | 118 | B | 75 | Present invention |
| 21 | 116 | 117 | B | 71 | Present invention |
| 22 | 107 | 110 | C | 85 | Present invention |

The results shown in Table 2 obviously demonstrate that the organic EL elements in the constitution according to the present invention have a higher power efficiency, a longer emission lifetime, a reduced viewing angle dependence (improved light distribution), and improved durability, compared to those of Comparative Examples.

It is also demonstrated that the organic EL element of the present invention exhibits higher effects when the difference between the largest value and the smallest value of the carbon atomic percent of a thin-film layer is 5 at % or more; the average atomic percent of silicon at a 90% to 95% depth from the surface of the thin-film layer across the thickness is within a range of 25 to 45 at %; the intermediate electrode layer is composed of a thin film metal (silver-metal); the substrate is a resin film; the intermediate electrode layer has a nitrogen-containing layer on at least one surface; and a gas barrier layer is disposed adjoining the thin-film layer.

INDUSTRIAL APPLICABILITY

The organic electroluminescent element of the present invention has excellent characteristics in power efficiency, emission lifetime, toning aptitude, viewing angle dependence, and durability (high temperature and high humidity resistance) and is suitably applicable to display devices, displays, and various light emission sources.

The invention claimed is:

1. An organic electroluminescent element comprising:
a pair of a first electrode and a second electrode; and
two or more luminous units disposed between the first electrode and second electrode on a substrate, adjacent luminous units each being separated by an intermediate electrode layer, wherein
(1) at least one of the first electrode and the second electrode is a transparent electrode;
(2) the luminous units are each an organic functional layer including an organic luminous layer;
(3) the intermediate electrode layer includes an independent connecting terminal for electrical connection;
(4) a thin-film layer is disposed on a surface of the transparent electrode being at least one of the first electrode and the second electrode; and
(5) the thin-film layer has a variable refractive index across a thickness of the thin-film layer, the variable refractive index having an extreme value (maximum value) at which the refractive index changes from an increase to a decrease or an extreme value (minimum value) at which the refractive index changes from a decrease to an increase.

2. The organic electroluminescent element according to claim 1, wherein the variable refractive index of the thin-film layer has extreme values being a maximum value and a minimum value.

3. The organic electroluminescent element according to claim 1, wherein the thin-film layer comprises a material containing at least silicon, oxygen, and carbon.

4. The organic electroluminescent element according to claim 3, wherein the thin-film layer has a distribution curve of a constituent element based on element distribution measurement in a depth direction of the thin-film layer by X-ray photoelectron spectroscopy such that a difference between a largest maximum value and a smallest maximum value of a carbon atomic percent (at %) is 5 at % or more in a carbon distribution curve showing a relationship between a distance from a surface of the thin-film layer across the thickness and an atomic percent of the number of carbon atoms (carbon atomic percent (at %)) to a total number (100 at %) of silicon atoms, oxygen atoms, and carbon atoms.

5. The organic electroluminescent element according to claim 3, wherein the thin-film layer has an average atomic percent of silicon, an average atomic percent of oxygen, and an average atomic percent of carbon to a total number (100 at %) of silicon, oxygen and carbon atoms at a 90% to 95% depth from a surface of the thin-film layer across the thickness satisfying a magnitude relation represented by Expression (1) or (2):

$$\text{(average atomic percent of carbon)} < \text{(average atomic percent of silicon)} < \text{(average atomic percent of oxygen)}, \quad \text{Expression (1)}$$

$$\text{(average atomic percent of oxygen)} < \text{(average atomic percent of silicon)} < \text{(average atomic percent of carbon)} \quad \text{Expression (2)}.$$

6. The organic electroluminescent element according to claim 5, wherein the thin-film layer has the average atomic percent of silicon within a range of 25 to 45 at % to the total number of silicon, oxygen, and carbon atoms at a 90% to 95% depth from the surface of the thin-film layer across the thickness.

7. The organic electroluminescent element according to claim 3, wherein the thin-film layer further contains a nitrogen atom.

8. The organic electroluminescent element according to claim 1, wherein the intermediate electrode layer is a metal thin film.

9. The organic electroluminescent element according to claim 8, wherein the metal thin film is mainly composed of silver.

10. The organic electroluminescent element according to claim 1, wherein the substrate is a resin film.

11. The organic electroluminescent element according to claim 1, further comprising a nitrogen-containing layer on at least one surface of the intermediate electrode layer.

12. The organic electroluminescent element according to claim 1, further comprising a gas barrier layer on the thin-film layer.

* * * * *